(12) United States Patent
Yamazaki et al.

(10) Patent No.: US 8,624,321 B2
(45) Date of Patent: Jan. 7, 2014

(54) THIN FILM TRANSISTOR INCLUDING A MICROCRYSTALLINE SEMICONDUCTOR LAYER AND AMORPHOUS SEMICONDUCTOR LAYER AND DISPLAY DEVICE INCLUDING THE SAME

(75) Inventors: Shunpei Yamazaki, Tokyo (JP); Yoshiyuki Kurokawa, Kanagawa (JP); Hiromichi Godo, Kanagawa (JP); Hidekazu Miyairi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 290 days.

(21) Appl. No.: 12/398,295

(22) Filed: Mar. 5, 2009

(65) Prior Publication Data

US 2009/0236600 A1    Sep. 24, 2009

(30) Foreign Application Priority Data

Mar. 18, 2008   (JP) .................................. 2008-070465

(51) Int. Cl.
 *H01L 23/62*   (2006.01)
(52) U.S. Cl.
 USPC ................. 257/359; 257/49; 257/51; 257/52; 257/350; 257/351; 257/352; 257/354; 438/49; 438/150; 438/152; 438/153
(58) Field of Classification Search
 USPC ........ 438/149–151, 49, 152, 154; 257/66, 67, 257/71; 247/49, 51, 52, 350, 351, 352, 354, 247/359
 See application file for complete search history.

(56) References Cited

U.S. PATENT DOCUMENTS

| | | | |
|---|---|---|---|
| 4,409,134 A | | 10/1983 | Yamazaki |
| 5,021,850 A | * | 6/1991 | Tanaka et al. .................... 257/59 |
| 5,071,779 A | * | 12/1991 | Tanaka et al. ................. 438/158 |
| 5,101,242 A | | 3/1992 | Ikeda et al. |
| 5,109,260 A | * | 4/1992 | Tanaka et al. .................... 257/61 |
| 5,122,849 A | * | 6/1992 | Tanaka et al. .................. 257/347 |

(Continued)

FOREIGN PATENT DOCUMENTS

CN           1893117         1/2007
EP           0 383 743 A2    8/1990

(Continued)

OTHER PUBLICATIONS

Chinese Office Action, Application No. 200910128138.9, Dated Jul. 25, 2013.

*Primary Examiner* — Lex Malsawma
*Assistant Examiner* — Eric Jones
(74) *Attorney, Agent, or Firm* — Nixon Peabody LLP; Jeffrey L. Costellia

(57) ABSTRACT

A thin film transistor is provided, which includes a gate insulating layer covering a gate electrode, a microcrystalline semiconductor layer provided over the gate insulating layer, an amorphous semiconductor layer overlapping the microcrystalline semiconductor layer and the gate insulating layer, and a pair of impurity semiconductor layers which are provided over the amorphous semiconductor layer and to which an impurity element imparting one conductivity type is added to form a source region and a drain region. The gate insulating layer has a step adjacent to a portion in contact with an end portion of the microcrystalline semiconductor layer. A second thickness of the gate insulating layer in a portion outside the microcrystalline semiconductor layer is smaller than a first thickness thereof in a portion in contact with the microcrystalline semiconductor layer.

12 Claims, 25 Drawing Sheets

(56) References Cited

U.S. PATENT DOCUMENTS

| | | | |
|---|---|---|---|
| 5,221,631 A | 6/1993 | Ikeda et al. |
| 5,453,858 A | 9/1995 | Yamazaki |
| 5,473,168 A | 12/1995 | Kawai et al. |
| 5,514,879 A | 5/1996 | Yamazaki |
| 5,614,732 A | 3/1997 | Yamazaki |
| 5,701,167 A | 12/1997 | Yamazaki |
| 5,825,050 A * | 10/1998 | Hirakawa | 257/57 |
| 5,849,601 A | 12/1998 | Yamazaki |
| 5,859,445 A | 1/1999 | Yamazaki |
| 5,864,150 A | 1/1999 | Lin |
| 6,011,277 A | 1/2000 | Yamazaki |
| 6,023,075 A | 2/2000 | Yamazaki |
| 6,153,893 A | 11/2000 | Inoue et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,468,839 B2 | 10/2002 | Inoue et al. |
| 6,528,816 B1 * | 3/2003 | Jackson et al. | 257/40 |
| 6,737,676 B2 | 5/2004 | Yamazaki |
| 7,045,817 B2 * | 5/2006 | Chen et al. | 257/59 |
| 7,067,844 B2 | 6/2006 | Yamazaki |
| 7,098,479 B1 | 8/2006 | Yamazaki |
| 7,115,902 B1 | 10/2006 | Yamazaki |
| 7,537,976 B2 | 5/2009 | Hirose |
| 7,786,485 B2 | 8/2010 | Dairiki et al. |
| 7,807,516 B2 | 10/2010 | Ohnuma et al. |
| 7,868,960 B2 * | 1/2011 | Tsubata et al. | 349/43 |
| 2001/0014493 A1 | 8/2001 | Inoue et al. |
| 2003/0134458 A1 | 7/2003 | Shih |
| 2005/0115930 A1 | 6/2005 | Tanaka et al. |
| 2007/0012919 A1 | 1/2007 | Oh et al. |
| 2007/0018165 A1 | 1/2007 | Yamazaki |
| 2008/0006827 A1 | 1/2008 | Shim et al. |
| 2008/0042139 A1 | 2/2008 | Huh et al. |
| 2009/0218568 A1 | 9/2009 | Dairiki et al. |
| 2009/0218572 A1 | 9/2009 | Dairiki et al. |
| 2009/0218576 A1 | 9/2009 | Dairiki et al. |
| 2009/0236601 A1 | 9/2009 | Jinbo |
| 2011/0012113 A1 | 1/2011 | Ohnuma et al. |
| 2011/0248268 A1 | 10/2011 | Dairiki et al. |

FOREIGN PATENT DOCUMENTS

| | | |
|---|---|---|
| EP | 0 535 979 A2 | 4/1993 |
| EP | 0 652 595 A2 | 5/1995 |
| EP | 1 537 938 A2 | 6/2005 |
| JP | 02-218166 | 8/1990 |
| JP | 04-242724 | 8/1992 |
| JP | 05-129608 | 5/1993 |
| JP | 05-190857 | 7/1993 |
| JP | 07-131030 | 5/1995 |
| JP | 07-047876 | 11/1995 |
| JP | 08-172195 | 7/1996 |
| JP | 2001-053283 | 2/2001 |
| JP | 2005-049832 | 2/2005 |
| JP | 2005-167051 | 6/2005 |
| JP | 2005-191546 | 7/2005 |
| JP | 2005-322845 | 11/2005 |

* cited by examiner

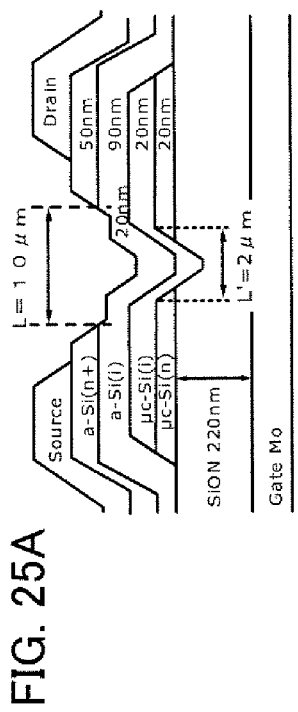
FIG. 25A
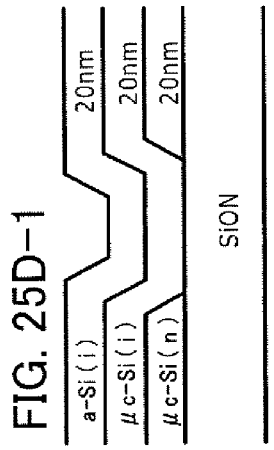
FIG. 25B-1
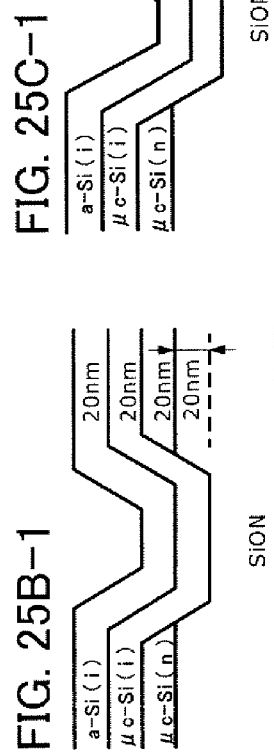
FIG. 25C-1
FIG. 25D-1
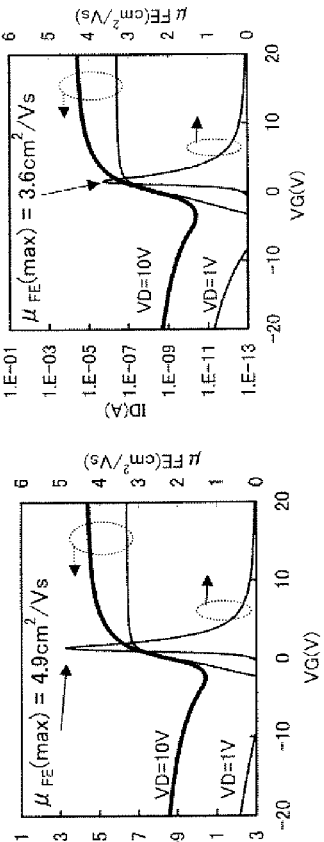
FIG. 25B-2
FIG. 25C-2
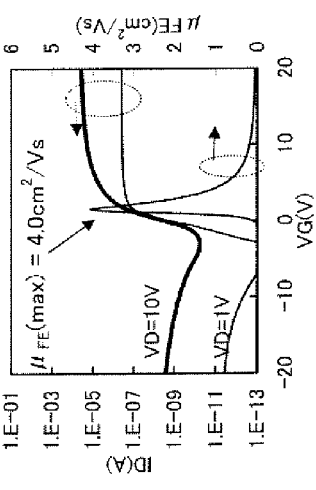
FIG. 25D-2

THIN FILM TRANSISTOR INCLUDING A MICROCRYSTALLINE SEMICONDUCTOR LAYER AND AMORPHOUS SEMICONDUCTOR LAYER AND DISPLAY DEVICE INCLUDING THE SAME

BACKGROUND OF THE INVENTION

1. Field of the Invention

The present invention relates to a thin film transistor and a display device which operates using the thin film transistor.

2. Description of the Related Art

As one type of field-effect transistor, a thin film transistor whose channel region is formed using a semiconductor layer that is formed over a substrate having an insulating surface is known. Techniques for using amorphous silicon, microcrystalline silicon, and polycrystalline silicon for semiconductor layers in thin film transistors have been disclosed (see References 1 to 5). A typical application of thin film transistors is a liquid crystal display television device, in which thin film transistors have been put to practical use as a switching transistor for each pixel that constitutes a display screen.

[Reference 1] Japanese Published Patent Application No. 2001-053283

[Reference 2] Japanese Published Patent Application No. H5-129608

[Reference 3] Japanese Published Patent Application No. 2005-049832

[Reference 4] Japanese Published Patent Application No. H7-131030

[Reference 5] Japanese Published Patent Application No. 2005-191546

SUMMARY OF THE INVENTION

A thin film transistor in which an amorphous silicon layer is used for a channel formation region has problems such as low field-effect mobility and small on-state current. On the other hand, a thin film transistor in which a microcrystalline silicon layer is used for a channel formation region has higher field-effect mobility than a thin film transistor with amorphous silicon, whereas it has a problem of insufficient switching characteristics due to its large off-state current.

A thin film transistor in which a polycrystalline silicon layer is used for a channel formation region has characteristics such as much higher field-effect mobility and larger on-state current than the aforementioned two types of thin film transistors. Because of such characteristics, this thin film transistor can be used not only as a switching transistor provided in a pixel but also in a driver circuit for which high-speed operation is required.

However, a thin film transistor with a polycrystalline silicon layer requires a crystallization step for a semiconductor layer and has a problem of higher manufacturing cost as compared to a thin film transistor formed using an amorphous silicon layer. For example, a laser annealing technique which is needed for formation of a polycrystalline silicon layer has a problem in that laser beam irradiation area is small and a large-area liquid crystal panel cannot be produced efficiently.

Now, glass substrates used to manufacture display panels have become larger in area as time passes as in the 3rd generation (e.g., 550 mm×650 mm), the 3.5th generation (e.g., 600 mm×720 mm, or 620 mm×750 mm), the 4th generation (e.g., 680 mm×880 mm, or 730 mm×920 mm), the 5th generation (e.g., 1100 mm×1300 mm), the 6th generation (e.g., 1500 mm×1800 mm), the 7th generation (e.g., 1900 mm×2200 mm), and the 8th generation (e.g., 2200 mm×2400 mm). From now on, it is predicted that the substrates will have much larger area for the 9th generation (e.g., 2400 mm×2800 mm, or 2450 mm×3050 mm) and the 10th generation (e.g., 2850 mm×3050 mm). The increase in size of glass substrate is based on the concept of minimum cost design.

On the other hand, a technique with which a thin film transistor capable of high-speed operation can be manufactured with high productivity over a large-area mother glass substrate like that of the 10th generation (2950 mm×3400 mm) has not been established yet, which is a problem in industry.

Thus, it is an object of the present invention to solve the aforementioned problems related to on-state current and off-state current of a thin film transistor. It is another object of the present invention to provide a thin film transistor capable of high-speed operation.

In one aspect according to the present invention, a thin film transistor includes a gate insulating layer covering a gate electrode, a microcrystalline semiconductor layer provided over the gate insulating layer, an amorphous semiconductor layer overlapping the microcrystalline semiconductor layer and the gate insulating layer, and a pair of impurity semiconductor layers which are provided over the amorphous semiconductor layer and to which an impurity element imparting one conductivity type is added to form a source region and a drain region. The gate insulating layer has a step adjacent to a portion in contact with an end portion of the microcrystalline semiconductor layer. A second thickness of the gate insulating layer in a portion outside the microcrystalline semiconductor layer is smaller than a first thickness of the gate insulating layer in a portion in contact with the microcrystalline semiconductor layer.

In another aspect according to the present invention, a thin film transistor includes a microcrystalline semiconductor layer covering a gate electrode, a gate insulating layer provided between the gate electrode and the microcrystalline semiconductor layer and elevated in a region in contact with the microcrystalline semiconductor layer above a surface of a region not in contact with the microcrystalline semiconductor layer, an amorphous semiconductor layer overlapping the microcrystalline semiconductor layer and the gate insulating layer, and a pair of impurity semiconductor layers which are provided over the amorphous semiconductor layer and to which an impurity element imparting one conductivity type is added to form a source region and a drain region.

In another aspect according to the present invention, a thin film transistor includes a microcrystalline semiconductor layer covering a gate electrode, a gate insulating layer provided between the gate electrode and the microcrystalline semiconductor layer and having a projecting region in contact with the microcrystalline semiconductor layer, an amorphous semiconductor layer overlapping the microcrystalline semiconductor layer and the gate insulating layer, and a pair of impurity semiconductor layers which are provided over the amorphous semiconductor layer and to which an impurity element imparting one conductivity type is added to form a source region and a drain region.

The microcrystalline semiconductor layer is an i-type microcrystalline semiconductor layer, or an n-type microcrystalline semiconductor layer to which an impurity element serving as a donor is added.

The microcrystalline semiconductor layer has a lower electric conductivity than the amorphous semiconductor layer. When the microcrystalline semiconductor layer contains an impurity element serving as a donor, the donor concentration is from $1\times10^{18}$ atoms/cm$^3$ to $5\times10^{20}$ atoms/cm$^3$. The microcrystalline semiconductor layer extends at least in a channel length direction of the thin film transistor and acts to generate large on-state current due to the aforementioned electric conductivity.

An impurity semiconductor refers to a semiconductor in which most carriers that contribute to electric conduction are supplied by an impurity element imparting one conductivity type which has been added to the semiconductor. The impurity element imparting one conductivity type is an element capable of serving as a donor which supplies electrons as carriers or as an acceptor which supplies holes as carriers. Typically, donors correspond to Group 15 elements of the periodic table, and acceptors correspond to Group 13 elements of the periodic table.

In addition, between the microcrystalline semiconductor layer and the amorphous semiconductor layer, an additional microcrystalline semiconductor layer or a microcrystalline semiconductor layer containing an impurity element serving as a donor may be provided. Note that, when the microcrystalline semiconductor layer provided between the microcrystalline semiconductor layer and the amorphous semiconductor layer contains an impurity element serving as a donor, the concentration of the impurity element serving as a donor is lower than that of the impurity element imparting one conductivity type added to the pair of impurity semiconductor layers to form a source region and a drain region.

A microcrystalline semiconductor refers to, for example, a semiconductor which has a grain size of 2 nm to 200 nm, preferably 10 nm to 80 nm, more preferably 20 nm to 50 nm, a dark conductivity of approximately $10^{-7}$ S/cm to $10^{-5}$ S/cm, and a photoconductivity of $10^{-4}$ S/cm to $10^{-3}$ S/cm and a semiconductor whose electric conductivity can be increased to approximately $10^1$ S/cm by valence control. It should be noted that the concept of microcrystalline semiconductor in the present invention is not only fixed to the aforementioned values of grain size and electric conductivity, and any other semiconductor material that has equivalent physical values can be used instead. An amorphous semiconductor refers to a semiconductor which does not have a crystalline structure (which does not have long-range order in the atomic arrangement). Note that amorphous silicon also includes one that contains hydrogen.

The term "on-state current" refers to an electric current which flows in a channel formation region when appropriate gate voltage is applied to a gate electrode in order to cause a current to flow in the channel formation region (that is, when a thin film transistor is in an on state). The term "off-state current" refers to an electric current which flows between a source and a drain when a gate voltage is lower than a threshold voltage of a thin film transistor (that is, when the thin film transistor is in an off state).

When a gate insulating layer has a smaller thickness in a portion not in contact with a microcrystalline semiconductor layer than in a portion in contact with the microcrystalline semiconductor layer over a gate electrode, large on-state current can be obtained and off-state current can be reduced. In addition, field-effect mobility can be increased, which makes high-speed operation possible.

BRIEF DESCRIPTION OF THE DRAWINGS

FIGS. 25A, 25B-1 and 25B-2, 25C-1 and 25C-2, and 25D-1 and 25D-2 are diagrams illustrating models used for device simulation and graphs showing current-voltage characteristics obtained by device simulation.

DETAILED DESCRIPTION OF THE INVENTION

Figure 1:
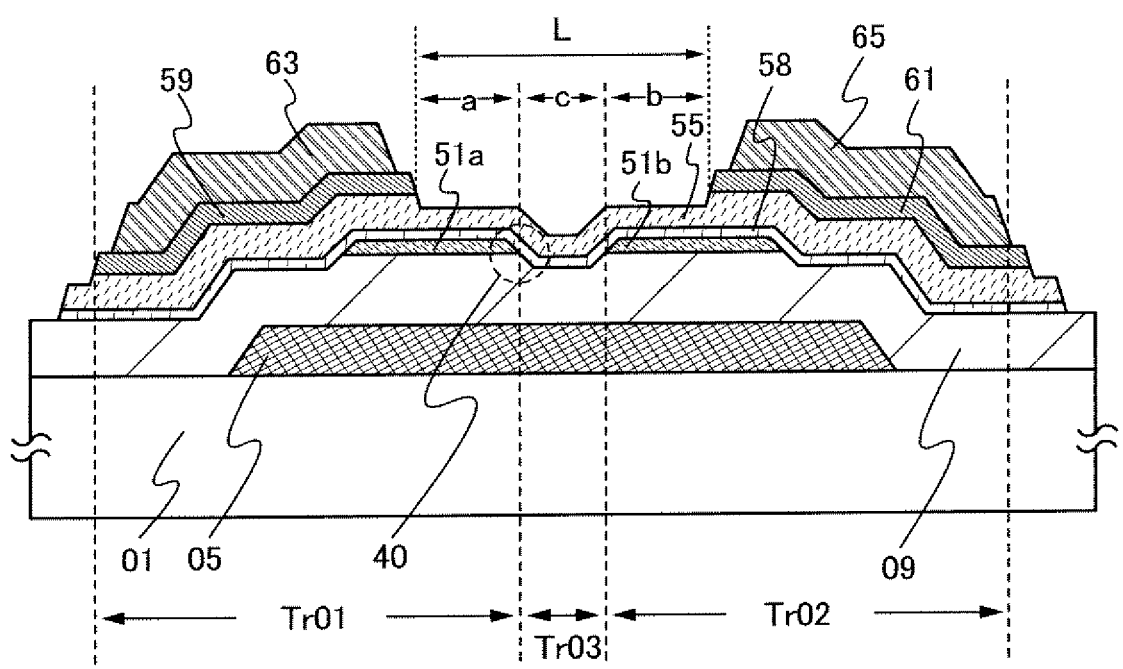
FIG. 1 is a cross-sectional view illustrating a thin film transistor according to an embodiment mode of the present invention.

Embodiment modes and embodiments of the present invention will be described below with reference to the drawings. Note that the present invention is not limited to the following description, and it is easily understood by those skilled in the art that the mode and detail of the present invention can be changed in various ways without departing from the spirit and scope thereof. Thus, the present invention should not be interpreted as being limited to the following description in the embodiment modes and embodiments. In the modes of the present invention described below, the same components in different diagrams are commonly denoted by the same reference numerals.

In addition, in the following embodiment modes and embodiments, cases are described in which a gate electrode 05 is a part of a gate wiring. Thus, there are cases where the gate electrode 05 is referred to as a gate wiring 05. In a similar manner, there are cases where a wiring 63 is referred to as a source wiring 63 or a source electrode 63. Furthermore, in a similar manner, there are cases where a wiring 65 is referred to as a drain electrode 65.

Embodiment Mode 1

Here, a structure of a thin film transistor is described with reference to FIG. 1, which has smaller off-state current than a thin film transistor having a microcrystalline semiconductor layer in a channel formation region and which is capable of operating at higher speed and has larger on-state current than a thin film transistor having an amorphous semiconductor layer in a channel formation region.

In a thin film transistor illustrated in FIG. 1, a gate electrode 05 is formed over a substrate 01; a gate insulating layer 09 is formed over the gate electrode 05; first microcrystalline semiconductor layers 51a and 51b which are separated from each other are formed over the gate insulating layer 09; and a second microcrystalline semiconductor layer 58 is formed over the first microcrystalline semiconductor layers 51a and 51b and the gate insulating layer 09. In addition, an amorphous semiconductor layer 55 is formed to cover the second microcrystalline semiconductor layer 58. Over the amorphous semiconductor layer 55, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed.

The gate insulating layer 09 has projecting regions in contact with the first microcrystalline semiconductor layers 51a and 51b. That is, the gate insulating layer 09 has a larger thickness in regions overlapped by the first microcrystalline semiconductor layers 51a and 51b than in a region not in contact with the first microcrystalline semiconductor layers 51a and 51b but in contact with the second microcrystalline semiconductor layer 58.

Here, enlarged views of an end portion 40 of the first microcrystalline semiconductor layer 51a are illustrated in FIGS. 2A to 2F.

Figure 2A:
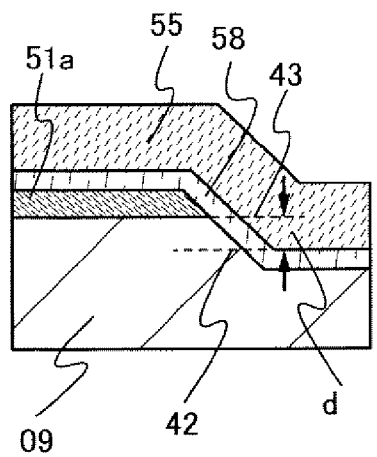
FIGS. 2A to 2F are cross-sectional views illustrating thin film transistors according to an embodiment mode of the present invention.

As illustrated in FIG. 2A, an interface 43 of the gate insulating layer 09 in contact with the first microcrystalline semiconductor layer 51a is not aligned with an interface 42 of the amorphous semiconductor layer 55 in contact with the second microcrystalline semiconductor layer 58. Thus, the regions in contact with the first microcrystalline semiconductor layers 51a and 51b have a projecting shape.

The interface 43 between the first microcrystalline semiconductor layer 51a and the gate insulating layer 09 and the interface 42 between the second microcrystalline semiconductor layer 58 and the amorphous semiconductor layer 55 may be apart from each other at a distance d without being aligned with each other. In such a case, a portion of the gate insulating layer 09 in contact with the second microcrystalline semiconductor layer 58 is hollowed relative to a portion of the gate insulating layer 09 in contact with the first microcrystalline semiconductor layer 51a by a thickness equal to or greater than the thickness of the second microcrystalline semiconductor layer 58 and thus has a depressed shape.

Figure 2B:
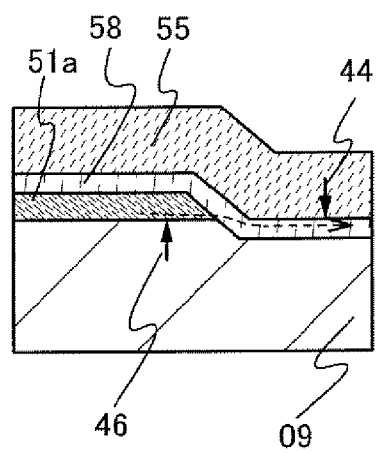

As illustrated in FIG. 2B, an interface 46 between the first microcrystalline semiconductor layer 51a and the gate insulating layer 09 may be roughly aligned with an interface 44 between the second microcrystalline semiconductor layer 58 and the amorphous semiconductor layer 55. The second microcrystalline semiconductor layer 58 improves its crystallinity as it becomes thicker in a thickness direction. In addition, a portion of the first microcrystalline semiconductor layer 51a adjacent to the gate insulating layer 09 is roughly aligned with a region of the second microcrystalline semiconductor layer 58 having high crystallinity. Thus, carriers induced in the portion of the first microcrystalline semiconductor layer 51a adjacent to the gate insulating layer 09 pass a shorter distance in the second microcrystalline semiconductor layer 58 having high crystallinity. Accordingly, on-state current can be increased and field-effect mobility can also be increased.

Figure 2C:
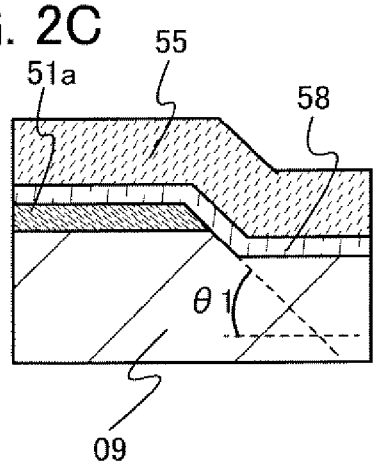

As illustrated in FIG. 2C, the projecting region of the gate insulating layer 09 in contact with the first microcrystalline semiconductor layer 51a may have a tapered shape where a side surface of the projecting region is at an angle θ1 to the substrate surface. The angle θ1 at this time is equal to or greater than 20° and less than 85°, preferably equal to or greater than 30° and less than or equal to 60°.

Figure 2D:
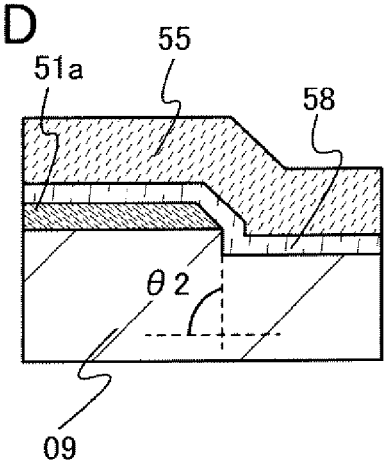

As illustrated in FIG. 2D, the projecting region of the gate insulating layer 09 in contact with the first microcrystalline semiconductor layer 51a may have a roughly perpendicular side surface which is at an angle θ2 to the substrate surface. The angle θ2 at this time is equal to or greater than 85° and less than 95°, preferably equal to or greater than 88° and less than or equal to 92°.

Figure 2E:
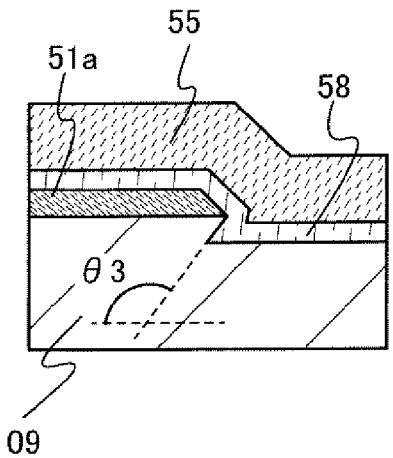

As illustrated in FIG. 2E, the projecting region of the gate insulating layer 09 in contact with the first microcrystalline semiconductor layer 51a may have a tapered shape where a side surface of the projecting region is at an angle θ3 to the substrate surface. The angle θ3 at this time is equal to or greater than 95° and less than or equal to 160°, preferably equal to or greater than 120° and less than or equal to 150°.

Figure 2F:
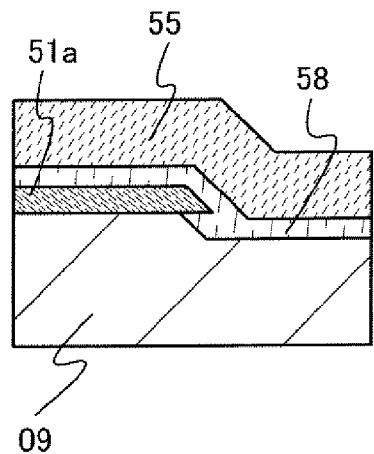

As illustrated in FIG. 2F, an end portion of the first microcrystalline semiconductor layer 51a and an end portion of the gate insulating layer 09 in contact with the first microcrystalline semiconductor layer 51a, that is, a side surface of the projecting portion of the gate insulating layer 09 may be at a misaligned position.

The gate insulating layer 09 can be formed with a single layer structure or a stacked layer structure with the use of a silicon oxide layer, a silicon nitride layer, a silicon oxynitride layer, and/or a silicon nitride oxide layer each having a thickness of 50 nm to 150 nm. As one embodiment of stacked layer structure, there is an example in which a silicon nitride layer or a silicon nitride oxide layer is formed and a silicon oxide layer or a silicon oxynitride layer is stacked thereover. There is also an example in which a silicon nitride layer or a silicon nitride oxide layer is formed, a silicon oxide layer or a silicon oxynitride layer is stacked thereover, and a silicon nitride layer or a silicon nitride oxide layer is stacked thereover.

When the gate insulating layer is formed with a silicon nitride layer or a silicon nitride oxide layer, the adhesion force between the substrate 01 and the gate insulating layer 09 can be increased. In addition, in the case where a glass substrate is used as the substrate 01, an impurity element, such as sodium, contained in the substrate 01 can be prevented from diffusing into the first microcrystalline semiconductor layers 51a and 51b, the second microcrystalline semiconductor layer 58, and the amorphous semiconductor layer 55, and furthermore, the gate electrode 05 can be prevented from oxidizing. That is, film peeling can be prevented and electric characteristics of a thin film transistor to be formed later can be improved. The gate insulating layer 09 preferably has a thickness of 100 nm or more because the gate insulating layer 09 having the above thickness can alleviate a decrease in coverage of the gate electrode 05 due to a step.

Here, a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. A silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride layer or the silicon nitride oxide layer is defined as 100 at. %.

The gate insulating layer 09 has projecting regions in contact with the first microcrystalline semiconductor layers 51a and 51b. That is, the gate insulating layer 09 has a larger thickness in regions overlapped by the first microcrystalline semiconductor layers 51a and 51b than in a region not in contact with the first microcrystalline semiconductor layers 51a and 51b but in contact with the second microcrystalline semiconductor layer 58. Such a shape allows a higher electric field to be generated in a thin region of the gate insulating layer 09 when voltage is applied to the gate electrode 05 and allows a larger number of carriers to be induced in the second microcrystalline semiconductor layer 58 in contact with the thin region. Thus, on-state current and electric field-effect of a thin film transistor can be increased.

The first microcrystalline semiconductor layers 51a and 51b are formed with a microcrystalline silicon layer, a microcrystalline silicon germanium layer, a microcrystalline germanium layer, a polycrystalline silicon layer, a polycrystalline silicon germanium layer, a polycrystalline germanium layer, or the like.

As the first microcrystalline semiconductor layers 51a and 51b, it is possible to use a microcrystalline semiconductor layer to which an impurity element serving as a donor which is an element that supplies electrons as carriers is added. Typical examples of the impurity element serving as a donor include phosphorus, arsenic, and antimony which are Group 15 elements of the periodic table, and the like.

In the case where the concentration of the impurity element serving as a donor added to the first microcrystalline semiconductor layers 51 and 51b is from $1 \times 10^{18}$ atoms/cm$^3$ to $5 \times 10^{20}$ atoms/cm$^3$ when measured by secondary ion mass spectroscopy (SIMS), the resistance at the interface between the gate insulating layer 09 and the first microcrystalline semiconductor layers can be reduced and a thin film transistor which can operate at high speed and achieve large on-state current can be manufactured.

Here, a microcrystalline semiconductor layer is a layer which includes a semiconductor having an intermediate structure between amorphous and crystalline (including single-crystalline and polycrystalline) structures. A microcrystalline semiconductor is a semiconductor having a third state that is stable in terms of free energy and a crystalline semiconductor having short-range order and lattice distortion, in which columnar or needle-like crystals having a grain size of 2 nm to 200 nm, preferably 10 nm to 80 nm, more preferably 20 nm to 50 nm have grown in a direction normal to the substrate surface. A microcrystalline semiconductor is also a semiconductor whose electric conductivity that is roughly $10^{-7}$ S/cm to $10^{-4}$ S/cm can be increased to approximately $10^1$ S/cm by valence control. There is a non-single-crystal semiconductor between a plurality of microcrystalline semiconductors. Microcrystalline silicon, which is a typical example of microcrystal semiconductor, has its Raman spectrum shifted to a lower wave number side than 520 cm$^{-1}$ which represents single crystal silicon. That is, the peak of a Raman spectrum of microcrystalline silicon is within the range from 520 cm$^{-1}$ which represents single crystal silicon to 480 cm$^{-1}$ which represents amorphous silicon. In addition, a microcrystalline semiconductor is made to contain hydrogen or halogen of at least 1 at. % or more for termination of dangling bonds. Moreover, a microcrystalline semiconductor may be made to contain a noble gas element such as helium, argon, krypton, or neon to further enhance lattice distortion, whereby stability is increased and a favorable microcrystalline semiconductor can be obtained. Such a microcrystalline semiconductor is disclosed in, for example, U.S. Pat. No. 4,409,134. It should be noted that, in the present invention, the concept of microcrystalline semiconductor is not only fixed to the aforementioned values of grain size and electric conductivity, and any other semiconductor material that has equivalent physical values can be used instead.

The first microcrystalline semiconductor layers 51a and 51b are formed with a thickness of 5 nm to 50 nm, preferably 5 nm to 30 nm.

The first microcrystalline semiconductor layers 51a and 51b preferably have an oxygen concentration and a nitrogen concentration which are each less than ten times as high as the concentration of the impurity element serving as a donor, typically less than $3 \times 10^{19}$ atoms/cm$^3$, more preferably less than $3 \times 10^{18}$ atoms/cm$^3$, and has a carbon concentration of $3 \times 10^{18}$ atoms/cm$^3$ or less. By a decrease in concentration of oxygen, nitrogen, and carbon mixed into the first microcrystalline semiconductor layers 51a and 51b, generation of defects in the microcrystalline semiconductor layers can be suppressed. Furthermore, oxygen or nitrogen present in a microcrystalline semiconductor layer inhibits crystallization. Thus, when the oxygen concentration and the nitrogen concentration in a microcrystalline semiconductor layer are kept relatively low and an impurity element serving as a donor is added, crystallinity of the microcrystalline semiconductor layer can be improved.

When an impurity element serving as an acceptor is added to the first microcrystalline semiconductor layers 51a and 51b at the same time as or after the formation of the first microcrystalline semiconductor layers 51a and 51b, threshold voltage control becomes possible. A typical example of the impurity element serving as an acceptor is boron, and an impurity gas such as $B_2H_6$ or $BF_3$ may be mixed into silicon hydride at a proportion of 1 ppm to 1000 ppm, preferably 1 ppm to 100 ppm. The concentration of boron may be approximately a tenth of that of the impurity element serving as a donor, for example, $1 \times 10^{14}$ atoms/cm$^2$ to $6 \times 10^{16}$ atoms/cm$^3$.

Instead of the first microcrystalline semiconductor layers 51*a* and 51*b*, microcrystalline semiconductor particles may be dispersed.

When the first microcrystalline semiconductor layers 51*a* and 51*b* are formed, these regions have higher electric conductivity than an amorphous semiconductor layer; thus, a large number of carriers are induced in the first microcrystalline semiconductor layers 51*a* and 51*b* when voltage is applied to the gate electrode. Therefore, on-state current and field-effect mobility of a thin film transistor are increased.

The second microcrystalline semiconductor layer 58 is formed with a microcrystalline silicon layer, a microcrystalline silicon germanium layer, a microcrystalline germanium layer, a polycrystalline silicon layer, a polycrystalline silicon germanium layer, a polycrystalline germanium layer, or the like. Alternatively, an i-type semiconductor layer to which an impurity element serving as a donor or an impurity element serving as an acceptor is not added or a substantially i-type (including an n-type to which an impurity element serving as a donor is added at low concentration and a p-type to which an impurity element serving as an acceptor is added at low concentration) semiconductor layer is formed. The second microcrystalline semiconductor layer 58 is formed with a thickness of 5 nm to 50 nm, preferably 10 nm to 30 nm.

The amorphous semiconductor layer 55 is formed with an amorphous silicon layer, an amorphous silicon layer containing germanium, or the like. The amorphous semiconductor layer 55 is preferably formed with an i-type or a substantially i-type amorphous silicon layer or the like. The amorphous semiconductor layer 55 may contain fluorine, chlorine, or the like. A portion of the amorphous semiconductor layer 55 overlapped by a wiring has a thickness equal to or greater than 50 nm and less than 500 nm.

The amorphous semiconductor layer 55 covers the first microcrystalline semiconductor layers 51*a* and 51*b* with the second microcrystalline semiconductor layer 58 interposed therebetween. In the peripheral portion of the first microcrystalline semiconductor layers 51 and 51*b*, the amorphous semiconductor layer 55 is in contact with the gate insulating layer 09 and the second microcrystalline semiconductor layer 58. In such a structure, the first microcrystalline semiconductor layers 51*a* and 51*b* are isolated from the pair of impurity semiconductor layers 59 and 61 to which the impurity element imparting one conductivity type is added. Thus, leakage current generated between the first microcrystalline semiconductor layers 51*a* and 51*b* and the pair of impurity semiconductor layers 59 and 61 to which the impurity element imparting one conductivity type is added can be reduced.

In the case where the gate insulating layer 09 is a silicon oxide layer or a silicon oxynitride layer, when the second microcrystalline semiconductor layer 58 is formed using a microcrystalline semiconductor to which an impurity element serving as a donor is added at a lower concentration than to a semiconductor layer which is used as the first microcrystalline semiconductor layers 51*a* and 51*b*, a change in threshold voltage can be reduced.

Examples of substrates that can be used as the substrate 01 are as follows: non-alkaline glass substrates made from barium borosilicate glass, aluminoborosilicate glass, aluminosilicate glass, and the like by a fusion method or a floating method; ceramic substrates; plastic substrates having heat resistance sufficient to withstand processing temperatures in this manufacturing process; and the like. Another example is a substrate obtained by providing a surface of a metal substrate of a stainless steel alloy or the like with an insulating layer. When the substrate 01 is a mother glass substrate, the substrate may have a size of the 1st generation (e.g., 320 mm×400 mm), the 2nd generation (e.g., 400 mm×500 mm), the 3rd generation (e.g., 550 mm×650 mm), the 3.5th generation (e.g., 600 mm×720 mm, or 620 mm×750 mm), the 4th generation (e.g., 680 mm×880 mm, or 730 mm×920 mm), the 5th generation (e.g., 1100 mm×1300 mm), the 6th generation (e.g., 1500 mm×1800 mm), the 7th generation (e.g., 1900 mm×2200 mm), the 8th generation (e.g., 2200 mm×2400 mm), the 9th generation (e.g., 2400 mm×2800 mm, or 2450 mm×3050 mm), the 10th generation (e.g., 2850 mm×3050 mm), or the like.

The gate electrode 05 is formed with a metal material. Aluminum, chromium, titanium, tantalum, molybdenum, copper, or the like is used as a metal material. The gate electrode 05 is preferably formed with aluminum or a stacked layer structure of aluminum and a barrier metal. As a barrier metal, a refractory metal such as titanium, molybdenum, or chromium is used. A barrier metal is provided to prevent hillock and oxidation of aluminum.

The gate electrode 05 is formed with a thickness of 50 nm to 300 nm. When the gate electrode 05 has a thickness of 50 nm to 100 nm, it is possible to prevent a semiconductor layer and a wiring to be formed later from being disconnected. In addition, when the gate electrode 05 has a thickness of 150 nm to 300 nm, it is possible to reduce the resistance of the gate electrode 05 and increase the area thereof.

Note that a semiconductor layer and a wiring are formed over the gate electrode 05; thus, it is preferable to process the gate electrode 05 such that its end portion has a tapered shape in order to prevent disconnection. Further, in this step, although not illustrated, a wiring or a capacitor wiring which is connected to the gate electrode can also be formed at the same time.

In the case where an n-channel thin film transistor is formed, phosphorus may be added as a typical impurity element to the pair of impurity semiconductor layers 59 and 61 to which the impurity element imparting one conductivity type is added, and an impurity gas such as phosphine may be added to silicon hydride. In the case where a p-channel thin film transistor is formed, boron may be added as a typical impurity element, and an impurity gas such as diborane may be added to silicon hydride. When including phosphorus or boron at a concentration of $1 \times 10^{19}$ atoms/cm$^3$ to $1 \times 10^{21}$ atoms/cm$^3$, the pair of impurity semiconductor layers 59 and 61 to which the impurity element imparting one conductivity type is added can make ohmic contact with the wirings 63 and 65 and function as a source region and a drain region. The pair of impurity semiconductor layers 59 and 61 to which the impurity element imparting one conductivity type is added can be formed with a microcrystalline semiconductor layer or an amorphous semiconductor layer. The pair of impurity semiconductor layers 59 and 61 to which the impurity element imparting one conductivity type is added are formed with a thickness of 10 nm to 100 nm, preferably 30 nm to 50 nm. When the pair of impurity semiconductor layers 59 and 61 to which the impurity element imparting one conductivity type is added have a small thickness, throughput can be improved.

The first microcrystalline semiconductor layers 51*a* and 51*b* are separated from each other at a certain distance (distance c). An end portion of the impurity semiconductor layer 59 to which the impurity element imparting one conductivity type is added and an end portion of the first microcrystalline semiconductor layer 51*a* are separated from each other at a distance a, and an end portion of the impurity semiconductor layer 61 to which the impurity element imparting one conductivity type is added and an end portion of the first microcrystalline semiconductor layer 51b are separated from each other at a distance b. When the distances a and b are greater than the distance between the first microcrystalline semiconductor layers 51a and 51b which are separated from each other (the distance c), off-state current of a thin film transistor can be reduced, on-state current can be increased, and high-speed operation can be achieved.

The wirings 63 and 65 are formed with aluminum. Alternatively, the wirings 63 and 65 are formed with copper or an aluminum alloy to which an element which prevents hillocks or an element which improves heat resistance, such as silicon, titanium, neodymium, scandium, or molybdenum, is added. Furthermore, the wirings 63 and 65 are preferably formed with a single layer or a stacked layer of aluminum or aluminum alloy mentioned above. Moreover, a stacked layer structure may be employed in which a layer on the side in contact with the pair of impurity semiconductor layers to which the impurity element imparting one conductivity type is added is formed from titanium, tantalum, molybdenum, tungsten, or nitride of any of these elements and an aluminum or aluminum alloy layer is formed thereover. Furthermore, a stacked layer structure may be employed in which upper and lower surfaces of aluminum or an aluminum alloy may each be covered with titanium, tantalum, molybdenum, tungsten, or nitride thereof. Here, for the wirings 63 and 65, a conductive layer can be used which has a stacked layer structure where an aluminum layer is provided over a titanium layer and a titanium layer is provided over the aluminum layer.

Figure 3:
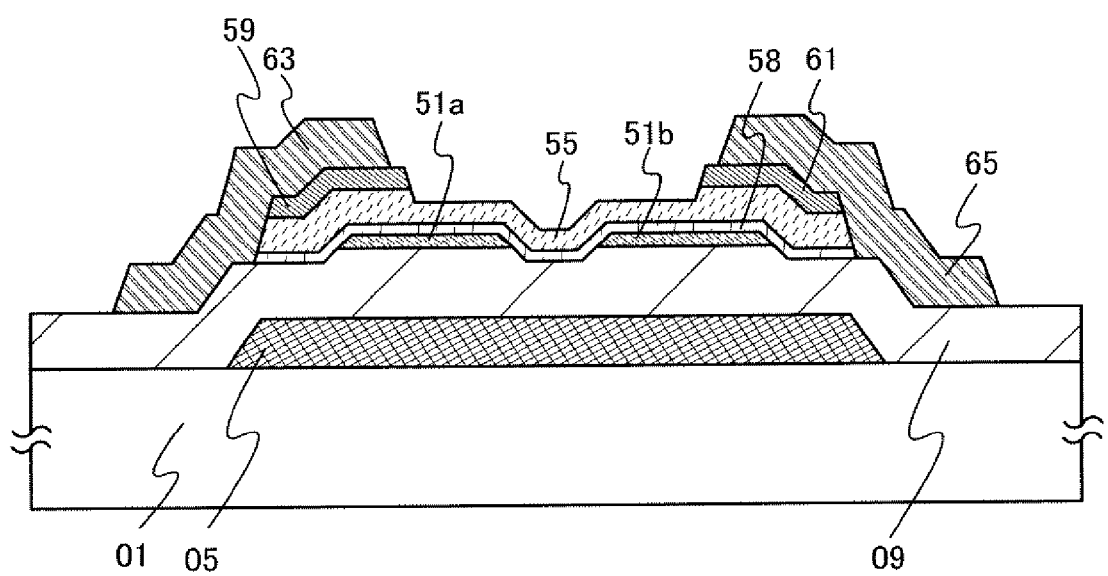
FIG. 3 is a cross-sectional view illustrating a thin film transistor according to an embodiment mode of the present invention.

The thin film transistor illustrated in FIG. 1 has a structure in which the amorphous semiconductor layer 55 is not in contact with the wirings 63 and 65 and the wirings 63 and 65 are formed over the amorphous semiconductor layer 55 with the pair of impurity semiconductor layers 59 and 61 to which the impurity element imparting one conductivity type is added interposed therebetween. As illustrated in FIG. 3, the thin film transistor may have a structure in which side surfaces of the amorphous semiconductor layer 55 and the second microcrystalline semiconductor layer 58 are in contact with the wirings 63 and 65.

In the thin film transistor described in this embodiment mode, a first thin film transistor Tr01 and a second thin film transistor Tr02 are connected to a third thin film transistor Tr03. The first thin film transistor Tr01 includes the gate electrode 05, the gate insulating layer 09, the first microcrystalline semiconductor layer 51a, the second microcrystalline semiconductor layer 58, the amorphous semiconductor layer 55, the impurity semiconductor layer 59 to which the impurity element imparting one conductivity type is added, and the wiring 63. The second thin film transistor Tr02 includes the gate electrode 05, the gate insulating layer 09, the first microcrystalline semiconductor layer 51b, the second microcrystalline semiconductor layer 58, the amorphous semiconductor layer 55, the impurity semiconductor layer 61 to which the impurity element imparting one conductivity type is added, and the wiring 65. The third thin film transistor Tr03 includes the gate electrode 05, the gate insulating layer 09, the second microcrystalline semiconductor layer 58, and the amorphous semiconductor layer 55.

The third thin film transistor Tr03 is a thin film transistor in which the second microcrystalline semiconductor layer 58 is used for a channel formation region. On the other hand, in the first thin film transistor Tr01 and the second thin film transistor Tr02, regions where carriers flow is the first microcrystalline semiconductor layers 51a and 51b. When the first microcrystalline semiconductor layers 51a and 51b are microcrystalline semiconductor layers to which an impurity element serving as a donor is added or layers having high electric conductivity, the layers have a lower resistance than a microcrystalline semiconductor layer. Thus, even in the state where a positive voltage lower than the threshold voltage of the first thin film transistor Tr01 and the second thin film transistor Tr02 is applied to the gate electrode 05, a large number of carriers are induced in the first microcrystalline semiconductor layers 51a and 51b. When a positive voltage equal to or higher than the threshold voltage of the first thin film transistor Tr01 and the second thin film transistor Tr02 is applied to the gate electrode 05, the first thin film transistor Tr01 and the second thin film transistor Tr02 are turned on, and the large number of carriers induced in the first microcrystalline semiconductor layers 51a and 51b flow to the wiring 63 of the first thin film transistor Tr01 or the wiring 65 of the second thin film transistor Tr02. That is, the first thin film transistor Tr01 and the second thin film transistor Tr02 function as switches that allow carriers induced in the first microcrystalline semiconductor layers 51a and 51b to flow to the wiring 63 or the wiring 65.

The channel length L of the thin film transistor of this embodiment mode is the sum of the distance a between the end portion of the impurity semiconductor layer 59 to which the impurity element imparting one conductivity type is added and the end portion of the first microcrystalline semiconductor layer 51a, the distance b between the end portion of the impurity semiconductor layer 61 to which the impurity element imparting one conductivity type is added and the end portion of the first microcrystalline semiconductor layer 51b, and the distance between the first microcrystalline semiconductor layers 51a and 51b which are separated from each other (distance c). When the distance a between the end portion of the impurity semiconductor layer 59 to which the impurity element imparting one conductivity type is added and the end portion of the first microcrystalline semiconductor layer 51a and the distance b between the end portion of the impurity semiconductor layer 61 to which the impurity element imparting one conductivity type is added and the end portion of the first microcrystalline semiconductor layer 51b are increased with respect to the channel length L, the channel lengths of the first thin film transistor Tr01 and the second thin film transistor Tr02 are increased, the distance c between the first microcrystalline semiconductor layers 51a and 51b which are separated from each other is decreased, and the number of carriers induced is increased, whereby on-state current is increased and mobility is also increased.

Note that the channel length of the third thin film transistor Tr03 (that is, the distance c) can be made short in accordance with this embodiment mode; thus, the thickness of the gate insulating layer is preferably small so as to prevent short channel effect in the third thin film transistor Tr03.

On the other hand, when a negative voltage is applied to the gate electrode 05, carriers flow in the amorphous semiconductor layer 55 of the first to third thin film transistors Tr01 to Tr03. Because the amorphous semiconductor layer has low electric conductivity and high resistance, off-state current is small.

From the above description, the thin film transistor described in this embodiment mode is a thin film transistor with large on-state current and mobility and small off-state current.

The thickness of the gate insulating layer 09 in the third thin film transistor Tr03 is smaller than that of the gate insulating layer 09 in the first thin film transistor Tr01 and the second thin film transistor Tr02. Thus, when voltage is applied to the gate electrode 05, a larger number of carriers are induced at or in the vicinity of the interface between the gate insulating layer 09 and the second microcrystalline semiconductor layer 58 in the third thin film transistor Tr03. Accordingly, on-state current and field-effect mobility of the thin film transistor of this embodiment mode can be increased.

In addition, the surface (back channel) of the amorphous semiconductor layer 55 between the source region and the drain region is not flat and the distance is long. Thus, the distance which leakage current flows at the surface of the amorphous semiconductor layer 55 between the source region and the drain region is long. As a result, leakage current flowing at the surface of the amorphous semiconductor layer 55 can be reduced.

In addition, between the gate electrode 05 and the impurity semiconductor layers 59 and 61 to which the impurity element imparting one conductivity type is added, the second microcrystalline semiconductor layer 58 and the amorphous semiconductor layer 55 as well as the gate insulating layer 09 are formed, and the distance between the gate electrode 05 and the impurity semiconductor layers 59 and 61 to which the impurity element imparting one conductivity type is added is increased. Thus, parasitic capacitance generated between the gate electrode 05 and the impurity semiconductor layers 59 and 61 to which the impurity element imparting one conductivity type is added can be reduced. In particular, voltage drop on the drain side can be reduced. Accordingly, a display device employing this structure has higher pixel response speed. In particular, in the case of a thin film transistor formed in a pixel of a liquid crystal display device, drop of drain voltage can be reduced; thus, response speed of a liquid crystal material can be increased.

In FIG. 1, in the thin film transistor described in this embodiment mode, the channel length a of the first thin film transistor Tr01 and the channel length b of the second thin film transistor Tr02 are illustrated as being roughly equal to each other, which may differ from each other.

In the thin film transistor described in this embodiment mode, the first microcrystalline semiconductor layers 51a and 51b are formed by etching using a resist mask that is formed by a photolithography process using the same photomask. Accordingly, there is no necessity for photomask alignment with submicron-level accuracy; thus, variation of the distance c between the first microcrystalline semiconductor layer 51a and the first microcrystalline semiconductor layer 51b can be reduced. The distance can be set approximately equal to the resolution limit of a light exposure apparatus. With the use of a phase shift mask, the distance can be set equal to or less than the resolution limit of a light exposure apparatus. The distance c between the first microcrystalline semiconductor layer 51a and the first microcrystalline semiconductor layer 51b is the channel length of the third thin film transistor which is turned on when a positive gate voltage is applied; thus, with the structure of this embodiment mode, variation can be reduced and on-state current and mobility of the thin film transistor can be increased.

Embodiment Mode 2

In this embodiment mode, a structure of a thin film transistor with still larger on-state current and higher field-effect mobility than those in Embodiment Mode 1 is described with reference to FIG. 4. In addition, a structure of a TFT with which off-state current can be reduced is described.

A thin film transistor described in this embodiment mode differs from the thin film transistor described in Embodiment Mode 1, in that buffer layers 53a and 53b are provided between the first microcrystalline semiconductor layers 51a and 51c and the second microcrystalline semiconductor layer 58. The buffer layers 53a and 53b are provided so as to roughly overlap the first microcrystalline semiconductor layers 51a and 51b.

The buffer layers 53a and 53b are formed using an amorphous semiconductor layer. The buffer layers 53a and 53b are preferably formed using an i-type or a substantially i-type amorphous semiconductor layer. Alternatively, an amorphous semiconductor layer to which a halogen such as fluorine or chlorine is added is used. The thickness of the buffer layers 53a and 53b is from 30 nm to 200 nm, preferably 50 nm to 150 nm. Examples of amorphous semiconductor layers include an amorphous silicon layer, an amorphous silicon layer containing germanium, and the like.

When buffer layers 53a and 53b are formed using an amorphous semiconductor layer or an amorphous semiconductor layer containing hydrogen, nitrogen, or a halogen, natural oxidation of surfaces of crystal grains of the first microcrystalline semiconductor layers 51a and 51b can be prevented. In particular, in a region of the microcrystalline semiconductor layer where microcrystalline grains are in contact with an amorphous semiconductor, stress is likely to be concentrated and a crack is likely to be caused. If this crack is exposed to oxygen, crystal grains are oxidized and silicon oxide is formed. However, when the buffer layers 53a and 53b are formed over the surface of the first microcrystalline semiconductor layers 51a and 51b, oxidation of microcrystalline grains can be prevented. Accordingly, defects that capture carriers or a region that hinders carrier transfer can be reduced; thus, high-speed operation of the thin film transistor can be achieved, and on-state current can be increased.

The buffer layers 53a and 53b may be formed using an insulating layer. Typically, the buffer layers 53a and 53b are formed using a silicon nitride layer, a silicon oxide layer, a silicon nitride oxide layer, a silicon oxynitride layer, or another inorganic insulating layer. Alternatively, the buffer layers 53a and 53b are formed using polyimide, an acrylic resin, an epoxy resin, or another organic insulating layer. The thickness of the buffer layers 53a and 53b is from 10 nm to 150 nm. When the butter layers 53a and 53b are formed with an insulating layer, leakage current flowing to the amorphous semiconductor layer 55 from the pair of impurity semiconductor layers 59 and 61 to which the impurity element imparting one conductivity type is added can be blocked by the buffer layer 53; thus, leakage current can be reduced. In addition, off-state current can be reduced.

Figure 23:
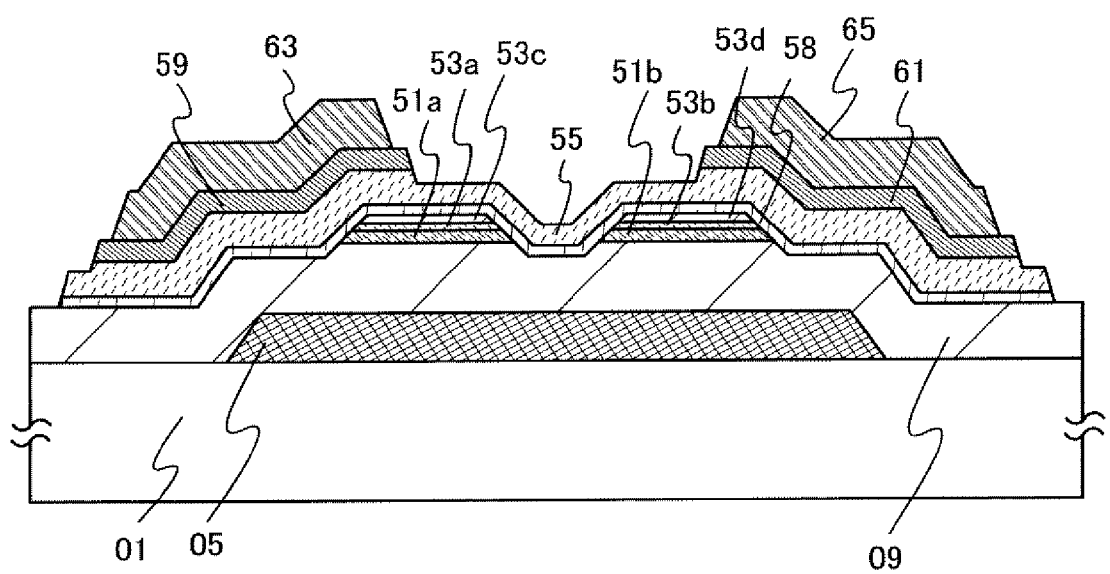
FIG. 23 is a cross-sectional view illustrating a thin film transistor according to an embodiment mode of the present invention.

Furthermore, as illustrated in FIG. 23, a stacked layer structure of buffer layers 53a and 53b formed with a semiconductor layer and buffer layers 53c and 53d formed with an insulating layer may be employed. The thickness of the buffer layers 53a, 53b, 53c, and 53d is from 30 nm to 200 nm, preferably from 50 nm to 150 nm. Specifically, the buffer layers 53a and 53b formed with a semiconductor layer, typically, amorphous semiconductor layers may be provided in contact with the first microcrystalline semiconductor layers 51a and 51b, and the buffer layers 53c and 53d formed with an insulating layer may be provided thereover. In this case, where amorphous semiconductor layers are typically formed over the first microcrystalline semiconductor layers 51a and 51b as the buffer layers 53a and 53b formed with a semiconductor layer, oxidation of the first microcrystalline semiconductor layers 51a and 51b can be reduced and a decrease in resistance of the first microcrystalline semiconductor layers 51a and 51b can be suppressed. When the buffer layers 53c and 53d formed with an insulating layer are formed over the buffer layers 53a and 53b formed with a semiconductor layer, leakage current flowing to the second microcrystalline semiconductor layer 58 from the pair of impurity semiconductor layers 59 and 61 to which the impurity element imparting one conductivity type is added can be blocked by the buffer layers 53c and 53d formed with an insulating layer; thus, leakage current can be reduced. In addition, off-state current can be reduced.

Note that end portions of the gate insulating layer 09 overlapped by the first microcrystalline semiconductor layers 51a and 51b can have any of the shapes illustrated in FIGS. 2A to 2F.

Embodiment Mode 3

In this embodiment mode, another embodiment of the second microcrystalline semiconductor layer is described with reference to FIG. 5. A feature of this embodiment mode is that two second microcrystalline semiconductor layers are provided, one of which, on the side in contact with the gate insulating layer 09 and the first microcrystalline semiconductor layers 51a and 51b, is an i-type microcrystalline semiconductor layer or amorphous semiconductor layer and the other, on the side in contact with the amorphous semiconductor layer 55, is an n-type microcrystalline semiconductor layer or amorphous semiconductor layer.

Figure 5:
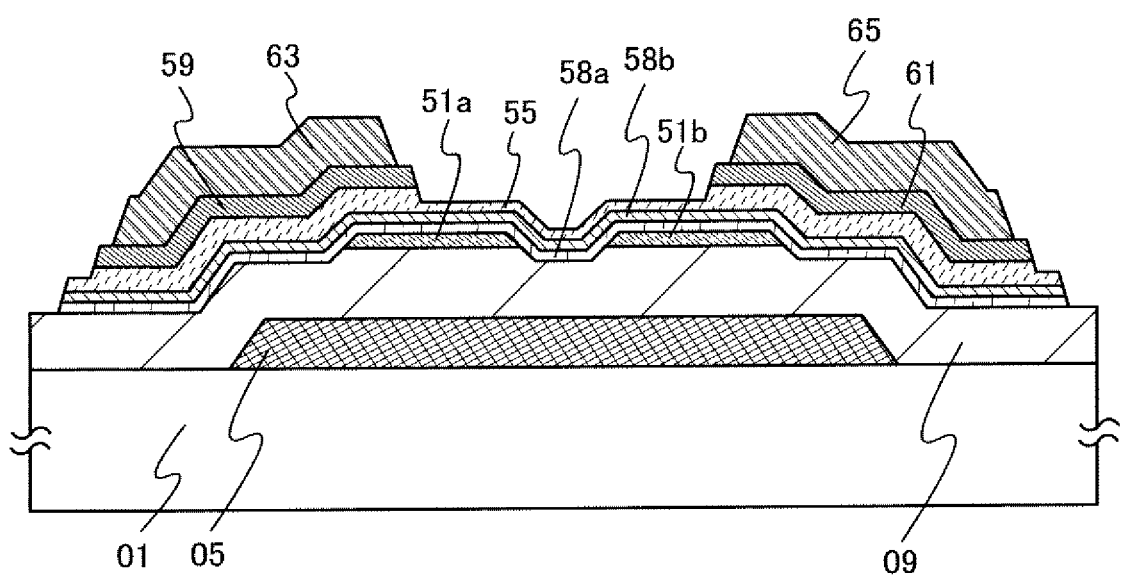
FIG. 5 is a cross-sectional view illustrating a thin film transistor according to an embodiment mode of the present invention.

In a thin film transistor illustrated in FIG. 5, a gate electrode 05 is formed over a substrate 01, a gate insulating layer 09 is formed over the gate electrode 05, and first microcrystalline semiconductor layers 51a and 51b which are separated from each other are formed over the gate insulating layer 09. An i-type semiconductor layer 58a is formed over the first microcrystalline semiconductor layers 51a and 51b and the gate insulating layer 09, and an n-type semiconductor layer 58b to which an impurity serving as a donor is added is formed over the i-type semiconductor layer 58a. In addition, an amorphous semiconductor layer 55 is formed to cover the n-type semiconductor layer 58b. Over the amorphous semiconductor layer 55, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed.

The gate insulating layer 09 has projecting regions in contact with the first microcrystalline semiconductor layers 51a and 51b. That is, the gate insulating layer 09 has a larger thickness in regions overlapped by the first microcrystalline semiconductor layers 51a and 51b than in a region not in contact with the first microcrystalline semiconductor layers 51a and 51b but in contact with the i-type semiconductor layer 58a. Thus, regions of the gate insulating layer in contact with the first microcrystalline semiconductor layers 51a and 51b are elevated.

The n-type semiconductor layer 58b to which the impurity serving as a donor is added has higher electric conductivity than an amorphous semiconductor layer or a microcrystalline semiconductor layer which forms the i-type semiconductor layer 58a. Thus, when the gate insulating layer 09 is provided with a depression between the first microcrystalline semiconductor layers 51a and 51b, the interface between the n-type semiconductor layer 58b and the amorphous semiconductor layer 55 is roughly at the same level as the interface between the first microcrystalline semiconductor layers 51a and 51b and the gate insulating layer 09. Alternatively, the interface becomes closer than the interface between the i-type semiconductor layer 58a and the gate insulating layer 09. Thus, the distance that carriers travel is shortened and on-state current and field-effect mobility are increased.

The concentration of the impurity element serving as a donor contained in the n-type semiconductor layer 58b is preferably lower than the concentration of the impurity element serving as a donor contained in the first microcrystalline semiconductor layers 51a and 51b. As a result, carriers flow in not only the n-type semiconductor layer 58b but also the i-type semiconductor layer 58a and the first microcrystalline semiconductor layers 51a and 51b; thus, a function as a thin film transistor can be achieved.

In comparison to Embodiment Modes 1 and 2, on-state current and field-effect mobility of the thin film transistor can be increased because the n-type semiconductor layer 58b has higher electric conductivity than an i-type microcrystalline semiconductor layer.

Note that end portions of the gate insulating layer 09 overlapped by the first microcrystalline semiconductor layers 51a and 51b can have any of the shapes illustrated in FIGS. 2A to 2F.

Embodiment Mode 4

In this embodiment mode, a thin film transistor in which an amorphous semiconductor layer 55 is formed on first microcrystalline semiconductor layers 51a and 51b is described with reference to FIG. 6.

Figure 6:
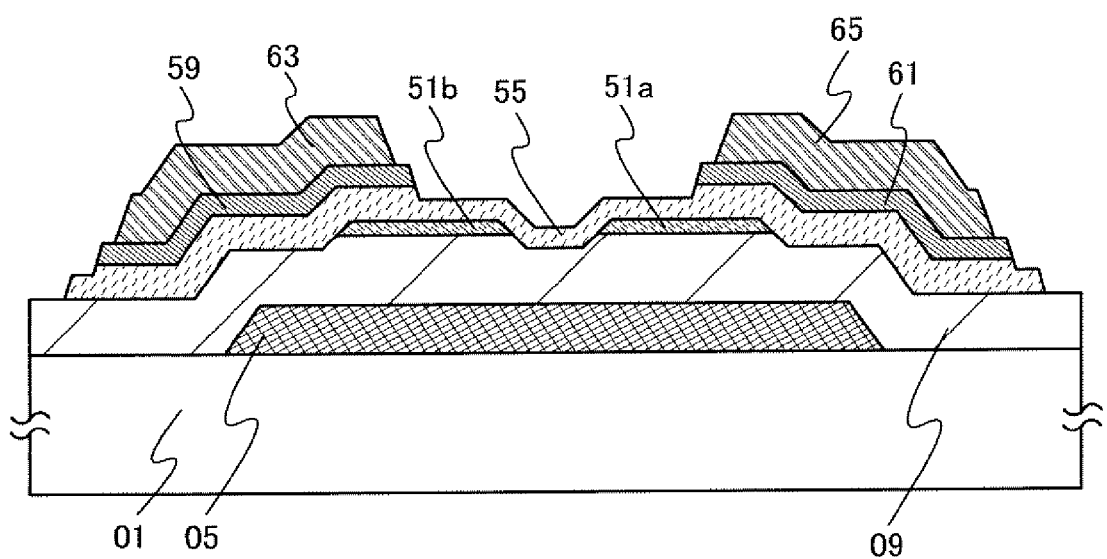
FIG. 6 is a cross-sectional view illustrating a thin film transistor according to an embodiment mode of the present invention.

In a thin film transistor illustrated in FIG. 6, a gate electrode 05 is formed over a substrate 01, a gate insulating layer 09 is formed over the gate electrode 05, first microcrystalline semiconductor layers 51a and 51b which are separated from each other are formed over the gate insulating layer 09, and an amorphous semiconductor layer 55 is formed on the first microcrystalline semiconductor layers 51a and 51b and the gate insulating layer 09. Over the amorphous semiconductor layer 55, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed.

The gate insulating layer 09 have projecting regions in contact with the first microcrystalline semiconductor layers 51a and 51b. That is, the gate insulating layer 09 has a larger thickness in regions overlapped by the first microcrystalline semiconductor layers 51a and 51b than in a region not in contact with the first microcrystalline semiconductor layers 51a and 51b but in contact with the amorphous semiconductor layer 55.

The thin film transistor described in this embodiment mode is a thin film transistor with large on-state current, high mobility, and small off-state current. Note that the thin film transistor described in this embodiment mode differs from that in Embodiment Mode 1, in that a second microcrystalline semiconductor layer is not formed and the amorphous semiconductor layer 55 is formed on the first microcrystalline semiconductor layers 51a and 51b and the gate insulating layer 09. Thus, as compared to Embodiment Mode 1, although on-state current and field-effect mobility are decreased, throughput can be increased and cost can be reduced.

Note that end portions of the gate insulating layer 09 overlapped by the first microcrystalline semiconductor layers 51a and 51b can have any of the shapes illustrated in FIGS. 2A to 2F.

Embodiment Mode 5

In each of Embodiment Modes 1 to 3, conductive layers can be formed in place of the first microcrystalline semiconductor layers 51a and 51b.

Examples of conductive layers include metal layers, metal nitride layers, metal carbide layers, metal boride layers, metal silicide layers, semiconductor layers to which an impurity element serving as a donor is added, and the like.

Typical examples of metal layers that can be used as appropriate are as follows: metal layers of aluminum, copper, titanium, neodymium, scandium, molybdenum, tantalum, tungsten, cobalt, nickel, silver, gold, platinum, tin, iridium, and the like and metal alloy layers including a plurality of these metals. Furthermore, a metal layer can be formed as a single layer or a stacked layer of the metal layer or the metal alloy layer mentioned above.

Examples of metal nitride layers include a titanium nitride layer, a zirconium nitride layer, a hafnium nitride layer, a tantalum nitride layer, a vanadium nitride layer, a niobium nitride layer, a chromium nitride layer, a lanthanum nitride layer, an yttrium nitride layer, and the like. Furthermore, a metal nitride layer can be formed as a single layer or a stacked layer of the metal nitride layer mentioned above.

Examples of metal carbide layers include a titanium carbide layer, a hafnium carbide layer, a niobium carbide layer, a tantalum carbide layer, a vanadium carbide layer, a zirconium carbide layer, a chromium carbide layer, a cobalt carbide layer, a molybdenum carbide layer, a tungsten carbide layer, and the like. Furthermore, a metal carbide layer can be formed as a single layer or a stacked layer of the metal carbide layer mentioned above.

An example of metal boride layers is a titanium boride layer.

Examples of metal silicide layers include a platinum silicide layer, a titanium silicide layer, a molybdenum silicide layer, a nickel silicide layer, a chromium silicide layer, a cobalt silicide layer, a vanadium silicide layer, a tungsten silicide layer, a zirconium silicide layer, a hafnium silicide layer, a niobium silicide layer, a tantalum silicide layer, and the like. Furthermore, a metal silicide layer can be formed as a single layer or a stacked layer of the metal silicide layer mentioned above.

Alternatively, a conductive layer can be formed by stacking a plurality of layers selected from metal layers, metal nitride layers, metal carbide layers, metal boride layers, and metal silicide layers.

Figure 7A:
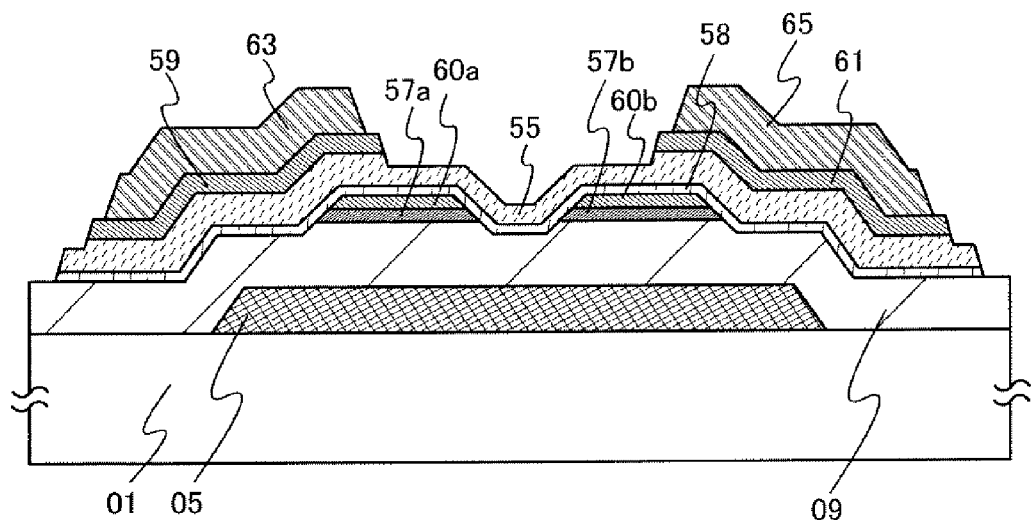
FIGS. 7A and 7B are cross-sectional views illustrating thin film transistors according to an embodiment mode of the present invention.

When the conductive layers is formed with a metal layer, a metal nitride layer, a metal carbide layer, a metal boride layer, or a metal silicide layer, a stacked layer structure may be employed in which semiconductor layers 60*a* and 60*b* to which an impurity element serving as a donor is added are formed over layers 57*a* and 57*b* formed with a metal layer, a metal nitride layer, a metal carbide layer, a metal boride layer, a metal silicide layer, or the like as illustrated in FIG. 7A in order to make ohmic contact between the amorphous semiconductor layer 55 and the conductive layers.

Figure 7B:
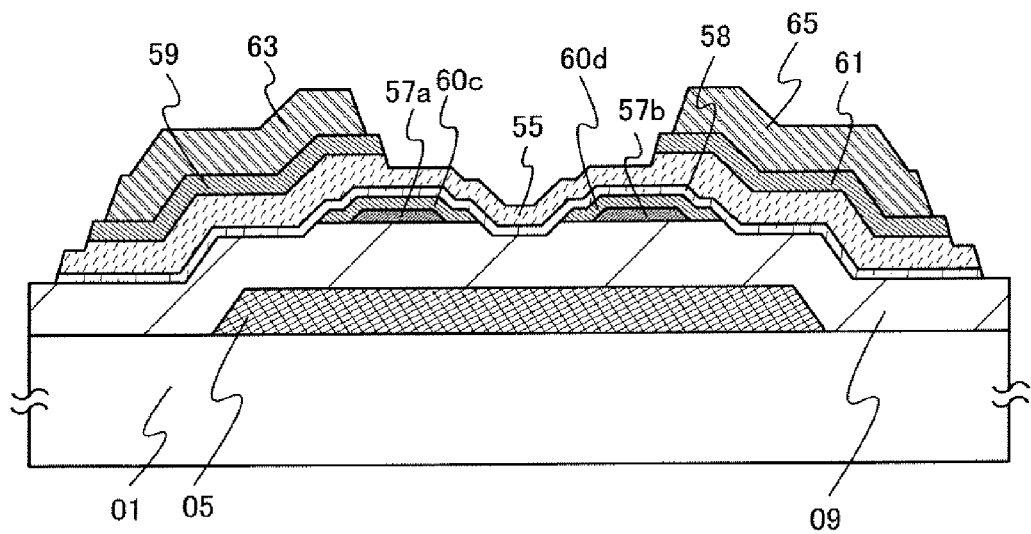

As illustrated in FIG. 7B, semiconductor layers 60*c* and 60*d* to which an impurity element serving as a donor is added may cover upper and side surfaces of the layers 57*a* and 57*b* formed with any of a metal layer, a metal nitride layer, a metal carbide layer, a metal boride layer, a metal silicide layer, and the like.

Furthermore, a stacked layer structure may be employed in which a semiconductor layer to which an impurity element serving as a donor is added is formed over the gate insulating layer 09, and a metal layer, a metal nitride layer, a metal carbide layer, a metal boride layer, or a metal silicide layer is formed thereover.

With such a structure, a Schottky junction at the interface between an amorphous semiconductor layer and any of a metal layer, a metal nitride layer, a metal carbide layer, a metal boride layer, a metal silicide layer, and the like can be prevented, and characteristics of the thin film transistor are improved.

In addition, because a conductive layer has high electric conductivity, on-state current and field-effect mobility of the thin film transistor can be increased.

Note that end portions of the gate insulating layer 09 overlapped by the conductive layers 57*a* and 57*b* can have any of the shapes illustrated in FIGS. 2A to 2F. End portions of the gate insulating layer 09 overlapped by the semiconductor layers 60*c* and 60*d* to which the impurity element serving as a donor is added can also have any of the shapes illustrated in FIGS. 2A to 2F.

Embodiment Mode 6

In this embodiment mode, a thin film transistor having a structure which is different from those in Embodiment Modes 1 to 5 is described with reference to FIG. 8. Specifically, the thin film transistor in this embodiment mode differs from the thin film transistors described in Embodiment Modes 1 to 5, in that unlike the first microcrystalline semiconductor layers 51*a* and 51*b*, a first microcrystalline semiconductor layer is not separated and the pair of impurity semiconductor layers 59 and 61 which function as a source region and a drain region and to which an impurity element imparting one conductivity type is added do not overlap the first microcrystalline semiconductor layer.

Figure 8:
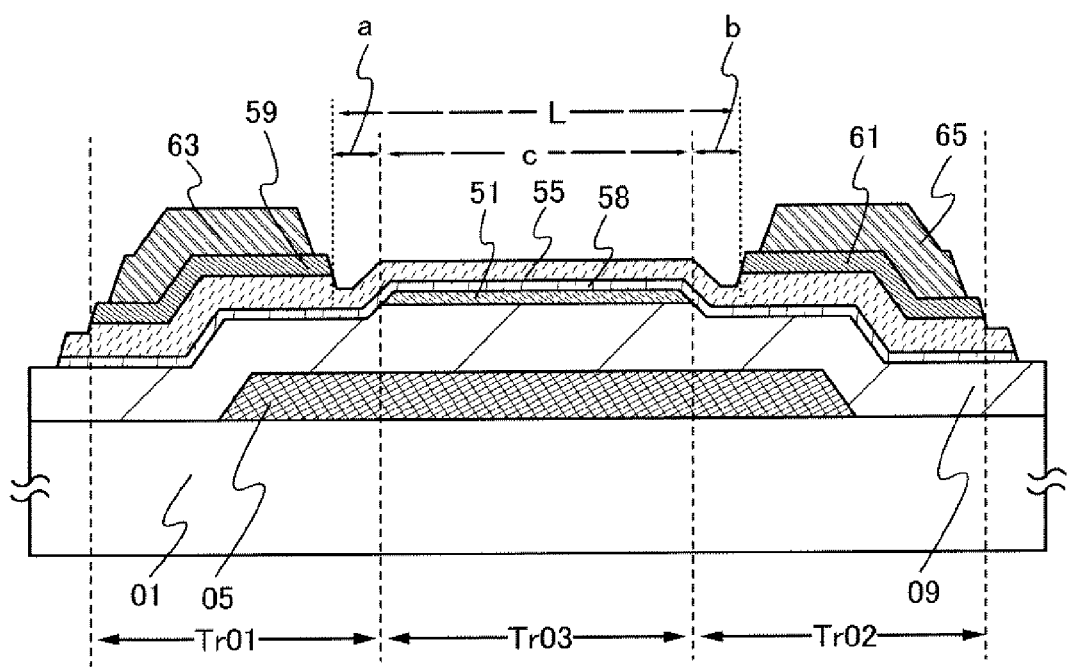
FIG. 8 is a cross-sectional view illustrating a thin film transistor according to an embodiment mode of the present invention.

In the thin film transistor illustrated in FIG. 8, a gate electrode 05 is formed over a substrate 01, a gate insulating layer 09 is formed over the gate electrode 05, a first microcrystalline semiconductor layer 51 is formed over the gate insulating layer 09, and a second microcrystalline semiconductor layer 58 is formed over the first microcrystalline semiconductor layer 51 and the gate insulating layer 09. In addition, an amorphous semiconductor layer 55 is formed to cover the second microcrystalline semiconductor layer 58. Over the amorphous semiconductor layer 55, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed.

In the thin film transistor described in this embodiment mode, a first thin film transistor Tr01 and a second thin film transistor Tr02 are connected to a third thin film transistor Tr03. The first thin film transistor Tr01 includes the gate electrode 05, the gate insulating layer 09, the second microcrystalline semiconductor layer 58, the amorphous semiconductor layer 55, the impurity semiconductor layer 59 to which the impurity element imparting one conductivity type is added, and the wiring 63. The second thin film transistor Tr02 includes the gate electrode 05, the gate insulating layer 09, the second microcrystalline semiconductor layer 58, the amorphous semiconductor layer 55, the impurity semiconductor layer 61 to which the impurity element imparting one conductivity type is added, and the wiring 65. The third thin film transistor Tr03 includes the gate electrode 05, the gate insulating layer 09, the first microcrystalline semiconductor layer 51, the second microcrystalline semiconductor layer 58, and the amorphous semiconductor layer 55.

The first thin film transistor Tr01 and the second thin film transistor Tr02 are thin film transistors in each of which the second microcrystalline semiconductor layer 58 is used for a channel formation region. In the third thin film transistor Tr03, a region where carriers flow is the first microcrystalline semiconductor layer 51. When an impurity element serving as a donor is added to the region, the region has high electric conductivity and has lower resistance than normal amorphous and microcrystalline semiconductor layers. Thus, even in the state where a positive voltage lower than the threshold voltage of the first thin film transistor Tr01 and the second thin film transistor Tr02 is applied to the gate electrode 05, a large number of carriers are induced in the first microcrystalline semiconductor layer 51. When a positive voltage equal to or higher than the threshold voltage of the first thin film transistor Tr01 and the second thin film transistor Tr02 is applied to the gate electrode 05, the first thin film transistor Tr01 and the second thin film transistor Tr02 are turned on, and the large number of carriers induced in the first microcrystalline semiconductor layer 51 flow to the wiring 63 of the first thin film transistor Tr01 or the wiring 65 of the second thin film transistor Tr02. That is, the first thin film transistor Tr01 and the second thin film transistor Tr02 function as switches that allow carriers induced in the first microcrystalline semiconductor layer 51 to flow to the wiring 63 or the wiring 65.

The channel length L of the thin film transistor of this embodiment mode is the sum of the distance a between an end portion of the impurity semiconductor layer 59 to which the impurity element imparting one conductivity type is added and an end portion of the first microcrystalline semiconductor layer 51, the distance b between an end portion of the impurity semiconductor layer 61 to which the impurity element imparting one conductivity type is added and an end portion of the first microcrystalline semiconductor layer 51, and the length c of the first microcrystalline semiconductor layer 51. When the distance a between the end portion of the impurity semiconductor layer 59 to which the impurity element imparting one conductivity type is added and the end portion of the first microcrystalline semiconductor layer 51 and the distance b between the end portion of the impurity semiconductor layer 61 to which the impurity element imparting one conductivity type is added and the end portion of the first microcrystalline semiconductor layer 51 are decreased with respect to the channel length L, the channel lengths of the first thin film transistor Tr01 and the second thin film transistor Tr02 are decreased, the length c of the first microcrystalline semiconductor layer 51 is increased, and the number of carriers induced is increased, whereby on-state current is increased and field-effect mobility is also increased.

The thickness of the gate insulating layer 09 in the first thin film transistor Tr01 and the second thin film transistor Tr02 is smaller than that of the gate insulating layer 09 in the third thin film transistor Tr03. Thus, when voltage is applied to the gate electrode 05, a larger number of carriers are induced at or in the vicinity of the interface between the gate insulating layer 09 and the second microcrystalline semiconductor layer 58 in the first thin film transistor Tr01 and the second thin film transistor Tr02. Accordingly, on-state current and field-effect mobility of the thin film transistor of this embodiment mode can be increased.

Note that the channel length of the first thin film transistor Tr01 (that is, the distance a) and the channel length of the second thin film transistor Tr02 (that is, the distance b) can be made short in accordance with this embodiment mode; thus, the thickness of the gate insulating layer is preferably small so as to prevent short channel effect in the first thin film transistor Tr01 and the second thin film transistor Tr02.

On the other hand, when a negative voltage is applied to the gate electrode 05, carriers flow in the amorphous semiconductor layer 55 of the first to third thin film transistors Tr01 to Tr03. Because the amorphous semiconductor layer 55 has lower electric conductivity and higher resistance than a microcrystalline semiconductor, off-state current is small.

From the above description, the thin film transistor described in this embodiment mode is a thin film transistor with large on-state current, high mobility, and small off-state current.

Note that the positioning of the pair of impurity semiconductor layers 59 and 61 to which the impurity element imparting one conductivity type is added and the first microcrystalline semiconductor layer 51 described in this embodiment mode can be appropriately applied to Embodiment Modes 1 to 5.

Note that an end portion of the gate insulating layer 09 overlapped by the first microcrystalline semiconductor layer 51 can have any of the shapes illustrated in FIGS. 2A to 2F.

Embodiment Mode 7

In this embodiment mode, a thin film transistor having a structure which is different from those in Embodiment Modes 1 to 5 is described with reference to FIG. 9. Specifically, the thin film transistor described in this embodiment mode differs from the thin film transistors described in Embodiment Modes 1 to 5, in that unlike the first microcrystalline semiconductor layers 51$a$ and 51$b$, a first microcrystalline semiconductor layer is not separated, an end portion of one of the pair of the impurity semiconductor layers 59 and 61 which function as a source region and a drain region and to which an impurity element imparting one conductivity type is added overlaps the first microcrystalline semiconductor layer, and an end portion of the other of the pair of the impurity semiconductor layers 59 and 61 which function as a source region and a drain region and to which the impurity element imparting one conductivity type is added does not overlap the first microcrystalline semiconductor layer.

Figure 9:
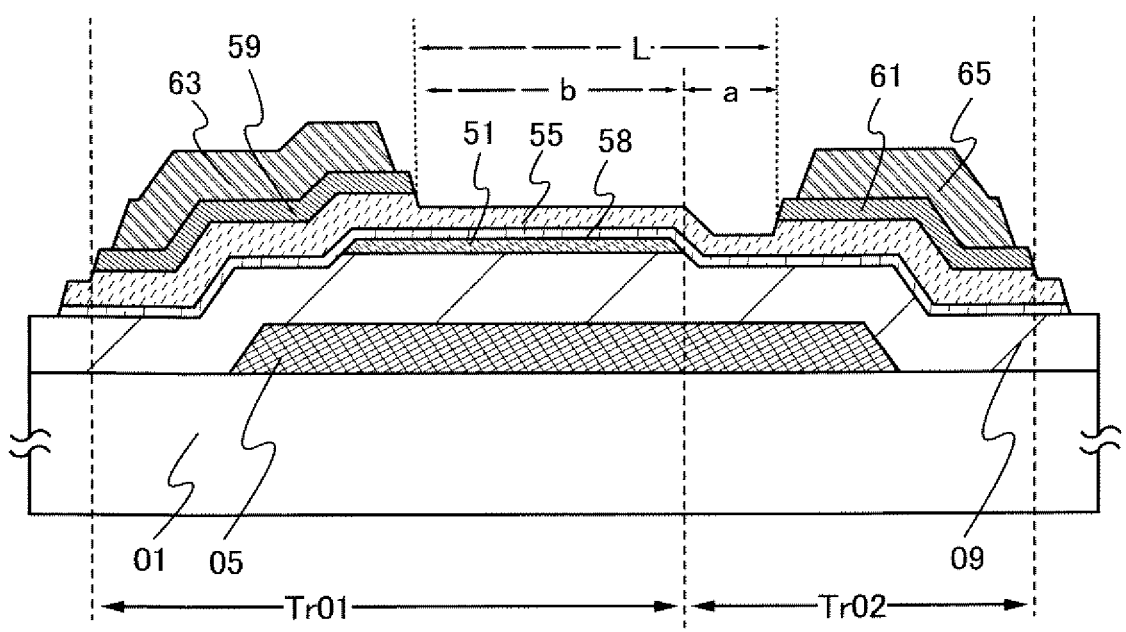
FIG. 9 is a cross-sectional view illustrating a thin film transistor according to an embodiment mode of the present invention.

In the thin film transistor illustrated in FIG. 9, a gate electrode 05 is formed over a substrate 01, a gate insulating layer 09 is formed over the gate electrode 05, a first microcrystalline semiconductor layer 51 is formed over the gate insulating layer 09, and a second microcrystalline semiconductor layer 58 is formed over the first microcrystalline semiconductor layer 51 and the gate insulating layer 09. In addition, an amorphous semiconductor layer 55 is formed to cover the second microcrystalline semiconductor layer 58. Over the amorphous semiconductor layer 55, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed. An end portion of one of the pair of impurity semiconductor layers to which the impurity element imparting one conductivity type is added does not overlap the first microcrystalline semiconductor layer 51. An end portion of the other of the pair of impurity semiconductor layers to which the impurity element imparting one conductivity type is added overlaps the first microcrystalline semiconductor layer 51.

In the thin film transistor described in this embodiment mode, a first thin film transistor Tr01 and a second thin film transistor Tr02 are connected to each other. The first thin film transistor Tr01 includes the gate electrode 05, the gate insulating layer 09, the first microcrystalline semiconductor layer 51, the second microcrystalline semiconductor layer 58, the amorphous semiconductor layer 55, the impurity semiconductor layer 59 to which the impurity element imparting one conductivity type is added, and the wiring 63. The second thin film transistor Tr02 includes the gate electrode 05, the gate insulating layer 09, the second microcrystalline semiconductor layer 58, the amorphous semiconductor layer 55, the impurity semiconductor layer 61 to which the impurity element imparting one conductivity type is added, and the wiring 65.

The second thin film transistor Tr02 is a thin film transistor in which the second microcrystalline semiconductor layer 58 is used for a channel formation region. In the first thin film transistor Tr01, a region where carriers flow is the first microcrystalline semiconductor layer 51. When an impurity element serving as a donor is added to the region, the region has high electric conductivity and has lower resistance than normal amorphous and microcrystalline semiconductor layers. Thus, even in the state where a positive voltage lower than the threshold voltage of the second thin film transistor Tr02 is applied to the gate electrode 05, a large number of carriers are induced in the first microcrystalline semiconductor layer 51. When a positive voltage equal to or higher than the threshold voltage of the second thin film transistor Tr02 is applied to the gate electrode 05, the second thin film transistor Tr02 is turned on, and the large number of carriers induced in the first microcrystalline semiconductor layer 51 flow to the wiring 63 of the first thin film transistor Tr01 or the wiring 65 of the second thin film transistor Tr02. The channel length L of the thin film transistor of this embodiment mode is the sum of the distance a between an end portion of the impurity semiconductor layer 61 to which the impurity element imparting one conductivity type is added and an end portion of the first microcrystalline semiconductor layer 51 and the distance b between an end portion of the impurity semiconductor layer 59 to which the impurity element imparting one conductivity type is added and an end portion of the first microcrystalline semiconductor layer 51. When the distance a between the end portion of the impurity semiconductor layer 61 to which the impurity element imparting one conductivity type is added and the end portion of the first microcrystalline semiconductor layer 51 is decreased with respect to the channel length L, the channel length of the second thin film transistor Tr02 is decreased, the distance b between the end portion of the impurity semiconductor layer 59 to which the impurity element imparting one conductivity type is added and the end portion of the first microcrystalline semiconductor layer 51 is increased, and the number of carriers induced is increased, whereby on-state current is increased and mobility is also increased.

The thickness of the gate insulating layer 09 in the second thin film transistor Tr02 is smaller than that of the gate insulating layer 09 in the first thin film transistor Tr01 Thus, when voltage is applied to the gate electrode 05, a larger number of carriers are induced at or in the vicinity of the interface between the gate insulating layer 09 and the second microcrystalline semiconductor layer 58 in the second thin film transistor Tr02. Accordingly, on-state current and field-effect mobility of the thin film transistor of this embodiment mode can be increased.

Note that the channel length of the second thin film transistor Tr02 (that is, the distance a) can be made short in accordance with this embodiment mode; thus, the thickness of the gate insulating layer is preferably small so as to prevent short channel effect in the second thin film transistor Tr02.

On the other hand, when a negative voltage is applied to the gate electrode 05, carriers flow in the amorphous semiconductor layer 55 of the first thin film transistor Tr01 and the second thin film transistor Tr02. Because the amorphous semiconductor layer 55 has low electric conductivity and high resistance, off-state current is small.

From the above description, the thin film transistor described in this embodiment mode is a thin film transistor with large on-state current high mobility, and small off-state current.

Note that the positioning of the pair of impurity semiconductor layers 59 and 61 to which the impurity element imparting one conductivity type is added and the first microcrystalline semiconductor layer 51 described in this embodiment mode can be appropriately applied to Embodiment Modes 1 to 5.

Note that an end portion of the gate insulating layer 09 overlapped by the first microcrystalline semiconductor layer 51 can have any of the shapes illustrated in FIGS. 2A to 2F.

Embodiment Mode 8

Channel-etch inverted-staggered thin film transistors are described in Embodiment Modes 1 to 7, whereas channel-protective inverted-staggered thin film transistors can be formed in Embodiment Modes 1 to 7.

Figure 24:
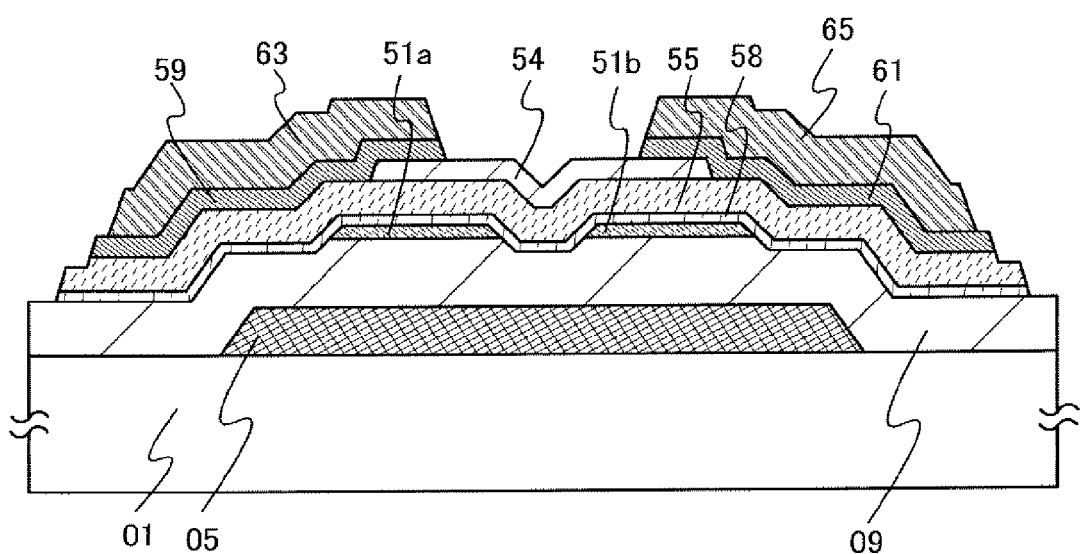
FIG. 24 is a cross-sectional view illustrating a thin film transistor according to an embodiment mode of the present invention.

A thin film transistor illustrated in FIG. 24 is a channel-protective thin film transistor. A gate electrode 05 is formed over a substrate 01, a gate insulating layer 09 is formed over the gate electrode 05, first microcrystalline semiconductor layers 51a and 51b are formed over the gate insulating layer 09, and a second microcrystalline semiconductor layer 58 is formed over the first microcrystalline semiconductor layers 51a and 51b and the gate insulating layer 09. In addition, an amorphous semiconductor layer 55 is formed to cover the second microcrystalline semiconductor layer 58. Over the amorphous semiconductor layer 55, a channel-protective layer 54 is formed. Over the amorphous semiconductor layer 55 and the channel-protective layer 54, a pair of impurity semiconductor layers 59 and 61 to which an impurity element imparting one conductivity type is added to form a source region and a drain region are formed. Over the impurity semiconductor layers 59 and 61 to which the impurity element imparting one conductivity type is added, wirings 63 and 65 are formed.

The thin film transistor described in this embodiment mode is a thin film transistor with large on-state current, high mobility, and small off-state current.

Note that end portions of the gate insulating layer 09 overlapped by the first microcrystalline semiconductor layers 51a and 51b can have any of the shapes illustrated in FIGS. 2A to 2F.

Embodiment Mode 9

Figure 4:
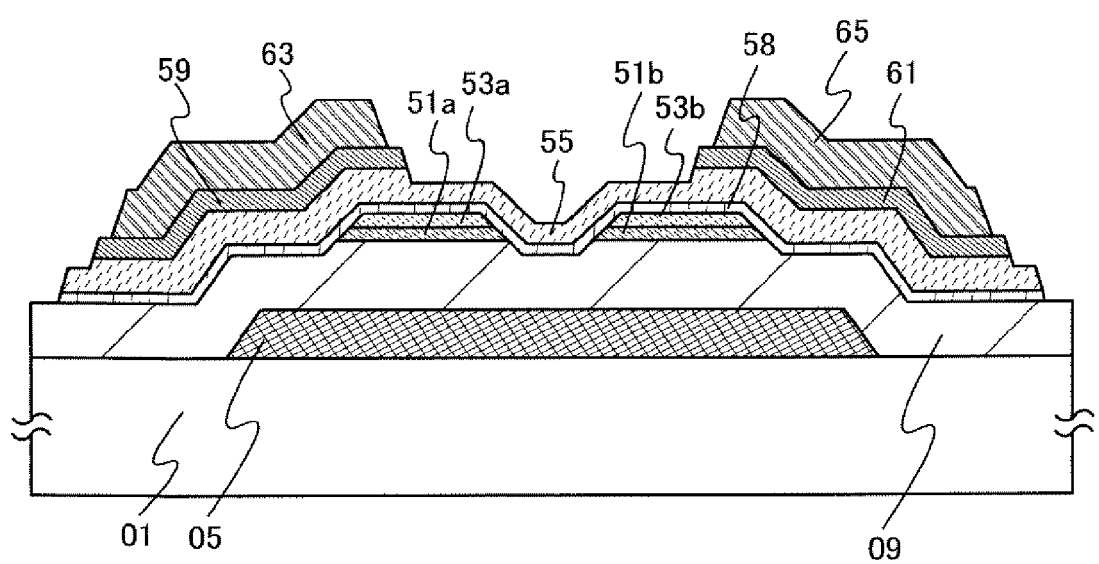
FIG. 4 is a cross-sectional view illustrating a thin film transistor according to an embodiment mode of the present invention.

In this embodiment mode, a manufacturing process of a thin film transistor which is capable of high-speed operation and achieves large on-state current and small off-state current, such as that illustrated in FIG. 4, is described.

A thin film transistor having an amorphous semiconductor layer or a microcrystalline semiconductor layer, which is of an n-type, is more suitable for use in a driver circuit than that of a p-type because it has higher field-effect mobility. It is desired that all thin film transistors formed over the same substrate have the same polarity, in order to reduce the number of steps. Here, description is made using an n-channel thin film transistor.

A manufacturing process of the thin film transistor illustrated in FIG. 4 is described with reference to FIGS. 10A to 10F, FIGS. 11A to 11C, FIG. 12, and FIGS. 13A to 13D. Note that in each of FIGS. 10A to 10E and FIGS. 11A to 11C, the left side is a cross-sectional view taken along a line A-B of FIG. 12, which illustrates a cross section of a region where a thin film transistor is formed, and the right side is a cross-sectional view taken along a line C-D of FIG. 12, which illustrates a cross section of a region where a gate wiring and a source wiring intersect in a pixel.

Figure 10A:
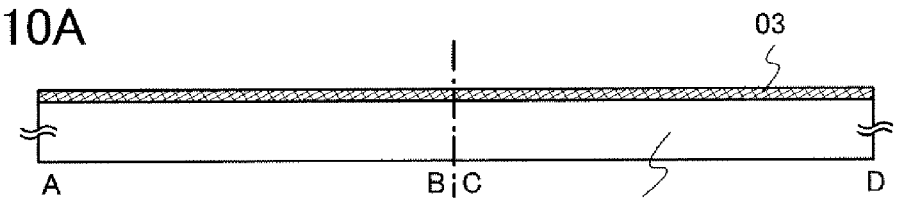
FIGS. 10A to 10E are cross-sectional views illustrating a manufacturing process of a thin film transistor according to an embodiment mode of the present invention.

As illustrated in FIG. 10A, a conductive layer 03 is formed over a substrate 01. The conductive layer 03 can be formed using any of the materials listed in Embodiment Mode 1 for the gate electrode 05. The conductive layer 03 is formed by a sputtering method a CVD method, a plating method, a printing method, a droplet discharge method, or the like.

Figure 10B:
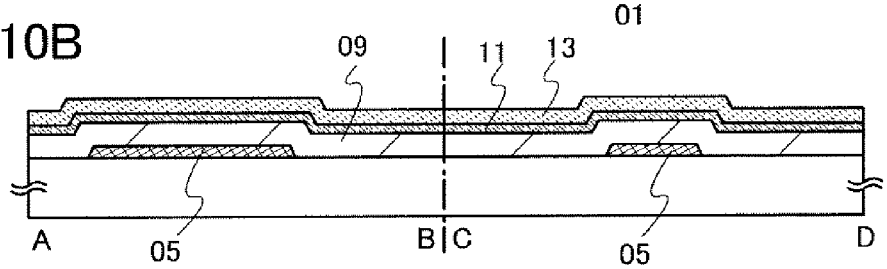

Next, with the use of a resist mask which is formed by a photolithography process using a first photomask, the conductive layer 03 is etched into a desired shape, whereby a gate wiring 05 is formed as illustrated in FIG. 10B. Then, the resist mask is removed.

A gate insulating layer 09 is formed over the gate wiring 05 and the substrate 01. The gate insulating layer 09 can be formed using any of the materials listed in Embodiment Mode 1 for the gate insulating layer 09. The gate insulating layer 09 is formed by a CVD method, a sputtering method, or the like.

A first microcrystalline semiconductor layer 11 and a buffer layer 13 are stacked over the gate insulating layer 09. As the first microcrystalline semiconductor layer 11, a microcrystalline semiconductor layer or an amorphous semiconductor layer is formed by glow discharge plasma with a mixture of a deposition gas including silicon or germanium with hydrogen in a reaction chamber of a plasma CVD apparatus. A microcrystalline semiconductor layer is formed with the deposition gas including silicon or germanium diluted at the flow rate ratio of the deposition gas including silicon or geranium to hydrogen of 1:10 to 1:2000, preferably 1:50 to 1:200.

Typical examples of the deposition gas including silicon or geranium are $SiH_4$, $Si_2H_6$, $GeH_4$, $Ge_2H_6$, and the like.

A deposition method in the case where a microcrystalline semiconductor layer to which an impurity element serving as a donor is added is formed as the first microcrystalline semiconductor layer 11 is hereinafter described.

A microcrystalline semiconductor layer or an amorphous semiconductor layer is formed by glow discharge plasma with a mixture of a deposition gas including silicon or germanium with hydrogen in a reaction chamber of a plasma CVD apparatus. By dilution at the flow rate ratio of the deposition gas including silicon or germanium to hydrogen of 1:10 to 1:2000, preferably 1:50 to 1:200 and by mixture of a gas including phosphorus, arsenic, antimony, or the like, a microcrystalline semiconductor layer to which an impurity element serving as a donor is added can be formed. Here, by glow discharge plasma with a mixture of silane with phosphine as well as hydrogen and/or a noble gas, a microcrystalline silicon layer including phosphorus can be formed. In this step, the substrate is heated at 100° C. to 300° C., preferably 120° C. to 220° C.

Note that, instead of forming a microcrystalline semiconductor layer to which an impurity element serving as a donor is added, an insulating layer to which an impurity element serving as a donor is added may be formed as the gate insulating layer 09 and a microcrystalline semiconductor layer which does not include an impurity element serving as a donor may be formed thereover. For example, a silicon oxide layer, a silicon nitride layer, a silicon oxynitride layer, or a silicon nitride oxide layer which includes an impurity element serving as a donor (phosphorus, arsenic, or antimony), or the like can be formed as the gate insulating layer. In the case where the gate insulating layer 09 has a stacked layer structure, an impurity element serving as a donor may be added to a layer in contact with a microcrystalline semiconductor layer or a layer in contact with the substrate 01.

As the gate insulating layer 09, an insulating layer to which an impurity element serving as a donor is added may be formed using a source gas for the insulating layer and a gas including the impurity element serving as a donor. For example, a silicon nitride layer including phosphorus can be formed by a plasma CVD method using silane, ammonia, and phosphine. Alternatively, a silicon oxynitride layer including phosphorus can be formed by a plasma CVD method using silane, dinitrogen monoxide, ammonia, and phosphine.

Before the gate insulating layer 09 is formed, a gas including an impurity element serving as a donor may be supplied into a reaction chamber of a deposition apparatus to make a surface of the substrate 01 and the inner wall of the reaction chamber adsorb the impurity element serving as a donor. When the gate insulating layer 09 is formed after that, the gate insulating layer is deposited while taking in the impurity element serving as a donor; thus, an insulating layer to which the impurity element serving as a donor is added can be formed.

Furthermore, before a microcrystalline semiconductor layer to which an impurity element serving as a donor is added is formed, a gas including the impurity element serving as a donor may be supplied into the reaction chamber of the deposition apparatus to make the gate insulating layer 09 and the inner wall of the reaction chamber adsorb the impurity element serving as a donor When the microcrystalline semiconductor layer to which the impurity element serving as a donor is added is deposited after that, the microcrystalline semiconductor layer is deposited while taking in the impurity element serving as a donor; thus, the microcrystalline semiconductor layer to which the impurity element serving as a donor is added can be formed.

In the case where a conductive layer is formed instead of the first microcrystalline semiconductor layer 11, when a metal layer, a metal nitride layer, a metal carbide layer, a metal boride layer, or a metal silicide layer is formed as the conductive layer, the conductive layer is formed by a sputtering method, an evaporation method, a CVD method, a droplet discharge method, a printing method, or the like.

Note that, in the case where the gate insulating layer 09 is a silicon oxide layer or a silicon oxynitride layer, a surface of the gate insulating layer 09 may be subjected to plasma treatment before the first microcrystalline semiconductor layer 11 is formed. Typically, a surface of the gate insulating layer 09 is exposed to plasma such as hydrogen plasma, ammonia plasma, $H_2O$ plasma, helium plasma, argon plasma, or neon plasma. As a result, defects on the surface of the gate insulating layer can be reduced. Typically, dangling bonds on the surface of the gate insulating layer 09 can be terminated. When a conductive layer or an amorphous semiconductor layer is formed after that, defects at the interface of the conductive layer or the amorphous semiconductor layer can be reduced. As a result, capture of carriers due to defects can be reduced, and on-state current can be increased.

Next, the buffer layer 13 is formed. In the case where a semiconductor layer is formed as the buffer layer 13, an amorphous semiconductor layer can be formed by a plasma CVD method using a deposition gas including silicon or germanium. Alternatively, an amorphous semiconductor layer can be formed using a deposition gas including silicon or germanium which is diluted with one or plural kinds of noble gases selected from helium, argon, krypton, and neon. Alternatively, an amorphous semiconductor layer including hydrogen can be formed using hydrogen at a flow rate which is 1 to 10 times, preferably, 1 to 5 times as high as that of a silane gas. In addition, a halogen such as fluorine or chlorine may be added to the above hydrogenated semiconductor layer.

Alternatively, as the buffer layer 13, an amorphous semiconductor layer can be formed by sputtering of a semiconductor target of silicon, germanium, or the like with hydrogen or a noble gas.

In the case where an insulating layer is formed as the buffer layer 13, it can be formed in a manner similar to the gate insulating layer 09. Alternatively, an insulating layer can be formed by applying and then baking polyimide, an acrylic resin, an epoxy resin, or another material for an organic insulating layer.

In the case where the buffer layer 13 is formed by a plasma CVD method, the buffer layer 13 is preferably formed at a deposition temperature of 300° C. to 400° C. By this deposition process, hydrogen is supplied to the first microcrystalline semiconductor layer 11, and the same effect as that of hydrogenating the first microcrystalline semiconductor layer 11 can be obtained. That is, by deposition of the buffer layer 13 over the first microcrystalline semiconductor layer 11, hydrogen is diffused into the first microcrystalline semiconductor layer 11, whereby dangling bonds can be terminated.

When an amorphous semiconductor layer or an amorphous semiconductor layer including hydrogen, nitrogen, or a halogen is formed as the buffer layer 13 over the surface of the first microcrystalline semiconductor layer 11, natural oxidation of surfaces of crystal grains included in the first microcrystalline semiconductor layer 11 can be prevented. In particular, in a region where microcrystal grains are in contact with an amorphous semiconductor, a crack is likely to be caused due to local stress. If this crack is exposed to oxygen, crystal grains are oxidized and silicon oxide is formed. However, when an amorphous semiconductor layer is formed over the surface of the first microcrystalline semiconductor layer 11, oxidation of microcrystal grains can be prevented When a thick buffer layer is formed in a display device where a high voltage (for example, about 15 V) is applied to a thin film transistor, typically, in a liquid crystal display device, drain withstand voltage can be increased and the thin film transistor can be prevented from deteriorating even when a high voltage is applied to the thin film transistor.

Next, with the use of a resist mask which is formed by a photolithography process using a second photomask, the buffer layer 13 and the first microcrystalline semiconductor layer 11 are etched into a desired shape, whereby first microcrystalline semiconductor layers 51a and 51b and buffer layers 19a and 19b are formed in a region where a thin film transistor is to be formed, as illustrated 10C. In addition, a first microcrystalline semiconductor layer 17 and a buffer layer 21 are formed in a region where the gate wiring and a source wiring intersect. After that, the resist mask is removed.

Here, etching is preferably performed under such conditions that a resistive layer is not formed on surfaces of the first microcrystalline semiconductor layers 51a, 51b, and 17 and the butter layers 19a, 19b, and 21.

Figure 10C:
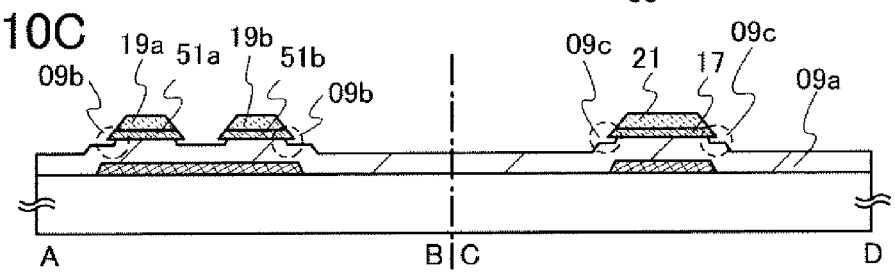

For example, wet etching is employed for the etching described above, thereby forming the first microcrystalline semiconductor layers 51a, 51b, and 17 and the buffer layers 19a, 19b, and 21 as illustrated in FIG. 10C. In that case, when the first microcrystalline semiconductor layer 11 and the buffer layer 13 are etched using an etchant capable of etching a resistive layer which is formed of oxide, nitride, or an organic substance, a resistive layer which inhibits carrier transfer is not formed on the surfaces of the first microcrystalline semiconductor layers 51a, 51b, and 17 and the buffer layers 19a, 19b, and 21, and on-state current of a thin film transistor to be formed later can be increased.

In the case where a resistive layer is formed of oxide, nitride, or an organic substance on the surfaces of the first microcrystalline semiconductor layers 51a, 51b, and 17 and the buffer layers 19a, 19b, and 21 by etching of the first microcrystalline semiconductor layer 11 and the buffer layer 13, the resistive layer formed of oxide, nitride, or an organic substance on the surfaces of the first microcrystalline semiconductor layers 51a, 51b, and 17 and the buffer layers 19a, 19b, and 21 may be removed by etching. As a result, a resistive layer which inhibits carrier transfer is not formed on the surfaces of the first microcrystalline semiconductor layers 51a, 51b, and 17 and the buffer layers 19a, 19b, and 21, and on-state current of a thin film transistor to be formed later can be increased.

Note that the gate insulating layer is also etched partly in the above etching step. For example, when the gate insulating layer 09 is formed with a silicon oxide layer or a silicon oxynitride layer and, for example, a hydrofluoric acid is used as an etchant, regions of the gate insulating layer not covered with the first microcrystalline semiconductor layers 51a, 51b, and 17 are also etched. Thus, a gate insulating layer 09a is formed which is thinner in the region not covered with the first microcrystalline semiconductor layers 51a, 51b, and 17 than in regions covered with the first microcrystalline semiconductor layers 51a, 51b, and 17 by 1 nm to 100 nm, preferably 10 nm to 30 nm as illustrated in regions 09b and 09c of FIG. 10C. The gate insulating layer 09a has steps in the regions 09b and 09c which are in contact with end portions of the regions covered with the first microcrystalline semiconductor layers 51a, 51b, and 17.

By partial etching of the gate insulating layer, an etching residue of the first microcrystalline semiconductor layer 11 between the first microcrystalline semiconductor layers 51a and 51b can be eliminated. Thus, leakage current between the first microcrystalline semiconductor layers 51a and 51b can be reduced. In addition, variation in current-voltage characteristics between different thin film transistors can be reduced.

In this manner, when the gate insulating layer 09 has projecting regions in contact with the first microcrystalline semiconductor layers 51a and 51b and a depressed region in contact with a second microcrystalline semiconductor layer to be formed later, the thickness of the gate insulating layer in a thin film transistor in which the second microcrystalline semiconductor layer is used for a channel formation region is decreased. Thus, on-state current of the thin film transistor can be increased and field-effect mobility can also be increased.

Figure 10D:
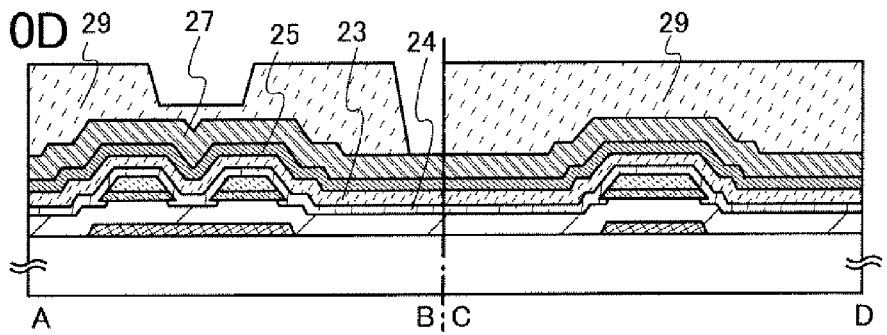

Next, as illustrated in FIG. 10D, a second microcrystalline semiconductor layer 24, an amorphous semiconductor layer 23, an impurity semiconductor layer 25 to which an impurity element imparting one conductivity type is added, and a wiring 27 are formed.

The second microcrystalline semiconductor layer 24 is formed in a manner similar to the first microcrystalline semiconductor layer 11. Note that, in the case where an impurity element serving as a donor is added to the second microcrystalline semiconductor layer 24, the impurity element serving as a donor is added at a lower concentration than to the first microcrystalline semiconductor layer 11.

The amorphous semiconductor layer 23 can be formed in a manner similar to the case where a semiconductor layer is formed as the buffer layer 13.

Note that, in forming the amorphous semiconductor layer 23, when the inner wall of a deposition chamber of a plasma CVD apparatus is pre-coated with a silicon nitride oxide layer, a silicon nitride layer, a silicon oxide layer, or a silicon oxynitride layer and then a semiconductor layer is formed using a deposition gas including silicon or germanium which is diluted with hydrogen at a flow rate ratio of the deposition gas including silicon or germanium to hydrogen of 1:10 to 1:2000, preferably 1:50 to 1:200, the semiconductor layer is deposited while taking in oxygen, nitrogen, or the like of the inner wall of the deposition chamber. Thus, a dense amorphous semiconductor layer can be formed without being crystallized. Note that the semiconductor layer may include microcrystal. In the case where the gate insulating layer 09 is a silicon nitride layer, when the amorphous semiconductor layer 23 is formed by that deposition method, film peeling does not occur and yield can be increased.

Here, an n-channel thin film transistor is formed; thus, the impurity semiconductor layer 25 to which the impurity element imparting one conductivity type is added is formed by a plasma CVD method using phosphine and a deposition gas including silicon or germanium. In the case where a p-channel thin film transistor is formed, the impurity semiconductor layer 25 to which the impurity element imparting one conductivity type is added is formed by a plasma CVD method using diborane and a deposition gas including silicon or germanium.

In the formation process of the first microcrystalline semiconductor layer 11, the buffer layer 13, the second microcrystalline semiconductor layer 24, the amorphous semiconductor layer 23, and the impurity semiconductor layer 25 to which the impurity element imparting one conductivity type is added, glow discharge plasma is generated by application of a high-frequency power of 1 MHz to 20 MHz, typically 13.56 MHz or a high-frequency power higher than 20 MHz and equal to or lower than about 120 MHz, typically 27.12 MHz or 60 MHz.

The conductive layer 27 can be formed using any of the materials listed in Embodiment Mode 1 for the wirings 63 and 65. The conductive layer 27 is formed by a CVD method, a sputtering method, a printing method, a droplet discharge method, or the like.

Next, a resist is applied over the conductive layer 27. As the resist, a positive type resist or a negative type resist can be used. Here, a positive type resist is used.

Next, the resist is irradiated with light using a multi-tone mask as a third photomask and is then developed, thereby forming a resist mask 29.

Here, exposure to light using a multi-tone mask is described with reference to FIGS. 13A to 13D.

A multi-tone mask refers to a mask with which three levels of light exposure into an exposed portion, a half-exposed portion, and an unexposed portion can be achieved and a resist mask having regions of a plurality of thicknesses (typically, two kinds of thicknesses) can be formed by a single light exposure and development process. Therefore, with the use of a multi-tone mask, the number of photomasks can be reduced.

Figure 13A:
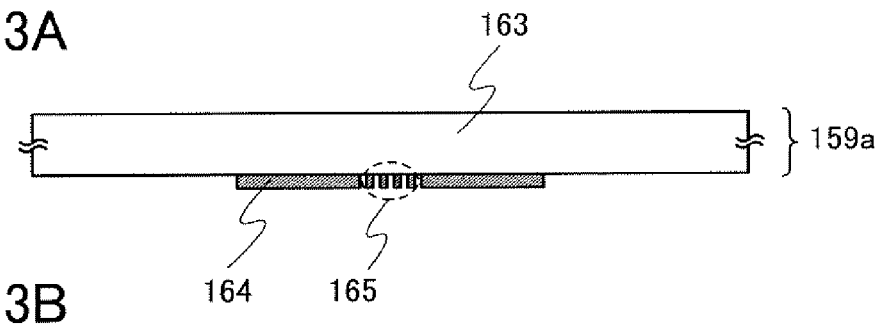
FIGS. 13A to 13D are diagrams illustrating multi-tone masks applicable to the present invention.
Figure 13B:
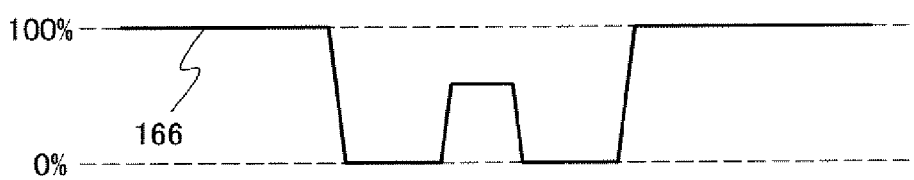
Figure 13C:
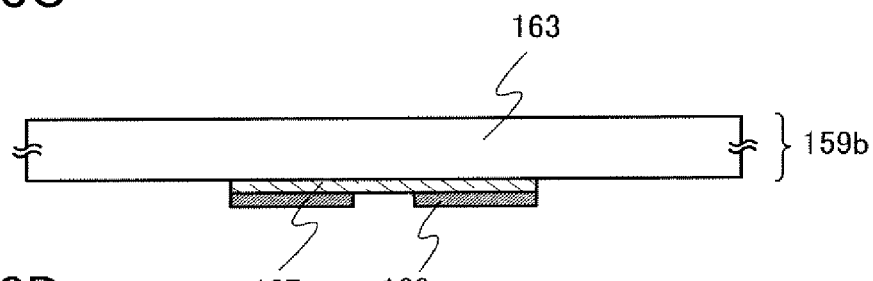

Typical examples of multi-tone masks include a gray-tone mask 159*a* as illustrated in FIG. 13A and a half-tone mask 159*b* as illustrated in FIG. 13C.

As illustrated in FIG. 13A, the gray-tone mask 159*a* includes a light-transmitting substrate 163 and a light-blocking portion 164 and a diffraction grating 165 which are provided on the light-transmitting substrate 163. The light transmittance of the light-blocking portion 164 is 0%. On the other hand, the diffraction grating 165 has a light-transmitting portion in a slit form, a dot form, a mesh form, or the like with intervals which are less than or equal to the resolution limit of light used for the light exposure; thus, the light transmittance can be controlled. Note that either periodic or non-periodic slits, dots, or mesh can be used for the diffraction grating 165.

For the light-transmitting substrate 163, a light-transmitting substrate such as a quartz substrate can be used. The light-blocking portion 164 and the diffraction grating 165 can be formed using a light-blocking material which absorbs light, such as chromium or chromium oxide.

When the gray-tone mask 159*a* is irradiated with light for exposure, a light transmittance 166 of the light-blocking portion 164 is 0% and that of a region where neither the light-blocking portion 164 nor the diffraction grating 165 is provided is 100%, as illustrated in FIG. 13B. A light transmittance of the diffraction grating 165 can be controlled in the range of from 10% to 70%. The light transmittance of the diffraction grating 165 can be controlled by controlling the interval and pitch of the slits, dots, or meshes of the diffraction grating.

As illustrated in FIG. 13C, the half-tone mask 159*b* includes a light-transmitting substrate 163 and a semi-light-transmitting portion 167 and a light-blocking portion 168 which are provided over the light-transmitting substrate 163. The semi-light-transmitting portion 167 can be formed using MoSiN, MoSi, MoSiO, MoSiON, CrSi, or the like. The light-blocking portion 168 can be formed using a light-blocking material which absorbs light, such as chromium or chromium oxide.

Figure 13D:
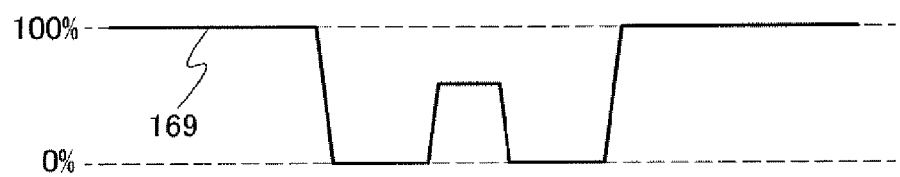

When the half-tone mask 159*b* is irradiated with light for exposure, a light transmittance 169 of the light-blocking portion 168 is 0% and the light transmittance 169 of a region where neither the light-blocking portion 168 nor the semi-light-transmitting portion 167 is provided is 100%, as illustrated in FIG. 13D. A light transmittance of the semi-light-transmitting portion 167 can be controlled in the range of from 10% to 70%. The light transmittance of the semi-light-transmitting portion 167 can be controlled with the material of the semi-light-transmitting portion 167.

After light exposure with the use of the multi-tone mask, development is performed. Accordingly, the resist mask 29 having regions with different film thicknesses can be formed as illustrated in FIG. 10D.

Figure 10E:
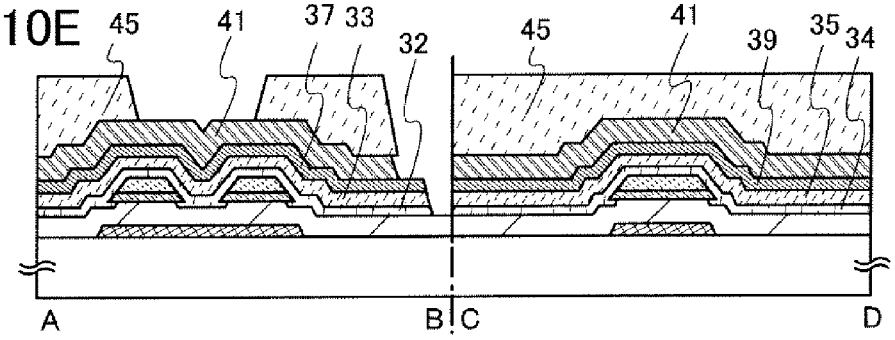

Next, with the resist mask 29, the second microcrystalline semiconductor layer 24, the amorphous semiconductor layer 23, the impurity semiconductor layer 25 to which the impurity element imparting one conductivity type is added, and the conductive layer 27 are divided by etching. As a result, second microcrystalline semiconductor layers 32 and 34, amorphous semiconductor layers 33 and 35, impurity semiconductor layers 37 and 39 to which the impurity element imparting one conductivity type is added, and a conductive layer 41 can be formed as illustrated in FIG. 10E.

Next, the resist mask 29 is subjected to ashing. As a result, the area and thickness of the resist mask are reduced. At this time, a region of the resist mask with a smaller thickness (a region overlapping part of the gate wiring 05) is removed, thereby forming resist masks 45 which are separated from each other, as illustrated in FIG. 10E.

Figure 11A:
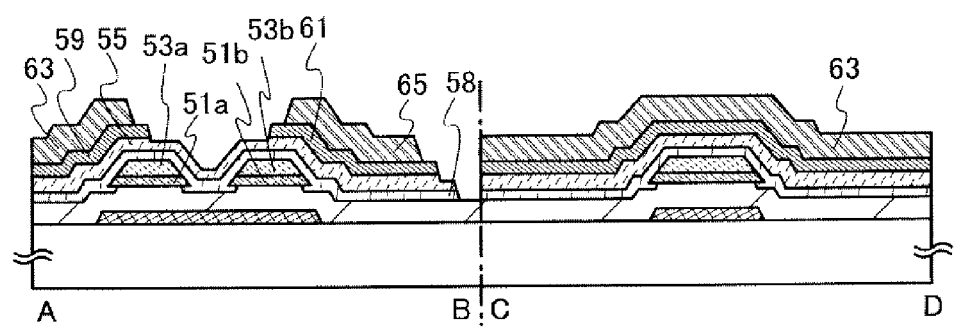
FIGS. 11A to 11C are cross-sectional views illustrating a manufacturing process of a thin film transistor according to an embodiment mode of the present invention.
Figure 12:
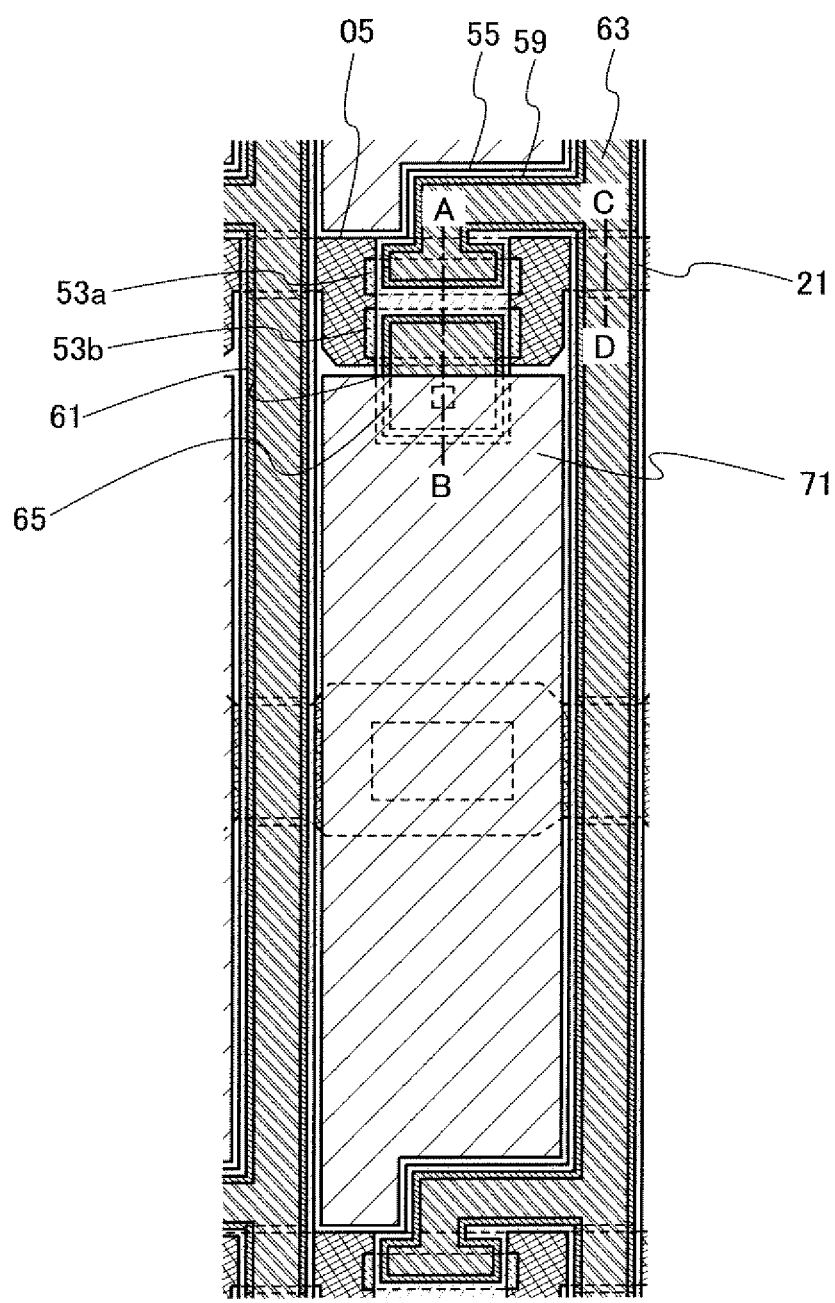
FIG. 12 is a top view illustrating a manufacturing process of a thin film transistor according to an embodiment mode of the present invention.

Next, the conductive layer 41 is divided by etching using the resist masks 45. As a result, a source wiring 63 and a drain electrode 65 can be formed as illustrated in FIG. 11A. When the conductive layer 41 is wet-etched using the resist masks 45, the conductive layer 41 is etched isotropically. As a result, the source wiring 63 and the drain electrode 65 can be formed with a smaller area than that of the resist masks 45.

In a portion where the gate wiring 05 and the source wiring 63 intersect, the first microcrystalline semiconductor layer 17, the buffer layer 21, the second microcrystalline semiconductor layer 34, and the amorphous semiconductor layer 35 as well as the gate insulating layer 09 are formed, and the distance between the gate wiring 05 and the impurity semiconductor layer 39 to which the impurity element imparting one conductivity type is added is increased. Thus, parasitic capacitance can be reduced in the region where the gate wiring 05 and the source wiring 63 intersect.

Next, with the use of the resist masks 45, the impurity semiconductor layer 37 to which the impurity element imparting one conductivity type is added is etched, thereby forming a pair of impurity semiconductor layers 59 and 61 to which the impurity element imparting one conductivity type is added Note that, in this etching step, the amorphous semiconductor layer 33 is also partly etched into an amorphous semiconductor layer 55.

Here, end portions of the source wiring 63 and the drain electrode 65 are not aligned with end portions of the pair of impurity semiconductor layers 59 and 61 to which the impurity element imparting one conductivity type is added, and the end portions of the pair of impurity semiconductor layers 59 and 61 to which the impurity element imparting one conductivity type is added are formed outside the end portions of the source wiring 63 and the drain electrode 65. After that, the resist masks 45 are removed.

Next, an exposed portion of the amorphous semiconductor layer 55 may be irradiated with $H_2O$ plasma. Typically, exposed portions of the amorphous semiconductor layer 55, the pair of impurity semiconductor layers 59 and 61 to which the impurity element imparting one conductivity type is added, the source wiring 63, and the drain electrode 65 are irradiated with radicals which are produced by plasma discharge of vaporized water. Alternatively, an exposed surface of the amorphous semiconductor layer 55 may be irradiated with chlorine plasma to remove a remaining impurity on the surface of the amorphous semiconductor layer 55. Accordingly, high-speed operation of a thin film transistor can be achieved and on-state current can be further increased. In addition, off-state current can be decreased.

By the above-described steps, a thin film transistor can be formed.

Figure 11B:
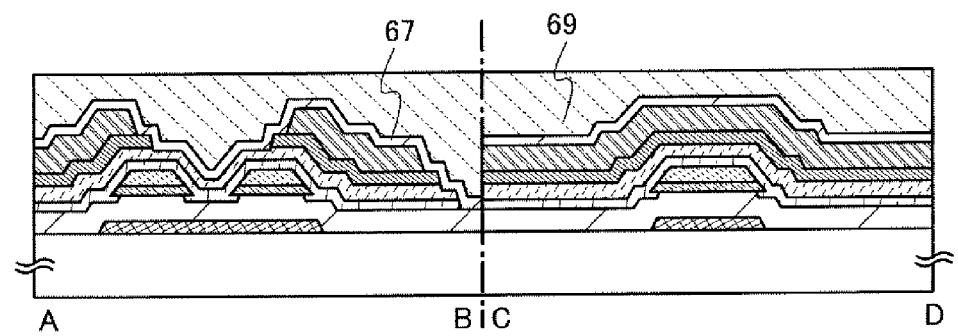

Next, as illustrated in FIG. 11B, a protective insulating layer 67 is formed over the source wiring 63, the drain electrode 65, and the gate insulating layer 09. The protective insulating layer 67 can be formed using a silicon nitride layer, a silicon nitride oxide layer, a silicon oxide layer, or a silicon oxynitride layer. Note that the protective insulating layer 67 is provided to prevent entry of contaminant impurities such as an organic substance, a metal substance, and water vapor floating in the atmosphere and is preferably a dense film.

Figure 11C:
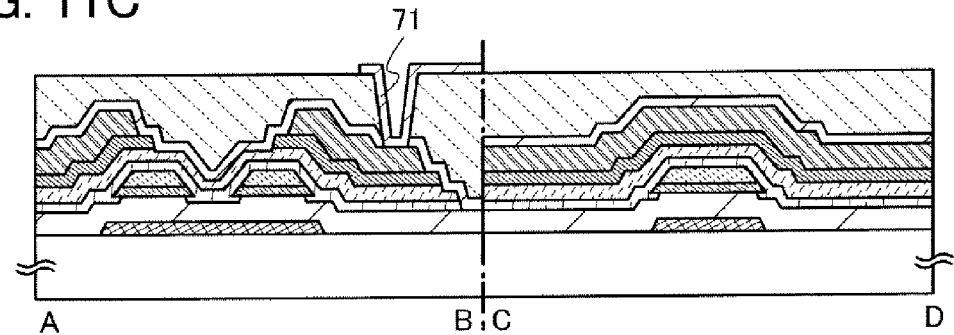

Next, a planarizing layer 69 may be formed over the protective insulating layer 67. The planarizing layer 69 can be formed using an organic insulating layer of an acrylic resin, polyimide, an epoxy resin, a siloxane polymer, or the like. Here, the planarizing layer 69 is formed using a photosensitive organic resin. Next, the planarizing layer 69 is exposed to light using a fourth photomask and is then developed, thereby exposing the protective insulating layer 67 as illustrated in FIG. 11C. Then, the protective insulating layer 67 is etched using the planarizing layer 69, thereby forming a contact hole to expose part of the drain electrode 65.

Next, a pixel electrode 71 is formed in the contact hole. Here, a conductive layer is formed over the planarizing layer 69 and then etched using a resist mask which is formed by a photolithography process using a fifth photomask, thereby forming the pixel electrode 71.

The pixel electrode 71 can be formed using a light-transmitting conductive material such as indium oxide including tungsten oxide, indium zinc oxide including tungsten oxide, indium oxide including titanium oxide, indium tin oxide including titanium oxide, indium tin oxide (also referred to as "ITO"), indium zinc oxide, or indium tin oxide to which silicon oxide is added.

Alternatively, the pixel electrode 71 can be formed with a conductive composition including a conductive high molecular compound (also referred to as a conductive polymer). It is preferable that a pixel electrode formed using a conductive composition have a sheet resistance of 10000 Ω/square or less and a light transmittance of 70% or more at a wavelength of 550 nm. It is also preferable that a conductive high molecular compound which is included in the conductive composition have a resistivity of 0.1 Ω·cm or less.

As the conductive high molecular compound, a so-called π-electron conjugated conductive high molecular compound can be used. Examples thereof include polyaniline and its derivatives, polypyrrole and its derivatives, polythiophene and its derivatives, copolymers of two or more kinds of these, and the like.

Here, the pixel electrode 71 is formed as follows: forming an ITO film by a sputtering method; applying a resist over the ITO film; forming a resist mask by exposing the resist to light with a sixth photomask and developing the resist; and etching the ITO film with the use of the resist mask. After that, the resist mask is removed. Note that FIG. 11C corresponds to a cross-sectional view taken along the lines A-B and C-D of FIG. 12. In the thin film transistor illustrated in FIG. 12, a channel formation region between a source region and a drain region facing each other has a parallel shape when seen from above, whereas a thin film transistor having a channel formation region of a C shape (a U shape) when seen from above may be manufactured instead. Alternatively, a thin film transistor having a channel formation region of a ring shape when seen from above may be manufactured.

By the above process, a thin film transistor which achieves small off-state current and large on-state current and is capable of high-speed operation can be manufactured. In addition, an element substrate which has the thin film transistor as a switching element for a pixel electrode can be manufactured. Note that, in this embodiment mode, as compared to a normal manufacturing process of an inverted-staggered thin film transistor, one additional photomask is needed for etching to form the first microcrystalline semiconductor layers and the buffer layers of a predetermined shape. However, a multi-tone mask is used as a photomask for etching to form the second microcrystalline semiconductor layer, the amorphous semiconductor layer, the pair of impurity semiconductor layers to which the impurity element imparting one conductivity type is added, and the wirings of a predetermined shape; thus, one photomask can be reduced with this process. Accordingly, the total mask number in the whole manufacturing process is not increased.

Embodiment Mode 10

In this embodiment mode, a manufacturing process of a thin film transistor which is similar to that in FIG. 3 and capable of high-speed operation and achieves large on-state current and small off-state current is described.

Figure 14A:
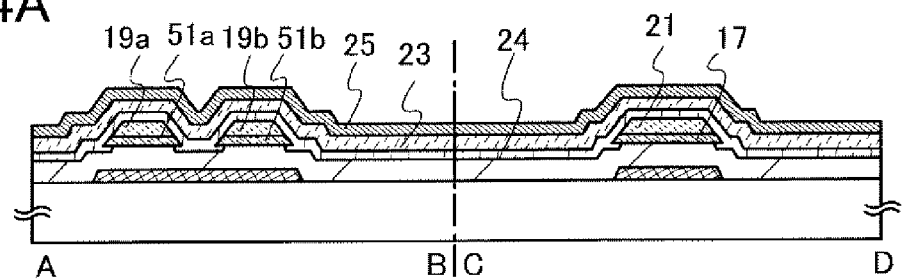
FIGS. 14A to 14E are cross-sectional views illustrating a manufacturing process of a thin film transistor according to an embodiment mode of the present invention.
Figure 14B:
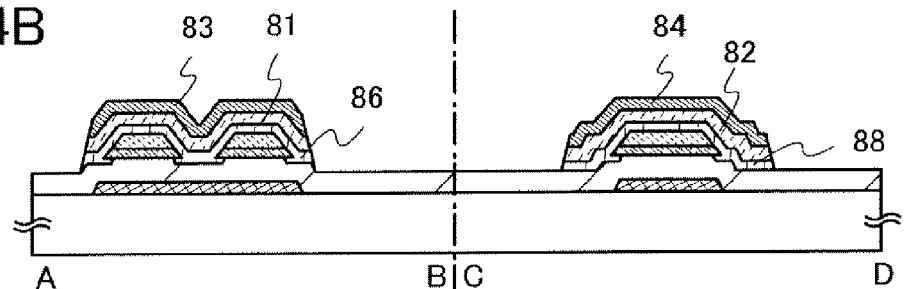
Figure 14C:
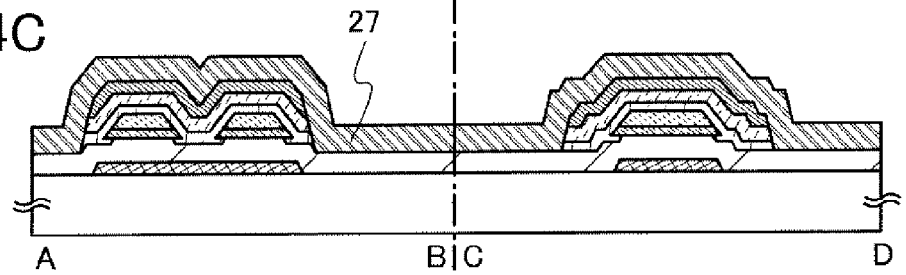
Figure 14D:
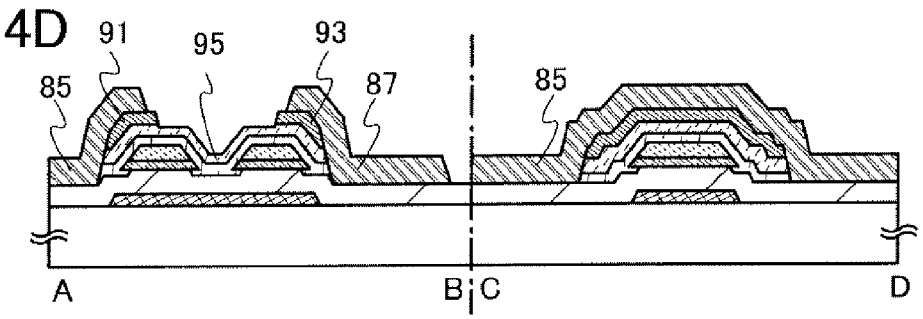
Figure 14E:
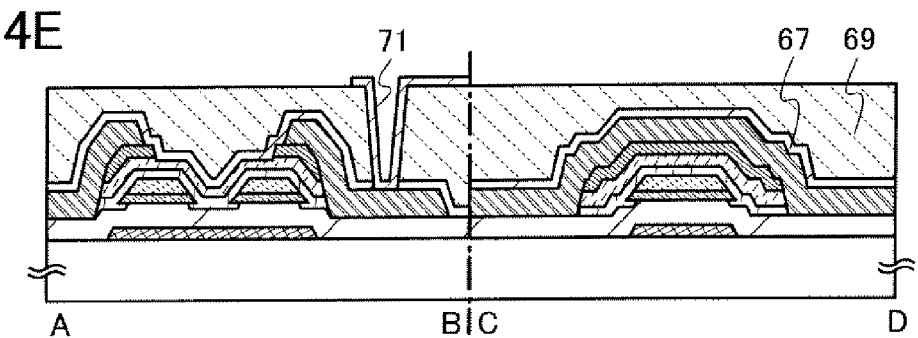
Figure 15:
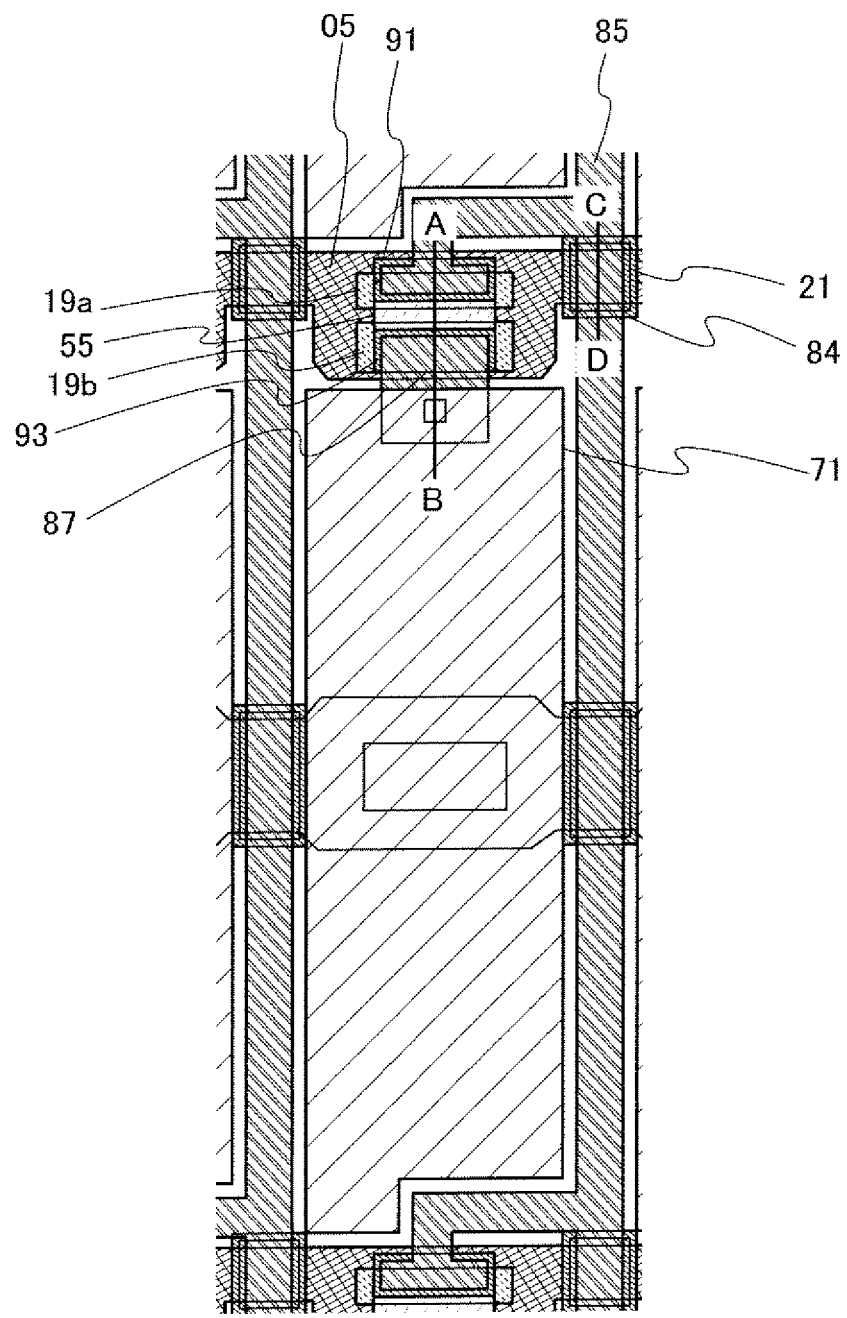
FIG. 15 is a top view illustrating a manufacturing process of a thin film transistor according to an embodiment mode of the present invention.

Note that, in each of FIGS. 14A to 14E, the left side is a cross-sectional view taken along a line A-B of FIG. 15, which illustrates a cross section of a region where a thin film transistor is formed, and the right side is a cross-sectional view taken along a line C-D of FIG. 15, which illustrates a cross section of a region where a gate wiring and a source wiring intersect in a pixel.

By the step of FIG. 10A described in Embodiment Mode 9, a gate wiring 05 is formed. Next, a gate insulating layer 09 is formed over the gate wiring 05 and the substrate 01.

Next, by the step of FIG. 10B, a first microcrystalline semiconductor layer 11 and a buffer layer 13 are sequentially stacked over the gate insulating layer 09. Next, with the use of a resist mask which is formed by a photolithography process, the first microcrystalline semiconductor layer 11 and the buffer layer 13 are etched, thereby forming first microcrystalline semiconductor layers 51a, 51b, and 17 and buffer layers 19a, 19b, and 21 as illustrated in FIG. 14A. Note that, as in Embodiment Mode 9, this step is carried out such that a resistive layer is not formed on surfaces of the first microcrystalline semiconductor layers 51a, 51b, and 17 and the buffer layers 19a, 19b, and 21. By this step, a gate insulating layer 09a is formed to have steps in regions covered with the first microcrystalline semiconductor layers 51a, 51b, and 17.

Next, a second microcrystalline semiconductor layer 24, an amorphous semiconductor layer 23, and an impurity semiconductor layer 25 to which an impurity element imparting one conductivity type is added are formed.

Next, with the use of a resist mask which is formed by a photolithography process, the impurity semiconductor layer 25 to which the impurity element imparting one conductivity type is added, the amorphous semiconductor layer 23, and the second microcrystalline semiconductor layer 24 are etched into a desired shape, whereby a second microcrystalline semiconductor layer 86, an amorphous semiconductor layer 81, and an impurity semiconductor layer 83 to which the impurity element imparting one conductivity type is added are formed in a region where a thin film transistor is to be formed, as illustrated in FIG. 14B. In addition, a second microcrystalline semiconductor layer 88, an amorphous semiconductor layer 82, and an impurity semiconductor layer 84 to which the impurity element imparting one conductivity type is added are formed in a region where the gate wiring and a source wiring intersect. After that, the resist mask is removed. Note that side surfaces of the first microcrystalline semiconductor layers 51a, 51b, and 17 are covered with the second microcrystalline semiconductor layers 86 and 88.

Next, a conductive layer 27 is formed as illustrated in FIG. 14C.

Then, with the use of a resist mask which is formed by a photolithography process, the conductive layer 27 is etched into a desired shape, thereby forming a source wiring 85 and a drain electrode 87 as illustrated in FIG. 14D.

In the portion where the gate wiring 05 and the source wiring 85 intersect, the first microcrystalline semiconductor layer 17, the buffer layer 21, the second microcrystalline semiconductor layer 88, and the amorphous semiconductor layer 82 as well as the gate insulating layer 09 are formed, and the distance between the gate wiring 05 and the source wiring 85 is increased. Thus, parasitic capacitance can be reduced in the region where the gate wiring 05 and the source wiring 85 intersect.

Next, with the use of a resist mask, the impurity semiconductor layer 83 to which the impurity element imparting one conductivity type is added is etched, thereby forming a pair of impurity semiconductor layers 91 and 93 to which the impurity element imparting one conductivity type is added. In this etching step, the amorphous semiconductor layer 81 is also etched. A partly etched amorphous semiconductor layer provided with a depressed portion is referred to as an amorphous semiconductor layer 95. A source region and a drain region, and the depressed portion of the amorphous semiconductor layer 95 can be formed in the same step. After that, the resist mask is removed.

Next, an exposed portion of the amorphous semiconductor layer 95 may be irradiated with $H_2O$ plasma. Typically, exposed portions of the amorphous semiconductor layer 95, the pair of impurity semiconductor layers 91 and 93 to which the impurity element imparting one conductivity type is added, the source wiring 85, and the drain electrode 87 are irradiated with radicals which are obtained by plasma discharge of vaporized water. Accordingly, high-speed operation of a thin film transistor can be achieved, and on-state current can be increased. In addition, off-state current can be decreased.

By the above-described steps, a thin film transistor which is capable of high-speed operation and achieves large on-state current and small off-state current is formed.

Next, by the steps illustrated in FIGS. 11B and 11C, a protective insulating layer 67, a planarizing layer 69, and a pixel electrode 71 which is connected to the drain electrode are formed as illustrated in FIG. 14E. Note that FIG. 14E corresponds to a cross-sectional view taken along the lines A-B and C-D of FIG. 15. In the thin film transistor illustrated in FIG. 15, a channel formation region between a source region and a drain region facing each other has a parallel shape when seen from above, whereas a thin film transistor having a channel formation region of a C shape (a U shape) when seen from above may be manufactured instead.

By the above process, a thin film transistor which achieves small off-state current and large on-state current and is capable of high-speed operation can be manufactured. In addition, an element substrate which has the thin film transistor as a switching element for a pixel electrode can be manufactured.

Embodiment Mode 11

Figure 16:
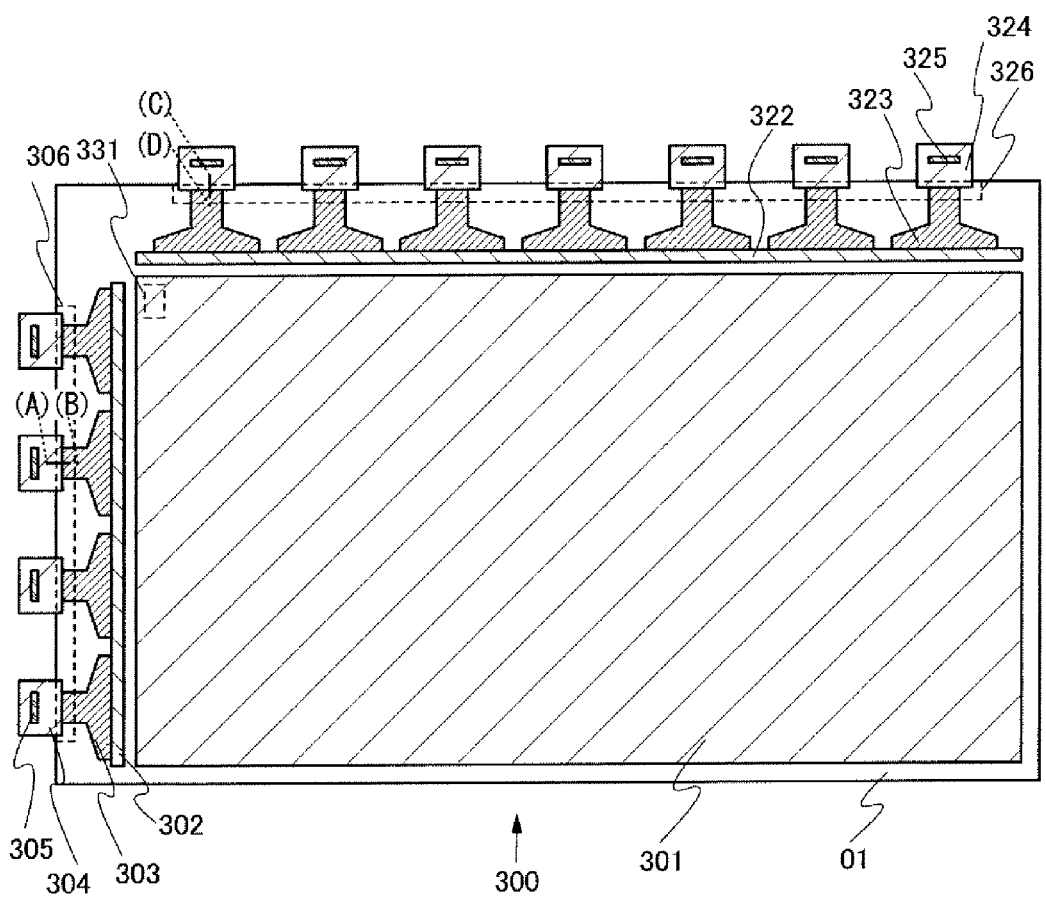
FIG. 16 is a plan view illustrating an element substrate according to an embodiment mode of the present invention.
Figure 17A:
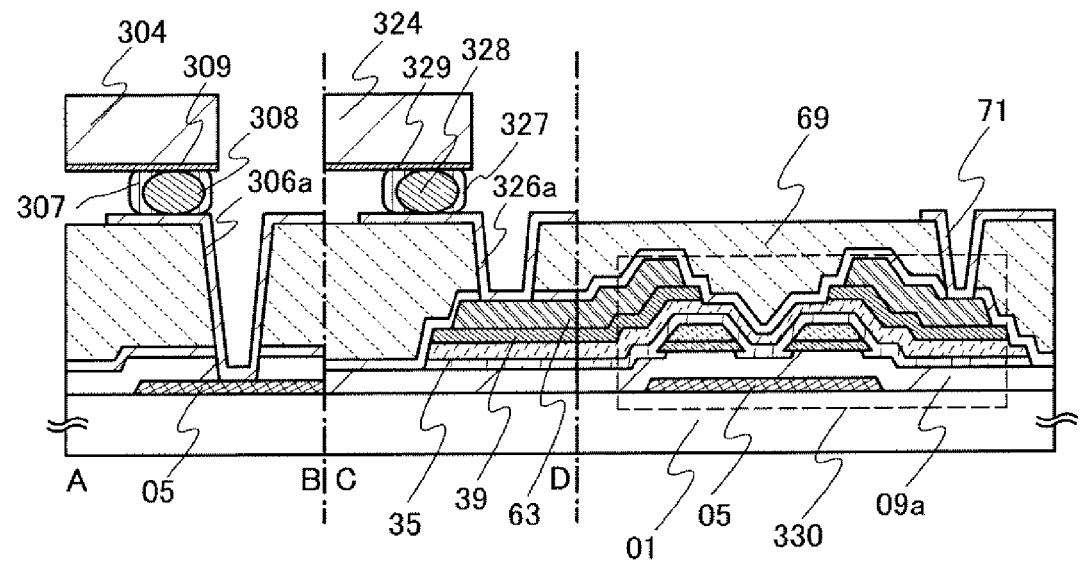
FIGS. 17A and 17B are cross-sectional views each illustrating a terminal portion and a pixel portion of an element substrate according to an embodiment mode of the present invention.
Figure 17B:
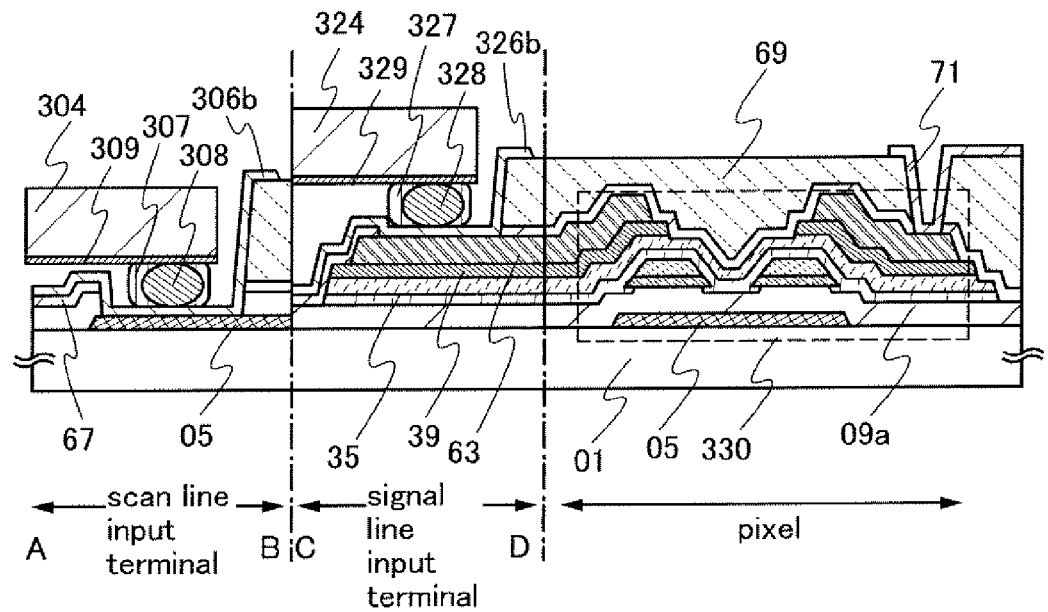

In this embodiment mode, structures of a scan line input terminal portion and a signal line input terminal portion provided in a peripheral portion of an element substrate 300 illustrated in FIG. 16 are hereinafter described with reference to FIGS. 17A and 17B. FIGS. 17A and 17B each illustrate cross-sectional views of a scan line input terminal portion and a signal line input terminal portion provided in a peripheral portion of a substrate 01, and a thin film transistor in a pixel portion.

Note that, in a case of an active matrix display device in which a pixel in a pixel portion is provided with a thin film transistor that controls the potential of a pixel electrode, a scan line is connected to a gate electrode. Alternatively, part of a scan line functions as a gate electrode. Thus, a scan line is hereinafter also referred to as a gate wiring 05. In addition, a signal line is connected to a source of a thin film transistor and is thus hereinafter also referred to as a source wiring 63. Note that, when a signal line is connected to a drain of a thin film transistor, the signal line can function as a drain wiring.

The element substrate 300 illustrated in FIG. 16 is provided with a pixel portion 301 and is provided with protective circuits 302 and 322, signal lines 323, and scan lines 303 between the pixel portion 301 and a peripheral portion of the substrate 01. Although not illustrated, the signal lines and the scan lines are provided from the protective circuits 302 and 322 to the pixel portion 301. The signal lines 323 and the scan lines 303 are provided at their end portions with a signal line input terminal portion 326 and a scan line input terminal portion 306. To terminals of the signal line input terminal portions 326 and the scan line input terminal portion 306, FPCs 324 and 304 are connected respectively, and the FPCs 324 and 304 are provided with signal line driver circuits 325 and scan line driver circuits 305. Although not illustrated, pixels 331 are disposed in matrix in the pixel portion 301.

In FIG. 17A, a scan line input terminal 306a is connected to a gate wiring 05 of a thin film transistor 330. In addition, a signal line input terminal 326a is connected to a source wiring 63.

Each of the scan line input terminal 306a and the signal line input terminal 326a is formed with the same layer as a pixel electrode 71 of the thin film transistor 330 of the pixel portion. In addition, the scan line input terminal 306a and the signal line input terminal 326a are formed over a planarizing layer 69 that is formed over the source wiring 63. Over the planarizing layer 69, the scan line input terminal 306a and the signal line input terminal 326a are connected to wirings 309 and 329 of the FPCs 304 and 324 through conductive particles 308 and 328 of anisotropic conductive adhesives 307 and 327.

Note that, although the gate wiring 05 and the scan line input terminal 306a are connected to each other in this case, a conductive film formed with the same layer as the source wiring 63 may be provided between the gate wiring of and the scan line input terminal 306a.

In FIG. 17B, a scan line input terminal 306b is connected to a gate wiring 05 of a thin film transistor 330. In addition, a signal line input terminal 326b is connected to a source wiring 63 of a thin film transistor 330.

Each of the scan line input terminal 306b and the signal line input terminal 326b is formed with the same layer as a pixel electrode 71 of the thin film transistor 330 of the pixel portion. In addition, the scan line input terminal 306b and the signal line input terminal 326b are formed over a planarizing layer 69 and a protective insulating layer 67. In addition, in opening portions of the planarizing layer 69 and the protective insulating layer 67, the scan line input terminal 306b and the signal line input terminal 326b are connected to wirings 309 and 329 of FPCs 304 and 324 through conductive particles 308 and 328 of anisotropic conductive adhesives 307 and 327.

Between the substrate 01 and the source wiring 63, an amorphous semiconductor layer 35 and an impurity semiconductor layer 39 to which an impurity element imparting one conductivity type is added, as well as a gate insulating layer 09, are formed; thus, the position of the signal line input terminal 326b is high in the connection region of the signal line input terminal 326b and the FPC 324. Accordingly, connection between the signal line input terminal 326b and the wiring 329 of the FPC 324 becomes easier.

Embodiment Mode 12

Next, a structure of a display panel that is one mode of the present invention is hereinafter described.

Figure 18A:
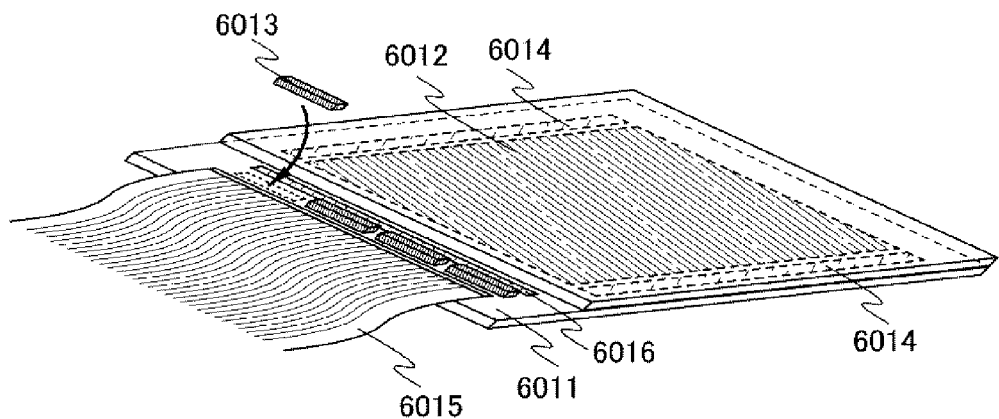
FIGS. 18A to 18C are perspective views each illustrating a display panel according to an embodiment mode of the present invention.

FIG. 18A illustrates a mode of a display panel in which only a signal line driver circuit 6013 is separately formed and connected to a pixel portion 6012 formed over a substrate 6011. An element substrate over which the pixel portion 6012, a protective circuit 6016, and a scan line driver circuit 6014 are formed is formed using the element substrate described in the above embodiment mode. When the signal line driver circuit is formed using a thin film transistor which achieves higher field-effect mobility than a thin film transistor in which an amorphous semiconductor layer is used for a channel formation region, the operation of the signal line driver circuit for which higher driving frequency is required than for the scan line driver circuit can be stabilized. Note that the signal line driver circuit 6013 may be formed using a transistor in which a single crystalline semiconductor is used for a channel formation region, a thin film transistor in which a polycrystalline semiconductor is used for a channel formation region, or a transistor in which SOI is used for a channel formation region. A transistor with SOI includes a transistor in which a single crystal semiconductor layer provided over a glass substrate is used for a channel formation region. The pixel portion 6012, the signal line driver circuit 6013, and the scan line driver circuit 6014 are each supplied with a potential of a power supply a variety of signals, and the like via an FPC 6015. Between the signal line driver circuit 6013 and the FPC 6015 or between the signal line driver circuit 6013 and the pixel portion 6012, the protective circuit 6016 formed with the thin film transistor described in the above embodiment mode may be provided. As the protective circuit 6016, a protective circuit including one or more elements selected from a thin film transistor with another structure, a diode, a resistor, a capacitor, and the like may be provided instead of the protective circuit formed with the thin film transistor described in the above embodiment mode.

Note that both the signal line driver circuit and the scan line driver circuit may be formed over the same substrate as the pixel portion.

Figure 18B:
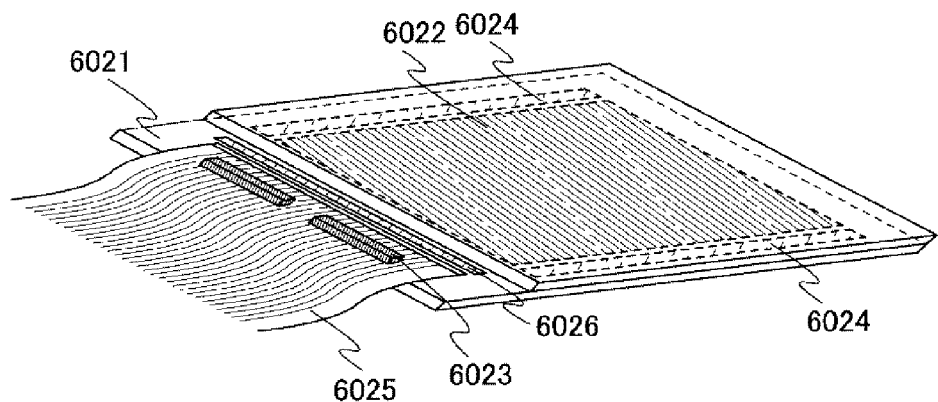

When a driver circuit is separately formed, a substrate over which the driver circuit is formed is not necessarily attached to a substrate over which a pixel portion is formed, and may be attached over an FPC, for example. FIG. 18B illustrates a mode of a display device panel where only a signal line driver circuit 6023 is separately formed and an element substrate, in which a pixel portion 6022, a protective circuit 6026, and a scan line driver circuit 6024 are formed over a substrate 6021, is connected to an FPC. The pixel portion 6022, the protective circuit 6026, and the scan line driver circuit 6024 are each formed using the thin film transistor described in the above embodiment mode. The signal line driver circuit 6023 is connected to the pixel portion 6022 via an FPC 6025 and the protective circuit 6026. The pixel portion 6022, the signal line driver circuit 6023, and the scan line driver circuit 6024 are each supplied with a potential of a power supply, a variety of signals, and the like via the FPC 6025. Between the FPC 6025 and the pixel portion 6022, the protective circuit 6026 formed with the thin film transistor described in the above embodiment mode may be provided. As the protective circuit 6026, a protective circuit including one or more elements selected from a thin film transistor with another structure, a diode, a resistor, a capacitor, and the like may be provided instead of the protective circuit formed with the thin film transistor described in the above embodiment mode.

Figure 18C:
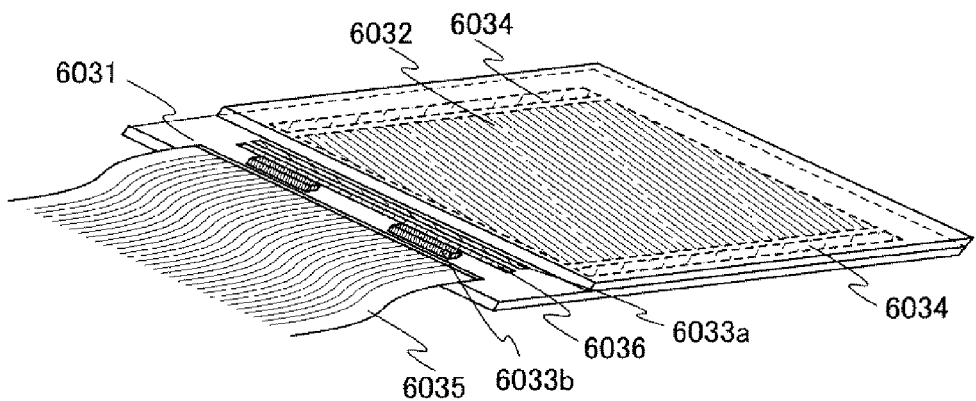

Alternatively, only part of a signal line driver circuit or part of a scan line driver circuit may be formed over the same substrate as a pixel portion by using the thin film transistor described in the above embodiment mode, and the other part of the driver circuit may be separately formed and electrically connected to the pixel portion. FIG. 18C illustrates a mode of a display device panel in which an analog switch 6033a included in a signal line driver circuit is formed over a substrate 6031, which is the same substrate as a pixel portion 6032 and a scan line driver circuit 6034, and a shift register 6033b included in the signal line driver circuit is separately formed over a different substrate and attached to the substrate 6031. The pixel portion 6032, a protective circuit 6036, and the scan line driver circuit 6034 are each formed using the thin film transistor described in the above embodiment mode. The shift register 6033b included in the signal line driver circuit is connected to the pixel portion 6032 via an FPC 6035 and the protective circuit 6036. The pixel portion 6032, the signal line driver circuit, and the scan line driver circuit 6034 are each supplied with a potential of a power supply, a variety of signals, and the like via the FPC 6035. Between the shift register 6033b and the analog switch 6033a, the protective circuit 6036 formed with the thin film transistor described in the above embodiment mode may be provided. As the protective circuit 6036, a protective circuit including one or more elements selected from a thin film transistor with another structure, a diode, a resistor, a capacitor, and the like may be provided instead of the protective circuit formed with the thin film transistor described in the above embodiment mode.

As illustrated in FIGS. 18A to 18C, in a display device of this embodiment mode, all or part of the driver circuit can be formed over the same substrate as the pixel portion, using the thin film transistor described in the above embodiment mode.

Note that a connection method of a substrate which is separately formed is not particularly limited, and a known COG method, wire bonding method, TAB method, or the like can be used. Further, a connection position is not limited to the positions illustrated in FIGS. 18A to 18C as long as electrical connection is possible. Moreover, a controller, a CPU, a memory, or the like may be formed separately and connected.

Note that the signal line driver circuit used in this embodiment mode has a shift register and an analog switch. Alternatively, in addition to the shift register and the analog switch, another circuit such as a buffer, a level shifter, or a source follower may be included. Moreover, the shift register and the analog switch are not necessarily provided. For example, a different circuit such as a decoder circuit with which a signal line can be selected may be used instead of the shift register, and a latch or the like may be used instead of the analog switch.

Embodiment Mode 13

The element substrates obtained according to the above embodiment modes and display devices and the like with the element substrates can be used for active matrix display device panels. That is, the above embodiment modes can be applied to all electronic devices having these in display portions.

Examples of such electronic devices are as follows: cameras such as video cameras and digital cameras, head-mounted displays (goggle type displays), car navigation systems, projectors, car stereo components, personal computers, portable information terminals (mobile computers, cellular phones, electronic book readers, and the like), etc. Examples thereof are illustrated in FIGS. 19A to 19D.

Figure 19A:
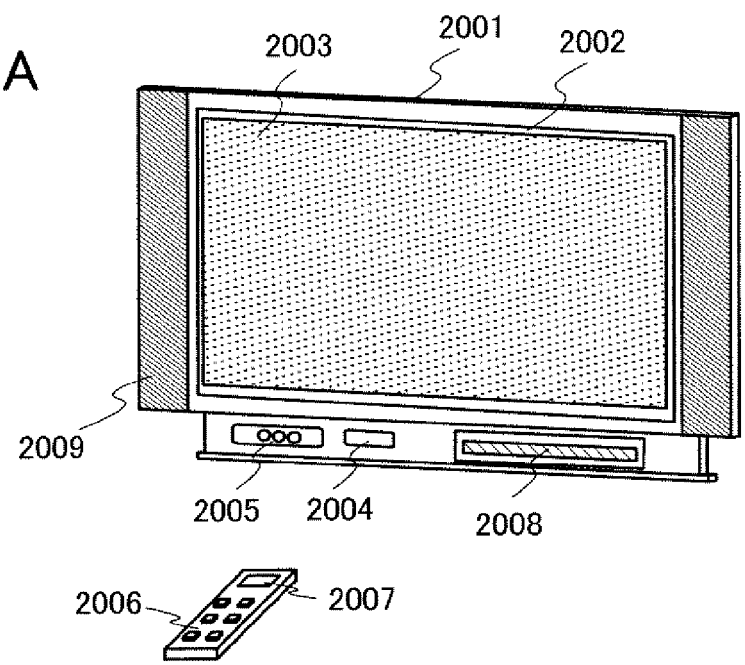
FIGS. 19A to 19D are perspective views each illustrating an electronic device with a display device according to an embodiment mode of the present invention.

FIG. 19A illustrates a television device. A television device can be completed by incorporation of a display panel into a housing as illustrated in FIG. 19A. A main screen 2003 is formed with the display panel. In addition, a speaker portion 2009, operation switches, and the like are provided as accessory equipment. In such a manner, a television device can be completed.

As illustrated in FIG. 19A, a display panel 2002 with a display element is incorporated into a housing 2001. The television device can receive general TV broadcast with a receiver 2005, and can be connected to a wired or wireless communication network via a modem 2004 so that one-way (from a sender to a receiver) or two-way (between a sender and a receiver or between receivers) information communication can be performed. The television device can be operated with a switch that is incorporated in the housing or with a separate remote control unit 2006. The remote control unit 2006 may include a display portion 2007 for displaying information to be output.

Further, the television device may include a sub screen 2008 formed using a second display panel for displaying channels, sound volume, and the like, in addition to the main screen 2003. In this structure, the main screen 2003 may be formed using a liquid crystal display panel, and the sub screen 2008 may be formed using a light-emitting display panel. Alternatively, a structure may be employed in which the main screen 2003 is formed using a light-emitting display panel, the sub screen 2008 is formed using a light-emitting display panel, and the sub screen can be turned on and off.

Figure 20:
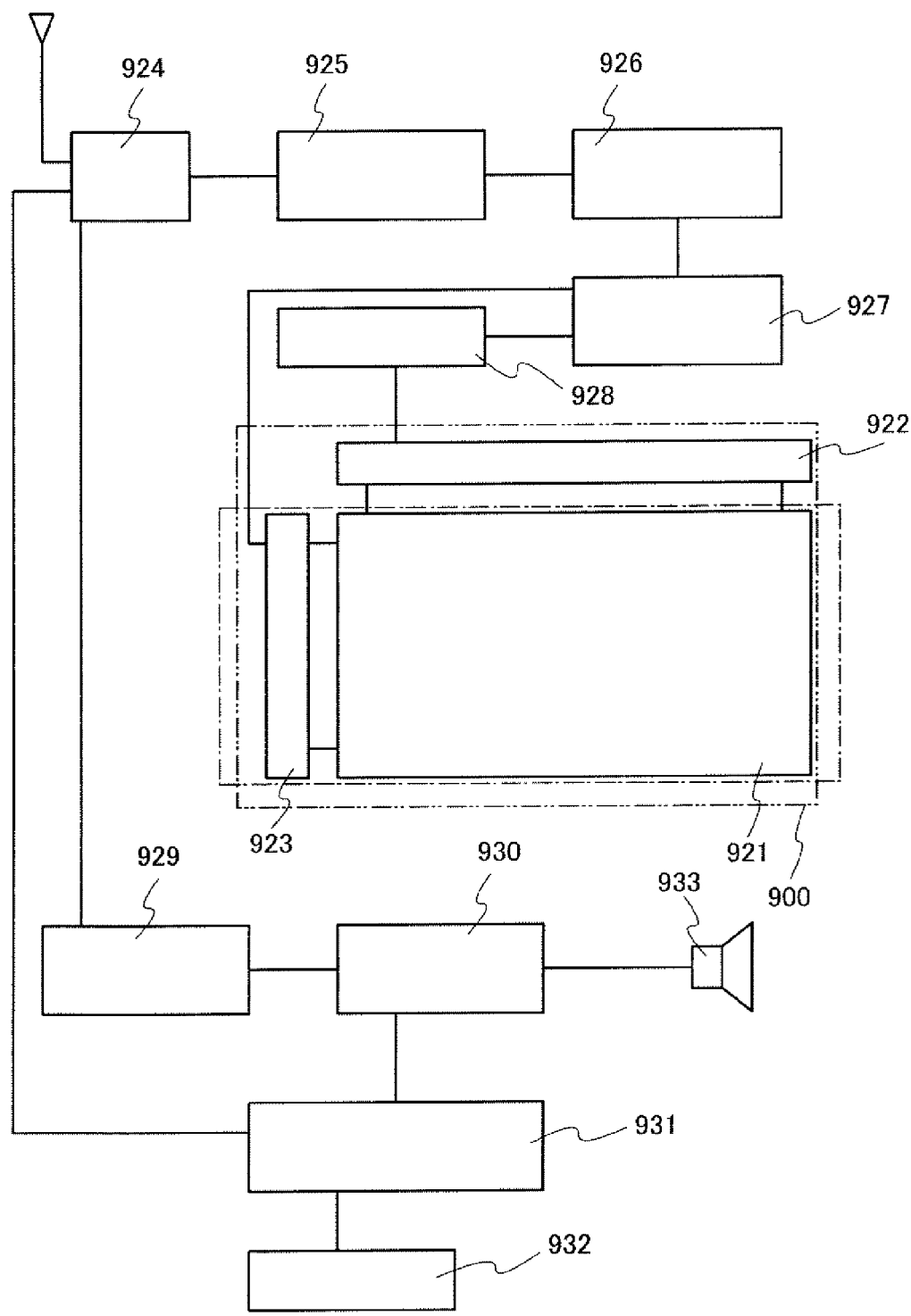
FIG. 20 is a diagram illustrating an electronic device with a display device according to an embodiment mode of the present invention.

FIG. 20 is a block diagram of a major structure of a television device. A display panel 900 is provided with a pixel portion 921. A signal line driver circuit 922 and a scan line driver circuit 923 may be mounted on the display panel by a COG method.

As other external circuits, the television device includes, on the video signal input side, a video signal amplifier circuit 925 which amplifies a video signal among signals received with a tuner 924; a video signal processing circuit 926 which converts a signal output from the video signal amplifier circuit 925 into a color signal corresponding to each color of red, green, and blue; a control circuit 927 which converts the video signal into an input specification of a driver IC; and the like. The control circuit 927 outputs a signal to each of the scan line side and the signal line side. When digital driving is performed, a structure may be employed in which a signal dividing circuit 928 is provided on the signal line side and an input digital signal is divided into m signals to be supplied.

Among the signals received with the tuner 924, an audio signal is transmitted to an audio signal amplifier circuit 929, and its output is supplied to a speaker 933 through an audio signal processing circuit 930. A control circuit 931 receives control information on incoming station (incoming frequency) and volume from an input portion 932 and transmits a signal to the tuner 924 and the audio signal processing circuit 930.

It is needless to say that the present invention is not limited to a television device and can be applied to various uses, e.g., a monitor of a personal computer, a large display medium such as an information display board at a train station, an airport, or the like, or an advertisement display board on the street, and the like.

By application of the element substrate described in the above embodiment mode and the display device with the element substrate to the main screen 2003 and the sub screen 2008, mass productivity of television devices with improved image quality such as contrast can be increased.

Figure 19B:
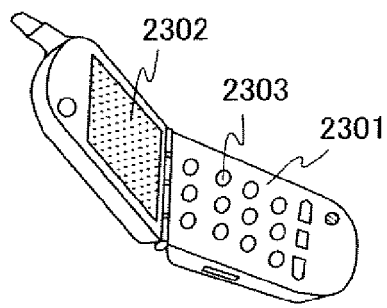

FIG. 19B illustrates an example of a cellular phone 2301. The cellular phone 2301 includes a display portion 2302, an operation portion 2303, and the like. When the element substrate described in the above embodiment mode and a display device with the element substrate are used in the display portion 2302, mass productivity of cellular phones with improved image quality such as contrast can be increased.

Figure 19C:
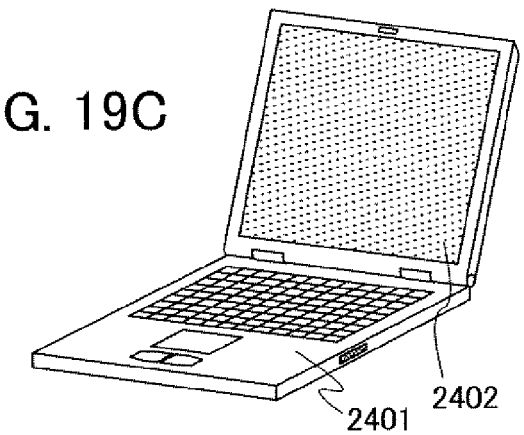

A portable computer illustrated in FIG. 19C includes a main body 2401, a display portion 2402, and the like. When the element substrate described in the above embodiment mode and a display device with the element substrate are used in the display portion 2402, mass productivity of computers with improved image quality such as contrast can be increased.

Figure 19D:
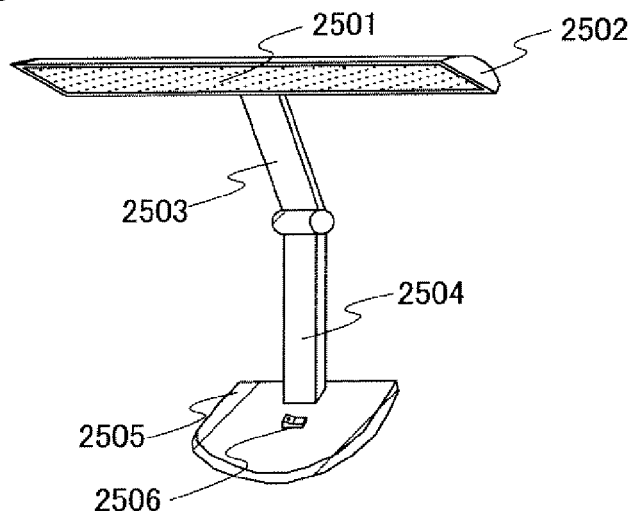

FIG. 19D illustrates a desk lamp, which includes a lighting portion 2501, a shade 2502, an adjustable arm 2503, a support 2504, a base 2505, and a power supply switch 2506. The desk lamp is formed using a light-emitting device in the lighting portion 2501. Note that a lamp includes a ceiling light, a wall light, and the like in its category. When the element substrate described in the above embodiment mode and a display device with the element substrate are used, mass productivity can be increased and an inexpensive desk lamp can be provided.

Figure 21A:
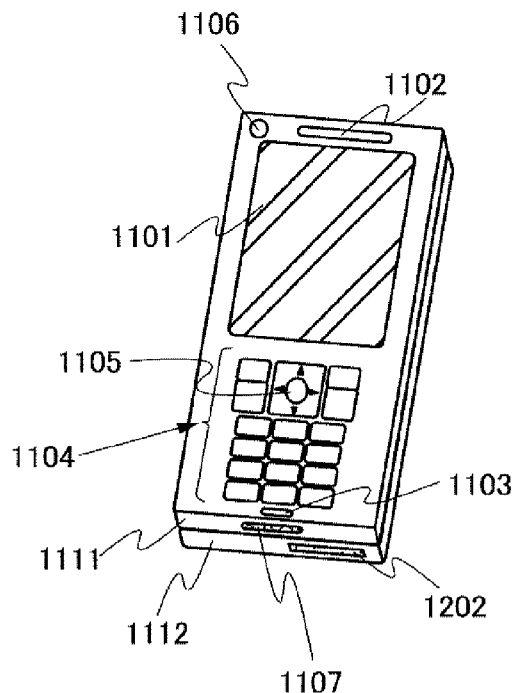
FIGS. 21A to 21C are perspective views illustrating an electronic device with a display device according to an embodiment mode of the present invention.
Figure 21B:
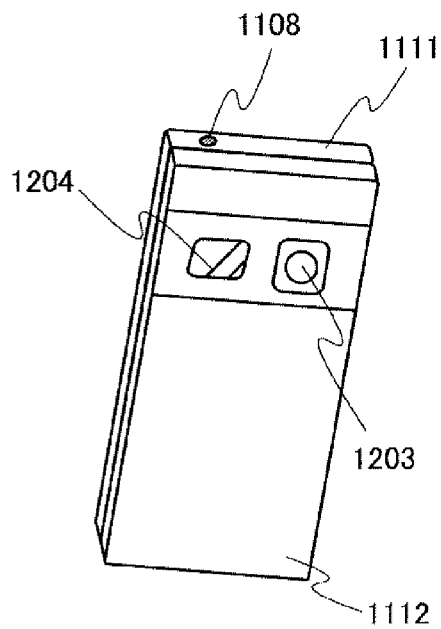
Figure 21C:
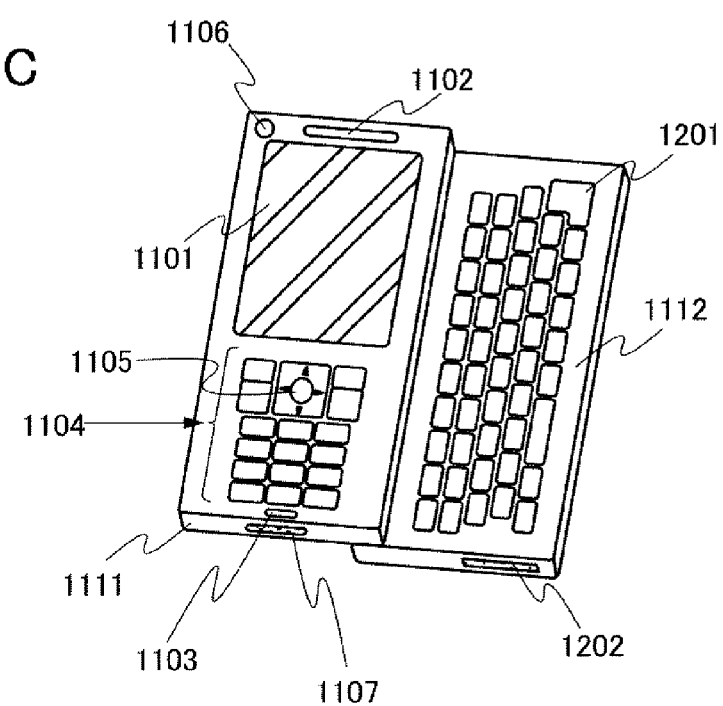

FIGS. 21A to 21C illustrate an example of a structure of a smartphone cellular phone to which the above embodiment mode is applied. FIG. 21A illustrates a front view; FIG. 21B, a rear view; and FIG. 21C, a development view. The smartphone cellular phone has two housings 1111 and 1112. The smartphone cellular phone has both a function as a cellular phone and a function as a portable information terminal and includes a computer provided to conduct a variety of data processing besides voice calls.

The housing 1111 includes a display portion 1101, a speaker 1102, a microphone 1103, operation keys 1104, a pointing device 1105, a front-face camera lens 1106, an external connection terminal jack 1107, an earphone terminal 1108, and the like. The housing 1112 includes a keyboard 1201, an external memory slot 1202, a rear-face camera 1203, a light 1204, and the like. In addition, an antenna is incorporated in the housing 1111.

In addition to the above components, the smartphone cellular phone may include a contactless IC chip, a small size memory device, or the like.

The housings 1111 and 1112 which are put together to be lapped with each other (FIG. 21A) are developed by sliding as illustrated in FIG. 21C. The display device described in the above embodiment mode can be incorporated in the display portion 1101, which allows the direction of display to be changed as appropriate depending on a use mode. Because the display portion 1101 and the front-face camera lens 1106 are provided in the same plane, the smartphone cellular phone can be used as a videophone. In addition, still images and moving images can be taken with the rear-face camera 1203 and the light 1204 by using the display portion 1101 as a viewfinder.

The speaker 1102 and the microphone 1103 are not limited to use for voice calls and can be used for videophone calls, audio recording, reproduction, and the like. With the use of the operation keys 1104, making and receiving calls, inputting simple information such as e-mail or the like, scrolling the screen, moving the cursor, and the like are possible.

If much information needs to be handled in documentation, a use as a portable information terminal, and the like, the use of the keyboard 1201 is convenient. Furthermore, the housings 1111 and 1112 which are put together to be lapped with each other (FIG. 21A) can be developed by sliding as illustrated in FIG. 21C. When the smartphone cellular phone can be used as a portable information terminal, smooth operation can be conducted using the keyboard 1201 or the pointing device 1105. The external connection terminal jack 1107 can be connected to an AC adaptor and various types of cables such as a USB cable, and charging and data communication with a personal computer or the like are possible. Moreover, a recording medium can be inserted into the external memory slot 1202 so that a large volume of data can be stored and moved.

The housing 1112 is provided with the rear-face camera 1203 and the light 1204 on its rear face (FIG. 21B), and still images and moving images can be taken using the display portion 1101 as a viewfinder.

Furthermore, in addition to the above-described functions and components, the smartphone cellular phone may also have an infrared communication function, a USB port, a television one-segment broadcasting receiving function, a contactless IC chip, an earphone jack, or the like.

By application of the display device described in the above embodiment mode, mass productivity can be increased.

Embodiment 1

In this embodiment a formation process and a shape of a gate insulating layer having a step are hereinafter described.

A silicon nitride layer, a silicon oxynitride layer, a first microcrystalline semiconductor layer, and a first buffer layer were stacked over a substrate in the same deposition chamber.

Here, a glass substrate was used as the substrate.

As the silicon nitride layer, a silicon nitride layer having a thickness of 110 nm was formed by a plasma CVD method. Here, the silicon nitride layer was formed under conditions where the RF power frequency was 13.56 MHz, the power of the RF power source was 370 W. The deposition temperature was 280° C. the flow rate ratio of silane to hydrogen, nitrogen, and ammonia was 4:50:55:14, and the pressure was 100 Pa.

As the silicon oxynitride layer, a silicon oxynitride layer having a thickness of 110 nm was formed by a plasma CVD method. Here, the silicon oxynitride layer was formed under conditions where the RF power frequency was 13.56 MHz, the power of the RF power source was 50 W, the deposition temperature was 280° C., the flow rate ratio of silane to dinitrogen monoxide was 1:40, and the pressure was 40 Pa.

As the first microcrystalline semiconductor layer, a microcrystalline silicon layer having a thickness of 20 nm was formed by a plasma CVD method. Here, the microcrystalline silicon layer was formed under conditions where the RF power frequency was 13.56 MHz, the power of the RF power source was 50 W, the deposition temperature was 280° C., the flow rate ratio of hydrogen to silane was 150:1, and the pressure was 280 Pa.

As the first buffer layer, an amorphous silicon layer having a thickness of 50 nm was formed by a plasma CVD method. Here, the amorphous silicon layer was formed under conditions where the RF power frequency was 13.56 MHz, the power of the RF power source was 50 W, the deposition temperature was 280° C., the flow rate ratio of silane to hydrogen was 14:15, and the pressure was 170 Pa.

Next, a resist mask was formed by a photolithography process, and the first microcrystalline semiconductor layer and the first buffer layer were dry-etched using the resist mask, thereby forming a second microcrystalline semiconductor layer and a second buffer layer.

Here, an inductively coupled plasma (ICP) apparatus was used, and the first microcrystalline semiconductor layer and the first buffer layer were etched under etching conditions where the ICP power was 150 W, the bias power was 40 W, the pressure was 1.0 Pa, the etching gas was chlorine at a flow rate of 100 sccm, and the etching time was 57 seconds.

Then, oxygen ashing was performed and the resist mask was removed using a stripping solution (a first step).

Sample 1 was immersed in a hydrofluoric acid for 40 seconds as a second step after the first step.

Sample 2 was subjected to dry etching as a second step, after the first step, under etching conditions where the ICP power was 150 W, the bias power was 40 W, the pressure was 1.0 Pa, the etching gas was chlorine at a flow rate of 100 sccm, and the etching time was 11 seconds, whereby a surface of the second buffer layer was dry-etched 20 nm deep. Next, the surface of the second buffer layer was dry-etched 5 nm deep under etching conditions where the source power was 2000 W, the pressure was 0.67 Pa, the etching gas was chlorine at a flow rate of 100 sccm, and the etching time was 30 seconds. Then, Sample 2 was immersed in a hydrofluoric acid for 60 seconds.

Sample 3 was subjected to dry etching as a second step, after the first step, under etching conditions where the ICP power was 150 W, the bias power was 40 W, the pressure was 1.0 Pa, the etching gas was chlorine at a flow rate of 100 sccm, and the etching time was 11 seconds, whereby a surface of the second buffer layer was dry-etched 20 nm deep. Next, the surface of the second buffer layer was dry-etched 5 nm deep under etching conditions where the source power was 2000 W, the pressure was 0.67 Pa, the etching gas was chlorine at a flow rate of 100 sccm, and the etching time was 30 seconds.

In each of Samples 1 to 3, after the second step, an amorphous semiconductor layer was formed by a plasma CVD method as a third step.

As the amorphous semiconductor layer, an amorphous silicon layer having a thickness of 100 nm was formed by a plasma CVD method. Here, the amorphous silicon layer was formed under conditions where the RF power frequency was 13.56 MHz, the power of the RF power source was 50 W, the deposition temperature was 280° C., the flow rate ratio of silane to hydrogen was 14:15, and the pressure was 170 Pa.

Figure 22A:
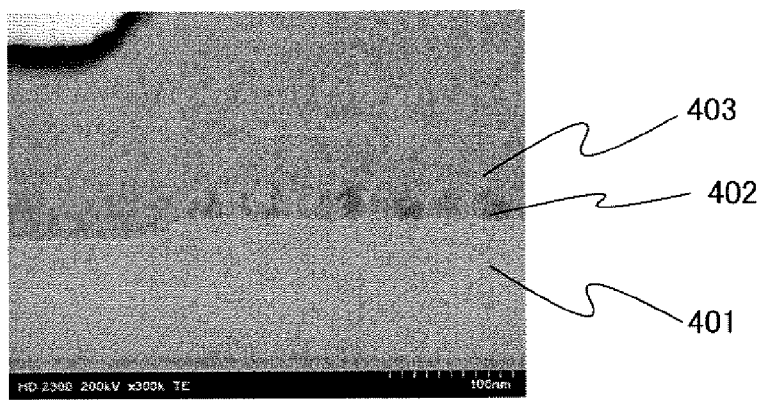
FIGS. 22A to 22C are STEM diagrams each showing a cross section of an element substrate obtained according to Embodiment 1.
Figure 22B:
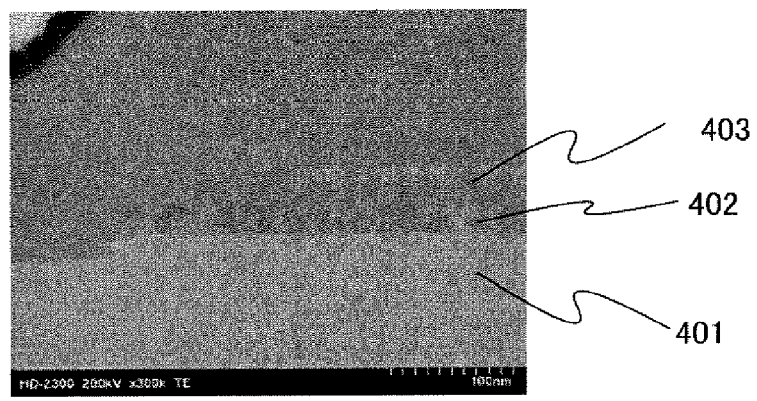
Figure 22C:
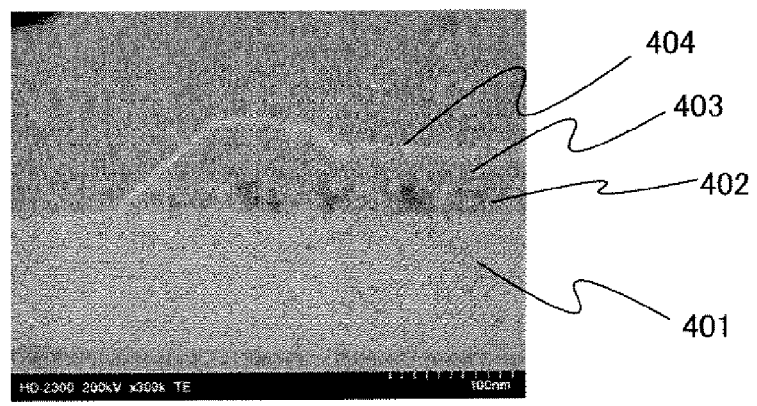

The cross sections of Samples 1 to 3 were observed with a scanning transmission electron microscope (STEM). FIGS. 22A to 22C show STEM images of the cross sections of Samples 1 to 3 taken with a scanning transmission electron microscope. FIG. 22A is a cross-sectional STEM image of Sample 1; FIG. 22B, a cross-sectional STEM image of Sample 2; and FIG. 22C, a cross-sectional STEM image of Sample 3.

In Sample 3 of FIG. 22C, a resistive layer 404 which is shown as a white region can be observed on surfaces of a second microcrystalline semiconductor layer 402 and a second buffer layer 403. In particular, on side surfaces of the second microcrystalline semiconductor layer 402 and the second buffer layer 403 where carriers travel, a thick white region can be observed. On the other hand, in each of Samples 1 and 2 of FIGS. 22A and 22B, although a white line can be slightly observed on surfaces of the second microcrystalline semiconductor layer 402 and the second buffer layer 403, the thickness is small as compared to Sample 3. On side surfaces of the second microcrystalline semiconductor layer 402 and the second buffer layer 403 where carriers travel, a white line can hardly be observed.

It can be seen that, in Samples 1 and 2, a silicon oxynitride layer 401 is etched outside the second microcrystalline semiconductor layer 402. In Sample 1, the silicon oxynitride layer 401 is etched 15 nm deep from the surface.

Accordingly, when the first microcrystalline semiconductor layer and the first buffer layer are treated with a hydrofluoric acid after being etched, part of a gate insulating layer can be etched, whereby a gate insulating layer having a step can be formed.

Embodiment 2

In this embodiment, results of simulation of current-voltage characteristics of the thin film transistor described in Embodiment Mode 1 are described. Note that a device simulator "ATLAS" developed by Silvaco Data Systems Inc. was used for device simulation.

FIG. 25A illustrates a typical device structure used for simulation of this embodiment and FIG. 25B-1, FIG. 25C-1, and FIG. 25D-1 illustrate Structure 1, Structure 2, and Structure 3, respectively, where the amount of gate insulating layer etched differs.

In the device structure used in this embodiment, molybdenum Mo is formed with a thickness of 150 nm as a gate electrode Mo over an insulating substrate (not illustrated). Here, the work function of molybdenum is 4.6 eV. As the insulating substrate, for example, a glass substrate which contains silicon oxide as its main component can be used. In the device simulation, the dielectric constant is 4.1, and the thickness of the glass substrate is 0.5 μm. Although many glass substrates used in an actual manufacturing process of a thin film transistor have thicknesses of about 0.5 mm, 0.7 mm, and the like, the thickness of the glass substrate in device simulation is determined to be large enough to prevent an electric field at the bottom of the insulating substrate from affecting electric characteristics of a thin film transistor, in consideration of computational efficiency.

Over the gate electrode, silicon oxynitride (with a dielectric constant of 4.1) is provided as a gate insulating layer SiON.

Note that in Structure 1 illustrated in FIG. 25B-1, the thickness of the gate insulating layer SiON in regions covered with first microcrystalline semiconductor layers μc-Si(n) is 220 nm, and the thickness of the gate insulating layer in a region not covered with the first microcrystalline semiconductor layers μc-Si(n) is 200 nm. That is, the amount of the gate insulating layer etched in the region not covered with the first microcrystalline semiconductor layers is 20 nm.

In Structure 2 illustrated in FIG. 25C-1, the thickness of the gate insulating layer SiON in regions covered with the first microcrystalline semiconductor layers μc-Si(n) is 220 nm, and the thickness of the gate insulating layer SiON in a region not covered with the first microcrystalline semiconductor layers μc-Si(n) is 160 nm. That is, the amount of the gate insulating layer SiON etched in the region not covered with the first microcrystalline semiconductor layers μc-Si(n) is 60 nm.

In Structure 3 illustrated in FIG. 25D-1, as a comparative example, the thickness of the gate insulating layer SiON in regions covered with the first microcrystalline semiconductor layers μc-Si(n) is equal to the thickness of the gate insulating layer SiON in a region not covered with the first microcrystalline semiconductor layers μc-Si(n). That is, the amount of the gate insulating layer SiON etched in the region not covered with the first microcrystalline semiconductor layers μc-Si(n) is 0 nm.

Over the gate insulating layer SiON, microcrystalline silicon layers μc-Si(n) to which phosphorus is added (with a thickness of 20 nm, a donor concentration of $1 \times 10^{19}$ atoms/$cm^3$, and an activation rate of 100%) were stacked as the first microcrystalline semiconductor layers μc-Si(n).

Over the first microcrystalline semiconductor layers μc-Si (n) and the gate insulating layer, a microcrystalline silicon layer (with a thickness of 20 nm) is stacked as a second microcrystalline semiconductor layer μ-Si(i).

Over the second microcrystalline semiconductor layer μ-Si (i), an amorphous silicon layer is stacked as an amorphous semiconductor layer a-Si(i). Note that the amorphous silicon layer has a thickness of 90 nm in a region covered with an impurity semiconductor layer to which an impurity element imparting one conductivity type is added and has a thickness of 20 nm in a region not covered with the impurity semiconductor layer to which the impurity element imparting one conductivity type is added.

As illustrated in FIG. 25A, over the amorphous semiconductor layer a-Si(i), amorphous silicon layers to which phosphorus is added (with a thickness of 50 nm) are stacked as a pair of impurity semiconductor layers a-Si(n$^+$) to which an impurity element imparting one conductivity type is added. In each of Structures 1 to 3, the distance between the pair of impurity semiconductor layers a-Si(n$^+$) to which the impurity element imparting one conductivity type is added corresponds to the channel length L of a thin film transistor. Here, the channel length L is 10 μm and the channel width is 20 μm The pair of impurity semiconductor layers a-Si(n$^+$) to which the impurity element imparting one conductivity type is added has a donor concentration of $1\times10^{19}$ atoms/cm$^3$ and has high electric conductivity.

Over the pair of impurity semiconductor layers a-Si(n$^+$) to which the impurity element imparting one conductivity type is added, molybdenum (with a thickness of 100 nm) was stacked as a source electrode Source and a drain electrode Drain. Ohmic contact is assumed between the source and drain electrodes and the pair of impurity semiconductor layers to which the impurity element imparting one conductivity type is added.

FIG. 25B-2, FIG. 25C-2, and FIG. 25D-2 show the results of current-voltage characteristics obtained by device simulation of the thin film transistors illustrated in FIG. 25B-1, FIG. 25C-1, and FIG. 25D-1, respectively. Each shows drain current at drain voltages of 1 V and 10 V and maximum field-effect mobility at a drain voltage of 1 V.

The maximum field-effect mobility of the thin film transistor of Structure 1 illustrated in FIG. 25B-1 is 4.0 cm$^2$/Vs.

The maximum field-effect mobility of the thin film transistor of Structure 2 illustrated in FIG. 25C-1 is 4.9 cm$^2$/Vs.

The maximum field-effect mobility of the thin film transistor of Structure 3 illustrated in FIG. 25D-1 is 3.6 cm$^2$/Vs.

In the thin film transistor of Structure 1 illustrated in FIG. 25B-1, the on-state current at a gate voltage of 20 V and a drain voltage of 1 V is $4.0\times10^{-7}$ A and the on-state current at a drain voltage of 10 V is $3.6\times10^{-5}$ A.

In the thin film transistor of Structure 2 illustrated in FIG. 25C-1, the on-state current at a gate voltage of 20 V and a drain voltage of 1 V is $4.0\times10^{-7}$ A and the on-state current at a drain voltage of 10 V is $3.9\times10^{-5}$ A.

In the thin film transistor of Structure 3 illustrated in FIG. 25D-1, the on-state current at a gate voltage of 20 V and a drain voltage of 1 V is $3.9\times10^{-7}$ A and the on-state current at a drain voltage of 10 V is $3.5\times10^{-5}$ A.

Accordingly, it can be seen that when the thickness of a gate insulating layer is partly decreased in the vicinity of a channel formation region such that the gate insulating layer does not have a flat shape, on-state current and field-effect mobility of a thin film transistor are increased as compared to such a thin film transistor as illustrated in FIG. 25D-1.

This application is based on Japanese Patent Application serial no. 2008-070465 filed with Japan Patent Office on Mar. 18, 2008, the entire contents of which are hereby incorporated by reference.

What is claimed is:

1. A thin film transistor comprising:
    a gate insulating layer covering a gate electrode;
    a first microcrystalline semiconductor layer and a second microcrystalline semiconductor layer provided over the gate insulating layer, both the first microcrystalline semiconductor layer and the second microcrystalline semiconductor layer including an impurity element serving as a donor;
    a third microcrystalline semiconductor layer provided over the first microcrystalline semiconductor layer, the second microcrystalline semiconductor layer and the gate insulating layer, the third microcrystalline semiconductor layer being in contact with the gate insulating layer between the first microcrystalline semiconductor layer and the second microcrystalline semiconductor layer;
    an amorphous semiconductor layer provided over the third microcrystalline semiconductor layer; and
    a first semiconductor layer and a second semiconductor layer provided over and in contact with the amorphous semiconductor layer, both the first semiconductor layer and the second semiconductor layer including an impurity element imparting one conductivity type, both the first semiconductor layer and the second semiconductor layer not being in contact with the third microcrystalline semiconductor layer,
    wherein the gate insulating layer has a first thickness in a first portion between the first microcrystalline semiconductor layer and the second microcrystalline semiconductor layer, and a second thickness in a second portion in contact with the first microcrystalline semiconductor layer or the second microcrystalline semiconductor layer,
    wherein the first portion is in contact with the second portion,
    wherein the first portion does not overlap with the first microcrystalline semiconductor layer and the second microcrystalline semiconductor layer, and
    wherein the first thickness is smaller than the second thickness.

2. The thin film transistor according to claim 1, wherein an interface between the gate insulating layer and the first microcrystalline semiconductor layer or the second microcrystalline semiconductor layer is at the same level or substantially the same level as an interface between the third microcrystalline semiconductor layer and the amorphous semiconductor layer.

3. The thin film transistor according to claim 1, further comprising a fourth microcrystalline semiconductor layer provided over the third microcrystalline semiconductor layer, the fourth microcrystalline semiconductor layer including an impurity element serving as a donor,
    wherein the amorphous semiconductor layer is provided over the fourth microcrystalline semiconductor layer.

4. The thin film transistor according to claim 1, further comprising a first buffer layer provided over the first microcrystalline semiconductor layer, and
    a second buffer layer provided over the second microcrystalline semiconductor layer,
    wherein the third microcrystalline semiconductor layer covers the first buffer layer and the second buffer layer,
    wherein the first buffer layer is an amorphous semiconductor layer, and
    wherein the second buffer layer is an amorphous semiconductor layer.

5. The thin film transistor according to claim 1, further comprising a first buffer layer provided over the first microcrystalline semiconductor layer, and
    a second buffer layer provided over the second microcrystalline semiconductor layer,
    wherein the third microcrystalline semiconductor layer covers the first buffer layer and the second buffer layer,
    wherein the first buffer layer is comprised of an amorphous semiconductor layer and an insulating layer provided over said amorphous semiconductor layer, and
    wherein the second buffer layer is comprised of an amorphous semiconductor layer and an insulating layer provided over said amorphous semiconductor layer.

6. A display device comprising the thin film transistor according to claim 1 in each pixel of a pixel portion.

7. The thin film transistor according to claim 1,
    wherein the first semiconductor layer includes one of a source and a drain region, and
    wherein the second semiconductor layer includes the other of the source and the drain region.

8. The thin film transistor according to claim 1, further comprising:
    one of a source and a drain electrode over the first semiconductor layer, at least a part of the one of the source and the drain electrode overlaps with a part of the first microcrystalline semiconductor layer, a first part of the third microcrystalline semiconductor layer, a first part of the amorphous semiconductor layer, and a part of the first semiconductor layer; and the other of the source and the drain electrode over the second semiconductor layer, at least a part of the other of the source and the drain electrode overlaps with a part of the second microcrystalline semiconductor layer, a second part of the third microcrystalline semiconductor layer, a second part of the amorphous semiconductor layer, and a part of the second semiconductor layer, wherein the one of the source and the drain electrode is in contact with the first semiconductor layer, wherein the other of the source and the drain electrode is in contact with the second semiconductor layer, and wherein the one of the source and the drain electrode and the other of the source and the drain electrode are not in contact with the third microcrystalline semiconductor layer.

9. A thin film transistor comprising:

a gate insulating layer covering a gate electrode;

a first microcrystalline semiconductor layer provided over the gate insulating layer, the first microcrystalline semiconductor layer including an impurity element serving as a donor;

a second microcrystalline semiconductor layer provided over the first microcrystalline semiconductor layer and the gate insulating layer, the second microcrystalline semiconductor layer being in contact with the gate insulating layer outside the first microcrystalline semiconductor layer;

an amorphous semiconductor layer provided over the second microcrystalline semiconductor layer; and a first semiconductor layer and a second semiconductor layer provided over and in contact with the amorphous semiconductor layer, both the first semiconductor layer and the second semiconductor layer including an impurity element imparting one conductivity type, both the first semiconductor layer and the second semiconductor layer not being in contact with the second microcrystalline semiconductor layer, wherein the gate insulating layer has a first thickness in a first portion outside the first microcrystalline semiconductor layer, and a second thickness in a second portion in contact with the first microcrystalline semiconductor layer, wherein the first portion is in contact with the second portion, wherein the first portion does not overlap with the first microcrystalline semiconductor layer and the second microcrystalline semiconductor layer, and wherein the first thickness is smaller than the second thickness.

10. A display device comprising the thin film transistor according to claim 9 in each pixel of a pixel portion.

11. The thin film transistor according to claim 9, wherein the first semiconductor layer includes one of a source and a drain region, and wherein the second semiconductor layer includes the other of the source and the drain region.

12. The thin film transistor according to claim 9, further comprising:

one of a source and a drain electrode over the first semiconductor layer, at least a part of the one of the source and the drain electrode overlaps with a first part of the second microcrystalline semiconductor layer, a first part of the amorphous semiconductor layer, and a part of the first semiconductor layer; and the other of the source and the drain electrode over the second semiconductor layer, at least a part of the other of the source and the drain electrode overlaps with a second part of the second microcrystalline semiconductor layer, a second part of the amorphous semiconductor layer, and a part of the second semiconductor layer, wherein the one of the source and the drain electrode is in contact with the first semiconductor layer, wherein the other of the source and the drain electrode is in contact with the second semiconductor layer, and wherein the one of the source and the drain electrode and the other of the source and the drain electrode are not in contact with the second microcrystalline semiconductor layer.

* * * * *

UNITED STATES PATENT AND TRADEMARK OFFICE
CERTIFICATE OF CORRECTION

PATENT NO. : 8,624,321 B2
APPLICATION NO. : 12/398295
DATED : January 7, 2014
INVENTOR(S) : Shunpei Yamazaki et al.

It is certified that error appears in the above-identified patent and that said Letters Patent is hereby corrected as shown below:

In the Specification

Column 6, line 34, "layer 5 la may" should read --layer 51$a$ may--.

Column 6, line 42, "angle 02" should read --angle 02--.

Column 8, line 23, "wave number" should read --wavenumber--.

Column 9, line 23, "n-type" should read --n$^-$-type--.

Column 9, line 24, "p-type" should read --p$^-$-type--.

Column 13, line 10, "long Thus," should read --long. Thus,--.

Column 14, line 42, "butter" should read --buffer--.

Column 21, line 49, "Tr01 Thus," should read --Tr01. Thus,--.

Column 22, line 3, "current high" should read --current, high--.

Column 22, line 64, "10F," should read --10E,--.

Column 22, line 65, "that in" should read --that, in--.

Column 23, lines 30-31, "geranium" should read --germanium--.

Column 23, line 33, "geranium" should read --germanium--.

Column 24, line 27, "donor When" should read --donor. When--.

Column 25, line 57, "butter" should read --buffer--.

Column 29, line 13, "added Note" should read --added. Note--.

Column 29, line 37, "achieved and" should read --achieved, and--.

Column 33, line 20, "of" should read --05--.

Column 34, line 7, "supply a variety" should read --supply, a variety--.

Column 38, line 3, "embodiment a" should read --embodiment, a--.

Column 38, line 13, "370 W. The" should read --370 W, the--.

Column 38, line 14, "280° C. the" should read --280° C., the--.

Signed and Sealed this
Twenty-seventh Day of May, 2014

Michelle K. Lee
*Deputy Director of the United States Patent and Trademark Office*

Column 39, line 58, "embodiment and" should read --embodiment, and--.

Column 40, line 13, "Note that in" should read --Note that, in--.

Column 40, line 66, "10 µm and" should read --10 µm, and--.

Column 40, line 66, "20 µm" should read --20 µm.--.